US011605790B2

(12) United States Patent
Murer et al.

(10) Patent No.: US 11,605,790 B2
(45) Date of Patent: Mar. 14, 2023

(54) MONOSUBSTITUTED DIAZABENZIMIDAZOLE CARBENE METAL COMPLEXES FOR USE IN ORGANIC LIGHT EMITTING DIODES

(71) Applicant: UDC Ireland Limited, Dublin (IE)

(72) Inventors: Peter Murer, Oberwil (CH); Korinna Dormann, Bad Dürkheim (DE); Flavio Luiz Benedito, Ludwigshafen (DE); Glauco Battagliarin, Mannheim (DE); Stefan Metz, Mannheim (DE); Ute Heinemeyer, Neustadt (DE); Christian Lennartz, Schifferstadt (DE); Gerhard Wagenblast, Wachenheim (DE); Soichi Watanabe, Seoul (KR); Thomas Geßner, Heidelberg (DE)

(73) Assignee: UDC Ireland Limited, Dublin (IE)

( * ) Notice: Subject to any disclaimer, the term of this patent is extended or adjusted under 35 U.S.C. 154(b) by 74 days.

(21) Appl. No.: 16/853,032

(22) Filed: Apr. 20, 2020

(65) Prior Publication Data

US 2020/0251667 A1 Aug. 6, 2020

Related U.S. Application Data

(63) Continuation of application No. 14/901,738, filed as application No. PCT/EP2014/064054 on Jul. 2, 2014, now abandoned.

(30) Foreign Application Priority Data

Jul. 2, 2013 (EP) .................................... 13174779

(51) Int. Cl.
| | | |
|---|---|---|
| *C09K 11/06* | (2006.01) | |
| *C07F 15/00* | (2006.01) | |
| *C09B 57/10* | (2006.01) | |
| *C09B 57/00* | (2006.01) | |
| *H01L 51/50* | (2006.01) | |
| *H01L 51/00* | (2006.01) | |

(52) U.S. Cl.
CPC ...... *H01L 51/0085* (2013.01); *C07F 15/0033* (2013.01); *C07F 15/0086* (2013.01); *C09B 57/00* (2013.01); *C09B 57/10* (2013.01); *C09K 11/06* (2013.01); *H01L 51/0087* (2013.01); *C09K 2211/185* (2013.01); *H01L 51/5016* (2013.01); *Y02E 10/549* (2013.01)

(58) Field of Classification Search
CPC ........................................ H01L 51/0084–0089
See application file for complete search history.

(56) References Cited

U.S. PATENT DOCUMENTS

| 8,367,224 | B2 | 2/2013 | Katakura |
| 8,373,159 | B2 | 2/2013 | Langer |
| 9,024,308 | B2 | 5/2015 | Bold |
| 9,209,410 | B2 | 12/2015 | Iwakuma |
| 9,487,548 | B2 | 11/2016 | Molt |
| 9,673,408 | B2 | 6/2017 | Murer |
| 9,862,739 | B2 | 1/2018 | Metz |
| 10,090,476 | B2 | 10/2018 | Fuchs |
| 10,118,939 | B2 | 11/2018 | Metz |
| 10,290,817 | B2 | 5/2019 | Battagliarin |
| 10,347,851 | B2 | 7/2019 | Lennartz |
| 10,370,396 | B2 | 8/2019 | Metz |
| 2006/0024522 | A1 | 2/2006 | Thompson |
| 2007/0003789 | A1* | 1/2007 | Kwong ................ C09K 11/06 428/690 |
| 2009/0066226 | A1 | 3/2009 | Sugita |
| 2011/0309344 | A1 | 12/2011 | Watanabe |
| 2011/0309346 | A1 | 12/2011 | Watanabe |
| 2012/0012821 | A1 | 1/2012 | Langer |
| 2012/0228583 | A1 | 9/2012 | Wu |
| 2012/0305894 | A1 | 12/2012 | Kim |

(Continued)

FOREIGN PATENT DOCUMENTS

| CN | 102762582 A | 10/2012 |
| JP | 2013513641 A | 4/2013 |

(Continued)

OTHER PUBLICATIONS

Baldo, M., et al., "Very high-efficiency green organic light-emitting devices based on electrophosphorescence", Applied Physics Letters, vol. 75, No. 1, (1999), pp. 4-6.
Extended European Search Report for Application No. EP19198942. 5, dated Jan. 15, 2020, 15 pages.
International Search Report for PCT/EP2014/064054 dated Jul. 25, 2014. 4 pages.
JP Notice of Reasons for Rejection for JP2016522597, dated Oct. 5, 2018, 3 pages.
Korean Office Action (with English language translation) for Application No. KR10-2016-7002495, dated Mar. 10, 2020, 16 pages.
Korean Office Action (with English language translation) issued in KR Application No. 103122869, dated Jan. 2, 2019, 9 pages.

(Continued)

*Primary Examiner* — William E McClain
(74) *Attorney, Agent, or Firm* — Riverside Law LLP

(57) ABSTRACT

An organic electronic device, preferably an organic light-emitting diode (OLED), comprising at least one metal-carbene complex comprising one, two or three specific bidentate diazabenzimidazole carbene ligands; a light-emitting layer comprising said metal-carbene complex as emitter material, preferably in combination with at least one host material; the use of said metal-carbene complex in an OLED; an apparatus selected from the group consisting of stationary visual display units, mobile visual display units, illumination units, units in items of clothing, units in handbags, units in accessories, units in furniture and units in wallpaper comprising said organic electronic device, preferably said OLED, or said light-emitting layer; the metal-carbene complex comprising one, two or three specific bidentate diazabenzimidazole carbene ligands mentioned above and a process for the preparation of said metal-carbene complex.

16 Claims, No Drawings

(56) References Cited

U.S. PATENT DOCUMENTS

| | | | |
|---|---|---|---|
| 2012/0319050 A1* | 12/2012 | Metz | .................. C09K 11/06 252/301.16 |
| 2013/0032766 A1 | 2/2013 | Molt | |
| 2013/0082209 A1* | 4/2013 | Stoessel | ................ H05B 33/14 252/301.16 |
| 2017/0025626 A1 | 1/2017 | Fuchs | |
| 2018/0182980 A1 | 6/2018 | Lennartz | |

FOREIGN PATENT DOCUMENTS

| | | |
|---|---|---|
| KR | 20120096568 | 8/2012 |
| WO | 02060910 A1 | 8/2002 |
| WO | 2005019373 A2 | 3/2005 |
| WO | 2005113704 A2 | 12/2005 |
| WO | 2009003898 A1 | 1/2009 |
| WO | 2009008100 A1 | 1/2009 |
| WO | 2009046266 A1 | 4/2009 |
| WO | 2010079051 A1 | 7/2010 |
| WO | 2011004639 A1 | 1/2011 |
| WO | 2011073149 A1 | 6/2011 |
| WO | 2011157779 A1 | 12/2011 |
| WO | 2011157790 | 12/2011 |
| WO | 2012121936 A2 | 9/2012 |
| WO | 2012172182 A1 | 12/2012 |
| WO | 2012172482 A1 | 12/2012 |
| WO | 2015014835 | 2/2015 |
| WO | 2015014944 A1 | 2/2015 |

OTHER PUBLICATIONS

Leffler et al., "Rates and Equilibria of Organic Reactions," (1963): 147-155. (Year: 1963).

Office Action dated Jan. 21, 2020 for U.S. Appl. No. 14/901,738 (pp. 1-23).

Office Action dated Mar. 18, 2019 for U.S. Appl. No. 14/901,738 (pp. 1-11).

Office Action dated Mar. 21, 2018 for U.S. Appl. No. 14/901,738 (pp. 1-14).

Office Action dated Nov. 16, 2018 for U.S. Appl. No. 14/901,738 (pp. 1-12).

Office Action dated Oct. 3, 2019 for U.S. Appl. No. 14/901,738 (pp. 1-27).

* cited by examiner

MONOSUBSTITUTED DIAZABENZIMIDAZOLE CARBENE METAL COMPLEXES FOR USE IN ORGANIC LIGHT EMITTING DIODES

CROSS-REFERENCE TO RELATED APPLICATIONS

The present application is a continuation of U.S. patent application Ser. No. 14/901,738, filed Dec. 29, 2015, which is the U.S. National Stage Application filed under 35 U.S.C. § 371 of International Patent Application No. PCT/EP2014/064054, filed Jul. 2, 2014, which claims priority to European Patent Application No. 13174779.2, filed Jul. 2, 2013, all of which applications are hereby incorporated by reference in their entireties.

The present invention relates to an organic electronic device, preferably an organic light-emitting diode (OLED), comprising at least one metal-carbene complex comprising one, two or three specific bidentate diazabenzimidazole carbene ligands, to a light-emitting layer comprising said metal-carbene complex as emitter material, preferably in combination with at least one host material, to the use of said metal-carbene complex in an OLED and to an apparatus selected from the group consisting of stationary visual display units, mobile visual display units, illumination units, units in items of clothing, units in handbags, units in accessories, units in furniture and units in wallpaper comprising said organic electronic device, preferably said OLED, or said light-emitting layer. The present invention further relates to the metal-carbene complex comprising one, two or three specific bidentate diazabenzimidazole carbene ligands mentioned above and to a process for the preparation of said metal-carbene complex.

Organic electronics, i.e. organic electronic devices, are an important sector in the field of electronics. Organic electronics is a subfield of electronics which uses electronic circuits which comprise polymers or smaller organic compounds. Fields of use of organic electronics are the use of polymers or smaller organic compounds in organic electronic devices, for example in organic light-emitting diodes (OLED), light-emitting electrochemical cells (LEEC), organic photovoltaic cells (OPV) and organic field-effect transistors (OFET).

The use of suitable novel organic materials thus allows various new types of components based on organic electronics to be provided, such as displays, illumination, sensors, transistors, data stores or photovoltaic cells. This makes possible the development of new devices which are thin, light, flexible and producible at low cost.

The synthesis and provision of new materials for organic electronic devices is therefore an important research topic. Especially the synthesis and provision of dyes for use in organic electronic devices (useful for example as emitter materials in OLEDs and LEECs or as absorption dyes in OPVs is important for providing organic electronic devices having good stabilities and long lifetimes as well as—in the case of OLEDs and LEECs—high quantum efficiencies.

A preferred field of use according to the present application is the use of relatively small organic compounds in organic light-emitting diodes (OLED). OLEDs exploit the propensity of materials to emit light when they are excited by electrical current. OLEDs are of particular interest as an alternative to cathode ray tubes and liquid-crystal displays for production of flat visual display units. Owing to the very compact design and the intrinsically low power consumption, devices comprising OLEDs are suitable especially for mobile applications, for example for applications in cellphones, smartphones, digital cameras, mp3 players, tablet computers, laptops, etc. In addition, white OLEDs give great advantage over the illumination technologies known to date, especially a particularly high efficiency.

The basic principles of the way in which OLEDs work and suitable structures (layers) of OLEDs are specified, for example, in WO 2005/113704 and the literature cited therein.

The light-emitting materials (emitters) used may, as well as fluorescent materials (fluorescent emitters), be phosphorescent materials (phosphorescent emitters). The phosphorescent emitters are typically organometallic complexes which, in contrast to the fluorescence emitters which exhibit singlet emission, exhibit triplet emission (M. A. Baldow et al., Appl. Phys. Lett. 1999, 75, 4 to 6). For quantum-mechanical reasons, when the phosphorescent emitters are used, up to four times the quantum efficiency, energy efficiency and power efficiency is possible.

Of particular interest are organic light-emitting diodes with a good color purity, low operational voltage, high efficiency, high efficacy, high resistance to thermal stress and long operational lifetime.

In order to implement the aforementioned properties in practice, it is necessary to provide suitable emitter materials. The selection of suitable emitter materials has a significant influence on parameters including the color purity, efficiency, lifetime and operating voltages of the OLEDs.

The prior art proposes numerous different emitter materials for use in OLEDs.

The use of metal-carbene complexes comprising diazabenzimidazole carbene ligands has only been described in a few prior art references.

WO 2012/121936 A2 compounds comprising a diazabenzimidazole carbene ligand and a device comprising an organic light-emitting device which comprise such compounds. However, no specific monoalkyl substitution of the diazabenzimidazole carbene ligands and the superiority of compounds comprising such a specific monoalkyl substitution are mentioned in WO 2012/121936 A2.

WO 2009/046266 A1 discloses an emissive phosphorescent material for use in OLEDs which comprise at least one tridentate ligand bound to a metal center, wherein at least one of the bonds to the tridentate ligand is a carbon-metal bond. The tridentate ligand may be based on a diazabenimidazole carbene. However, WO 2009/046266 A1 exclusively concerns metal complexes comprising at least one tridentate ligand. Further, there is no information in WO 2009/046266 A1 concerning the superiority of metal complexes comprising tridentate ligands based on a diazabenimidazole carbene. Further, no specific substitution of the tridentate ligand which may be based on a diazabenimidazole carbene is mentioned in WO 2009/046266 A1.

WO 2011/073149 A1 discloses metal-carbene complexes comprising a central atom selected from iridium and platinum and diazabenzimidazole carbene ligands and OLEDs (Organic Light-Emitting Diodes) which comprise such complexes. However, no specific monoalkyl substitution of the diazabenzimidazole carbene ligands and the superiority of complexes comprising such a specific monoalkyl substitution are mentioned in WO 2011/073149 A1.

US 2012/0305894 A1 relates to a blue phosphorescent compound with a high color purity and a high efficiency and an organic electroluminescent device using the same. The blue phosphorescent compound according to US 2012/0305894 A1 is characterized by the following formula:

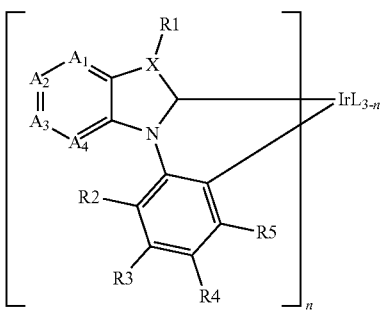

[Formula 1]

wherein

X is selected from nitrogen (N), oxygen (O), phosphorous (P) and sulfur (S) atoms; and at least one of A1, A2, A3 and A4 is nitrogen (N), and the remaining are selected from hydrogen (H)-substituted carbon, and an alkyl- or alkoxy-substituted carbon. However, no specific monoalkyl substitution of diazabenzimidazole carbene ligands and the superiority of complexes comprising such a specific monoalkyl substitution are mentioned in US 2012/0305894 A1.

It is an object of the present invention to provide organic electronic devices, preferably OLEDs, having—compared with the organic electronic devices known in the art—a high color purity in the blue region of the visible electromagnetic spectrum, a high efficiency and a short emission lifetime.

This object is achieved by an organic electronic device, preferably an OLED, comprising at least one metal-carbene complex, wherein the metal is Ir or Pt, comprising one, two or three bidentate ligands of formula (I) and/or (I')

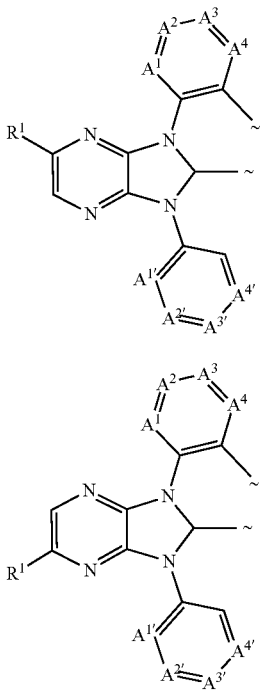

wherein
$R^1$ is a linear or branched alkyl radical having 1 to 20 carbon atoms, which is linked to the diazabenzimidazole carbene unit via a $sp^3$ hybridized carbon atom, optionally interrupted by at least one heteroatom, selected from O, S and N, optionally substituted with at least one of the following groups: a group with donor or acceptor action; deuterium; a substituted or unsubstituted cycloalkyl radical having a total of from 3 to 30 carbon atoms; a substituted or unsubstituted heterocyclo alkyl radical, interrupted by at least one heteroatom, selected from O, S and N, and having a total of from 3 to 30 carbon atoms and/or heteroatoms; a substituted or unsubstituted aryl radical, having a total of from 6 to 30 carbon atoms; or a substituted or an unsubstituted heteroaryl radical, having a total of from 5 to 30 carbon atoms and/or heteroatoms, selected from O, S and N;

a cycloalkyl radical having a total of from 4 to 30 carbon atoms, optionally substituted by a linear or branched, substituted or unsubstituted alkyl radical, optionally interrupted by at least one heteroatom, selected from O, S and N, and/or at least one of the groups mentioned above concerning the linear or branched alkyl radical; or a heterocyclo alkyl radical, which is linked to the diazabenzimidazole carbene unit via a $sp^3$ hybridized carbon atom, interrupted by at least one heteroatom, selected from O, S and N, and having a total of from 3 to 30 carbon atoms and/or heteroatoms, optionally substituted by a linear or branched, substituted or unsubstituted alkyl radical, optionally interrupted by at least one heteroatom, selected from O, S and N, and/or at least one of the groups mentioned above concerning the linear or branched alkyl radical;

$A^1$ is $CR^2$ or N; preferably $CR^2$;
$A^2$ is $CR^3$ or N; preferably $CR^3$;
$A^3$ is $CR^4$ or N; preferably $CR^4$;
$A^4$ is $CR^5$ or N; preferably $CR^5$;
$A^{1'}$ is $CR^{2'}$ or N; preferably $CR^{2'}$;
$A^{2'}$ is $CR^{3'}$ or N; preferably $CR^{3'}$;
$A^{3'}$ is $CR^{4'}$ or N; preferably $CR^{4'}$;
$A^{4'}$ is $CR^{5'}$ or N; preferably $CR^{5'}$;
$R^2$, $R^3$, $R^4$, $R^5$, $R^{2'}$, $R^{3'}$, $R^{4'}$ and $R^{5'}$
are each independently hydrogen; deuterium; a linear or branched, substituted or unsubstituted alkyl radical having 1 to 20 carbon atoms, optionally interrupted by at least one heteroatom, selected from O, S and N; a substituted or unsubstituted cycloalkyl radical having a total of from 3 to 30 carbon atom; a substituted or unsubstituted heterocyclo alkyl radical, interrupted by at least one heteroatom selected from O, S and N and having a total of from 3 to 30 carbon atoms and/or heteroatoms; a substituted or unsubstituted aryl radical, having a total of from 6 to 30 carbon atoms; a substituted or unsubstituted heteroaryl radical, having a total of from 5 to 30 carbon atoms and/or heteroatoms, selected from O, S and N; or a group with donor or acceptor action;

preferably, $R^2$, $R^3$, $R^4$, $R^5$, $R^{2'}$, $R^{3'}$, $R^{4'}$ and $R^{5'}$ are each independently hydrogen, deuterium, a linear or branched, substituted or unsubstituted alkyl radical, having 1 to 20 carbon atoms; an unsubstituted aryl radical, having from 6 to 18 carbon atoms, a monosubstituted aryl radical having from 6 to 18 carbon atoms, a disubstituted aryl radical having from 6 to 18 carbon atoms; an unsubstituted heteroaryl radical, having a total of from 5 to 18 carbon atoms and/or heteroatoms, a monosubstituted heteroaryl radical, having a total of from 5 to 18 carbon atoms and/or heteroatoms, a disubstituted heteroaryl radical, having a total of from 5 to 18 carbon atoms and/or heteroatoms; more preferably, the aryl radical or heteroaryl radical are selected from the group consisting of phenyl, tolyl, xylyl, diisopropylphenyl, pyridyl, methylpyridyl, pyrimidyl, pyrazinyl, carbazolyl, dibenzofuranyl, dibenzothiophenyl, fluorenyl, dimethylfluorenyl, indolyl, methylindolyl, benzofuranyl and benzothiophenyl; a group with donor or acceptor action, selected from halogen radicals, preferably F or Cl, more preferably F; CF$_3$, CN; or SiR$^9$R$^{10}$R$^{11}$, preferably SiMe$_3$, SiPh$_3$, SiEt$_3$ or SiPh$_2$tBu;

R$^9$, R$^{10}$, R$^{11}$ are each independently a linear or branched alkyl radical, having from 1 to 6 carbon atoms, preferably methyl, ethyl, n-propyl, iso-propyl, n-butyl, tert-butyl, sec-butyl or iso-butyl; a substituted or unsubstituted aryl radical, having from 6 to 18 carbon atoms, preferably phenyl or tolyl; a substituted or unsubstituted heteroaryl radical, having a total of from 5 to 18 carbon atoms and/or heteroatoms; a substituted or unsubstituted cycloalkyl radical having a total of from 3 to 18 carbon atoms, preferably cyclopentyl or cyclohexyl;

or

R$^2$ and R$^3$, R$^3$ and R$^4$ or R$^4$ and R$^5$ or R$^{2'}$ and R$^{3'}$, R$^{3'}$ and R$^{4'}$ or R$^{4'}$ and R$^{5'}$ may form, independently of each other, together with the carbon atoms to which they are bonded, a saturated or unsaturated or aromatic, optionally substituted ring, which is optionally interrupted by at least one heteroatom, selected from O, S and N, has a total of from 5 to 18 carbon atoms and/or heteroatoms, and may optionally be fused to at least one further optionally substituted saturated or unsaturated or aromatic ring, optionally interrupted by at least one heteroatom, selected from O, S and N, and having a total of from 5 to 18 carbon atoms and/or heteroatoms;

~ is the bonding site to the metal.

It has been found by the inventors of the present invention that organic electronic devices, preferably OLEDs, having—compared with the organic electronic devices known in the art—a high color purity in the blue region of the visible electromagnetic spectrum, a high efficiency, a high luminous efficacy, low voltage and a short emission lifetime are obtained by employing the metal-carbene complex comprising one, two or three, preferably three, bidentate ligands of formula (I) and/or (I') as mentioned above in the organic electronic device, preferably the OLED, preferably as emitter material.

The specific metal-carbene complexes comprising one, two or three, preferably three, bidentate ligands of formula (I) and/or (I') as mentioned above are characterized by the feature that said complexes are monoalkyl substituted. It has been found by the inventors that said monoalkyl substitution of the diazabenzimidazole carbene ligand provides metal-carbene emitter materials emitting blue light having a high color purity. Additionally, the emission lifetime of said complexes is short and the quantum yields are high to very high. Devices comprising the complexes according to the present invention show high efficiency and luminous efficacy as well as low voltage.

Because of the short emission lifetime, for example the effects of triplet-triplet annihilation and self-quenching can be suppressed and the device lifetime is improved.

It has further been found by the inventors of the present invention that OLEDs comprising the metal-carbene complex comprising one, two or three, preferably three, bidentate ligands of formula (I) and/or (I') as mentioned above in an organic electronic device, preferably in an OLED, especially as an emitter material in an OLED, show high quantum efficiencies, high luminous efficacy, low voltage and/or good stabilities and long lifetimes.

The complexes are particularly suitable as emitter materials for OLEDs showing electroluminescence in the blue region (CIEy<0.40), more particularly in the deeper blue region (CIEy<0.30, preferably CIEy<0.25), of the electromagnetic spectrum, which enables, for example, the production of full-color displays and white OLEDs.

In the context of the present invention, the terms aryl radical, unit or group, heteroaryl radical, unit or group, alkyl radical, unit or group, cycloalkyl radical, unit or group, cycloheteroalkyl radical, unit or group, and groups with donor or acceptor action are each defined as follows—unless stated otherwise:

In the aryl radicals, heteroaryl radicals, alkyl radicals, cycloalkyl radicals, cycloheteroalkyl radicals and groups with donor or acceptor action mentioned below, one or more hydrogen atoms (if present) may be substituted by deuterium atoms.

Aryl radicals or substituted or unsubstituted aryl radicals having 6 to 30, preferably 6 to 18 carbon atoms (C$_6$-C$_{30}$-aryl radicals) refer in the present invention to radicals which are derived from monocyclic, bicyclic or tricyclic aromatics which do not comprise any ring heteroatoms. When the systems are not monocyclic systems, the term "aryl" for the second ring also includes the saturated form (perhydro form) or the partly unsaturated form (for example the dihydro form or tetrahydro form), provided that the particular forms are known and stable. This means that the term "aryl" in the present invention encompasses, for example, also bicyclic or tricyclic radicals in which either both or all three radicals are aromatic, and bicyclic or tricyclic radicals in which only one ring is aromatic, and also tricyclic radicals in which two rings are aromatic. Examples of aryl are: phenyl, naphthyl, indanyl, 1,2-dihydronaphthenyl, 1,4-dihydronaphthenyl, indenyl, anthracenyl, phenanthrenyl or 1,2,3,4-tetrahydronaphthyl. Particular preference is given to C$_6$-C$_{10}$-aryl radicals, for example phenyl or naphthyl, very particular preference to C$_6$-aryl radicals, for example phenyl.

The aryl radicals or C$_6$-C$_{30}$-aryl radicals may be unsubstituted or substituted by one or more further radicals. Suitable further radicals are selected from the group consisting of C$_1$-C$_{20}$-alkyl, C$_6$-C$_{30}$-aryl and substituents with donor or acceptor action, suitable substituents with donor or acceptor action are specified below. The C$_6$-C$_{30}$-aryl radicals are preferably unsubstituted or substituted by one or more C$_1$-C$_{20}$-alkyl groups, C$_1$-C$_{20}$-alkoxy groups, CN, CF$_3$, F, SiMe$_3$, SiPh$_3$ or amino groups (NR$^{32}$R$^{33}$ where suitable R$^{32}$ and R$^{33}$ radicals are specified below), more preferably unsubstituted (e.g. C$_6$H$_5$), o-monosubstituted (e.g. tolyl) or o,o'-disubstituted by one respectively two C$_1$-C$_{20}$-alkyl groups (e.g. xylyl), C$_1$-C$_{20}$-alkoxy groups, CN, CF$_3$, F, SiMe$_3$, SiPh$_3$ or amino groups (NR$^{32}$R$^{33}$ where suitable R$^{32}$ and R$^{33}$ radicals are specified below).

Heteroaryl radicals or substituted or unsubstituted heteroaryl radicals having a total of 5 to 30, preferably 5 to 18 carbon atoms and/or heteroatoms are understood to mean monocyclic, bicyclic or tricyclic heteroaromatics, some of which can be derived from the aforementioned aryl, in which at least one carbon atom in the aryl base structure has been replaced by a heteroatom. Preferred heteroatoms are N, O and S. The heteroaryl radicals more preferably have 5 to 13 ring atoms. The base structure of the heteroaryl radicals is especially preferably selected from systems such as pyridine, pyrimidine and pyrazine and five-membered heteroaromatics such as thiophene, pyrrole, imidazole, thiazole, oxazole or furan. These base structures may optionally be fused to one or two six-membered aromatic radicals. Suitable fused heteroaromatics are carbazolyl, benzimidazolyl, benzofuryl, benzothiazolyl, benzoxazolyl, dibenzofuryl, dibenzothiophenyl or benzimidazo[1,2-a]benzimidazolyl.

The base structure may be substituted at one, more than one or all substitutable positions, suitable substituents being the same as those already specified under the definition of $C_6$-$C_{30}$-aryl. However, the heteroaryl radicals are preferably unsubstituted, o-monosubstituted or o,o'-disubstituted by one respectively two $C_1$-$C_{20}$-alkyl groups, $C_1$-$C_{20}$-alkoxy groups, CN, $CF_3$, F, $SiMe_3$, $SiPh_3$ or amino groups ($NR^{32}R^{33}$ where suitable $R^{32}$ and $R^{33}$ radicals are specified below). Suitable heteroaryl radicals are, for example, pyridin-2-yl, pyridin-3-yl, pyridin-4-yl, pyrimidin-3-yl, pyrazin-2-yl, pyrazin-3-yl, thiophen-2-yl, thiophen-3-yl, pyrrol-2-yl, pyrrol-3-yl, furan-2-yl, furan-3-yl, thiazol-2-yl, oxazol-2-yl and imidazol-2-yl, and the corresponding benzofused radicals, especially carbazolyl, benzimidazolyl, benzofuryl, benzothiazole, benzoxazole, dibenzofuryl or dibenzothiophenyl.

An alkyl radical in the context of the present application is a linear or branched alkyl radical, optionally interrupted by at least one heteroatom, and having 1 to 20 carbon atoms. Preference is given to $C_1$- to $C_{10}$-alkyl radicals, particular preference to $C_1$- to $C_6$-alkyl radicals. In the case of $R^1$, the alkyl radical is linked to the diazabenzimidazole carbene unit via a $sp^3$ hybridized carbon atom, in the case of all other alkyl radicals, it is preferred that the alkyl radical is linked via a $sp^3$ hybridized carbon atom to the base unit. In addition, the alkyl radicals may be unsubstituted or substituted by one or more substituents. Preferred substituents are selected from the group consisting of groups with donor or acceptor action, preferably $C_1$-$C_{20}$-alkoxy, halogen, more preferably F, $C_1$-$C_{20}$-haloalkyl, e.g. $CF_3$; deuterium; a substituted or unsubstituted cycloalkyl radical having a total of from 3 to 30 carbon atoms; a substituted or unsubstituted heterocyclo alkyl radical, interrupted by at least one heteroatom, selected from O, S and N, and having a total of from 3 to 30 carbon atoms and/or heteroatoms; a substituted or unsubstituted aryl radical, having a total of from 6 to 30 carbon atoms; or a substituted or an unsubstituted heteroaryl radical, having a total of from 5 to 30 carbon atoms and/or heteroatoms, selected from O, S and N. Suitable aryl substituents are specified above and suitable alkoxy and halogen substituents are specified below. Examples of suitable alkyl groups are methyl, ethyl, propyl, butyl, pentyl, hexyl, heptyl and octyl, and also $C_1$-$C_{20}$-haloalkyl-, $C_6$-$C_{30}$-aryl-, $C_1$-$C_{20}$-alkoxy- and/or halogensubstituted, especially F-substituted, derivatives of the alkyl groups mentioned, for example $CF_3$ or $CF_2CF_3$. This comprises both the n-isomers of the radicals mentioned and branched isomers such as isopropyl, isobutyl, isopentyl, sec-butyl, tert-butyl, iso-butyl, neopentyl, 3,3-dimethylbutyl, 3-ethylhexyl, etc. Preferred alkyl groups are methyl, ethyl, isopropyl, sec-butyl, tert-butyl, $CF_3$ and $CF_2CF_3$.

A cycloalkyl radical or a substituted or unsubstituted cycloalkyl radical having 3 to 30 carbon atoms is understood in the context of the present application to mean a substituted or unsubstituted $C_3$-$C_{30}$-cycloalkyl radical. Preferred are cycloalkyl radicals having 5 to 18, more preferably 5 to 10 and most preferably 5 to 8 carbon atoms in the base structure (ring) to understand. Suitable substituents are the substituents mentioned for the alkyl groups. Examples of suitable cycloalkyl groups, which may be unsubstituted or substituted by the radicals mentioned above for the alkyl groups, are cyclopentyl, cyclohexyl, cycloheptyl, cyclooctyl, cyclononyl and cyclodecyl. They may also be polycyclic ring systems such as decalinyl, norbornyl, bornanyl or adamantyl.

A heterocycloalkyl radical or a substituted or unsubstituted heterocycloalkyl radical having 3 to 30 carbon atoms and/or heteroatoms is understood to mean heterocyclo-alkyl radicals having 3 to 18, preferably 5 to 10 and more preferably 5 to 8 ring atoms, where at least one carbon atom in the heterocycloalkyl base structure has been replaced by a heteroatom. Preferred heteroatoms are N, O and S. Suitable substituents are the substituents mentioned for the alkyl groups. Examples of suitable heterocycloalkyl groups, which may be unsubstituted or substituted by the radicals mentioned above for the alkyl groups, are radicals derived from the following heterocycles: pyrrolidine, thiolane, tetrahydrofuran, 1,2-oxathiolane, oxazolidine, piperidine, thiane, oxane, dioxane, 1,3-dithiane, morpholine, piperazine. They may also be polycyclic ring systems.

Suitable alkoxy radicals and alkylthio radicals derive correspondingly from the aforementioned alkyl radicals. Examples here include $OCH_3$, $OC_2H_5$, $OC_3H_7$, $OC_4H_9$ and $OC_8H_{17}$, and also $SCH_3$, $SC_2H_5$, $SC_3H_7$, $SC_4H_9$ and $SC_8H_{17}$. In this context, $C_3H_7$, $C_4H_9$ and $C_8H_{17}$ comprise both the n-isomers and branched isomers such as isopropyl, isobutyl, sec-butyl, tert-butyl and 2-ethylhexyl. Particularly preferred alkoxy or alkylthio groups are methoxy, ethoxy, n-octyloxy, 2-ethylhexyloxy and $SCH_3$.

Suitable halogen radicals or halogen substituents in the context of the present application are fluorine, chlorine, bromine and iodine, preferably fluorine, chlorine and bromine, more preferably fluorine and chlorine, most preferably fluorine.

In the context of the present application, groups with donor or acceptor action are understood to mean the following groups:

$C_1$-$C_{20}$-alkoxy, $C_6$-$C_{30}$-aryloxy, $C_1$-$C_{20}$-alkylthio, $C_6$-$C_{30}$-arylthio, $SiR^{32}R^{33}R^{34}$, halogen radicals, halogenated $C_1$-$C_{20}$-alkyl radicals, carbonyl (—$CO(R^{32})$), carbonylthio (—C=O ($SR^{32}$)), carbonyloxy (—C=O($OR^{32}$)), oxycarbonyl (—OC=O($R^{32}$)), thiocarbonyl (—SC=O ($R^{32}$)), amino (—$NR^{32}R^{33}$), OH, pseudohalogen radicals, amido (—C=O ($NR^{32}R^{33}$)), —$NR^{32}$C=O ($R^{33}$), phosphonate (—P(O)($OR^{32}$)$_2$), phosphate (—OP(O)($OR^{32}$)$_2$), phosphine (—$PR^{32}R^{33}$), phosphine oxide (P(O)$R^{32}_2$), sulfate (—OS(O)$_2OR^{32}$), sulfoxide (—S(O)$R^{32}$), sulfonate (—S(O)$_2$ $OR^{32}$), sulfonyl (—S(O)$_2R^{32}$), sulfonamide (—S(O)$_2$ $NR^{32}R^{33}$), $NO_2$, boronic esters (—OB($OR^{32}$)$_2$), imino (—C=$NR^{32}R^{33}$), borane radicals, stannate radicals, hydrazine radicals, hydrazone radicals, oxime radicals, nitroso groups, diazo groups, vinyl groups, sulfoximines, alanes, germanes, boroxines and borazines.

Preferred substituents with donor or acceptor action are selected from the group consisting of: $C_1$- to $C_{20}$-alkoxy, preferably $C_1$-$C_6$-alkoxy, more preferably ethoxy or methoxy; $C_6$-$C_{30}$-aryloxy, preferably $C_6$-$C_{10}$-aryloxy, more preferably phenyloxy; $SiR^{32}R^{33}R^{34}$, where $R^{32}$, $R^{33}$ and $R^{34}$ are preferably each independently substituted or unsubstituted alkyl or substituted or unsubstituted phenyl, suitable substituents having been specified above; halogen radicals, preferably F, Cl, Br, more preferably F or Cl, most preferably F, halogenated $C_1$-$C_{20}$-alkyl radicals, preferably halogenated $C_1$-$C_6$-alkyl radicals, most preferably fluorinated $C_1$-$C_6$-alkyl radicals, e.g. $CF_3$, $CH_2F$, $CHF_2$ or $C_2F_5$; amino, preferably dimethylamino, diethylamino or diphenylamino; OH, pseudohalogen radicals, preferably CN, SCN or OCN, more preferably CN, —C(O)O$C_1$-$C_4$-alkyl, preferably —C(O)OMe, P(O)$R_2$, preferably P(O)$Ph_2$, and $SO_2R_2$, preferably $SO_2Ph$.

Very particularly preferred substituents with donor or acceptor action are selected from the group consisting of methoxy, phenyloxy, halogenated $C_1$-$C_4$-alkyl, preferably $CF_3$, $CH_2F$, $CHF_2$, $C_2F_5$, halogen, preferably F, CN, $SiR^{32}R^{33}R^{34}$, where suitable $R^{32}$, $R^{33}$ and $R^{34}$ radicals are specified below, diphenylamino, or —C(O)O$C_1$-$C_4$-alkyl.

The aforementioned groups with donor or acceptor action are not intended to rule out the possibility that further radicals and groups among those specified above may also have donor or acceptor action. For example, the aforementioned heteroaryl radicals are likewise groups with donor or acceptor action, and the $C_1$-$C_{20}$-alkyl radicals are groups with donor action. The $R^{32}$, $R^{33}$ and $R^{34}$ radicals mentioned in the aforementioned groups with donor or acceptor action are each independently:

Hydrogen, substituted or unsubstituted $C_1$-$C_{20}$-alkyl or substituted or unsubstituted $C_6$-$C_{30}$-aryl or substituted or unsubstituted heteroaryl having 5 to 30 ring atoms, suitable and preferred alkyl and aryl radicals having been specified above. More preferably, the $R^{32}$, $R^{33}$ and $R^{34}$ radicals are $C_1$-$C_6$-alkyl, e.g. methyl, ethyl, i-propyl or tert-butyl, or phenyl or pyridyl, most preferably methyl or phenyl.

Structures of the Organic Electronic Devices

Suitable structures of the organic electronic devices are known to those skilled in the art. Preferred organic electronic devices are selected from organic light-emitting diodes (OLED), light-emitting electrochemical cells (LEEC), organic photovoltaic cells (OPV) and organic field-effect transistors (OFET). More preferred organic electronic devices are OLEDs.

The organic light-emitting diode (OLED) is usually a light-emitting diode (LED) in which the emissive electroluminescent layer is a film of organic compound which emits light in response to an electric current. This layer of organic semiconductor is usually situated between two electrodes. Generally, at least one of these electrodes is transparent. The metal-carbene complex comprising one, two or three, preferably three, bidentate ligands of formula (I) and/or (I') may be present in any desired layer, preferably in the emissive electroluminescent layer (light-emitting layer), of the OLED as emitter material.

The light-emitting electrochemical cell (LEEC) is usually a solid-state device that generates light from an electric current (electroluminescence). LEEC's are usually composed of two metal electrodes connected by (e.g. sandwiching) an organic semiconductor containing mobile ions. Aside from the mobile ions, their structure is very similar to that of an organic light-emitting diode (OLED). The metal-carbene complex comprising one, two or three, preferably three, bidentate ligands of formula (I) and/or (I') may be present in any desired layer as emitter material.

The organic field-effect transistor (OFET) generally includes a semiconductor layer formed from an organic layer with hole transport capacity and/or electron transport capacity; a gate electrode formed from a conductive layer; and an insulation layer introduced between the semiconductor layer and the conductive layer. A source electrode and a drain electrode are mounted on this arrangement in order thus to produce the transistor element. In addition, further layers known to those skilled in the art may be present in the organic transistor. The metal-carbene complex comprising one, two or three, preferably three, bidentate ligands of formula (I) and/or (I') may be present in any desired layer.

The organic photovoltaic cell (OPV) (photoelectric conversion element) generally comprises an organic layer present between two plate-type electrodes arranged in parallel. The organic layer may be configured on a comb-type electrode. There is no particular restriction regarding the site of the organic layer and there is no particular restriction regarding the material of the electrodes. When, however, plate-type electrodes arranged in parallel are used, at least one electrode is preferably formed from a transparent electrode, for example an ITO electrode or a fluorine-doped tin oxide electrode. The organic layer is usually formed from two sublayers, i.e. a layer with p-type semiconductor character or hole transport capacity, and a layer formed with n-type semiconductor character or electron transport capacity. In addition, it is possible for further layers known to those skilled in the art to be present in the organic solar cell. The metal-carbene complex comprising one, two or three, preferably three, bidentate ligands of formula (I) and/or (I') may be present in any desired layer, of the OPV, preferably as absorption dye.

The organic electronic device is most preferably an OLED or OPV, wherein the metal-carbene complex comprising one, two or three bidentate ligands of formula (I) and/or (I') is employed as emitter material in OLEDs or LEECs, preferably OLEDs, or absorption dye in OPVs. The organic electronic device is most preferably an OLED, wherein the metal-carbene complex comprising one, two or three bidentate ligands of formula (I) and/or (I') is employed as emitter material.

The present invention therefore preferably relates to an organic electronic device which is an OLED, wherein the OLED comprises
(a) an anode,
(b) a cathode,
(c) a light-emitting layer between the anode and the cathode,
wherein the metal-carbene complex comprising one, two or three bidentate ligands of formula (I) and/or (I') is present in the light-emitting layer of the OLED.

The structure of the inventive OLED will be described in detail below.

Metal-Carbene Complex Comprising One, Two or Three Bidentate Ligands of Formula (I) and/or (I')

The metal in the metal-carbene complex comprising one, two or three bidentate ligands of formula (I) and/or (I') is Ir or Pt, preferably Ir(III) or Pt(II), more preferably, the metal in the metal-carbene complex comprising one, two or three bidentate ligands of formula (I) and/or (I') is Ir(III).

The radicals, groups and symbols in the bidentate ligands of formula (I) and/or (I') of the metal-carbene complex preferably have—independently of each other—the following meanings:

$R^1$ has preferably the following meaning:

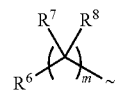

wherein
$R^6$
is hydrogen; deuterium; a linear or branched alkyl radical having a total of from 1 to 10 carbon atoms, preferably methyl, ethyl, n-propyl, iso-propyl, n-butyl, sec-butyl, tert-butyl or iso-butyl; a linear or branched alkyl radical having a total of from 1 to 10 carbon atoms bearing at least one fluoro radical, preferably a linear or branched perfluoroalkyl radical, more preferably $CF_3$ and $CF_2CF_3$; a substituted or unsubstituted cycloalkyl radical, having a total of from 3 to 30 carbon atoms, preferably cyclopentyl or cyclohexyl; a substituted or unsubstituted heterocyclo alkyl radical, interrupted by at least one heteroatom, selected from O, S and N, having a total of from 3 to 30 carbon atoms and/or heteroatoms; a substituted or unsubstituted aryl radical, having from 6 to 30 carbon atoms; a substituted or unsubstituted heteroaryl radical, having a total of from 5 to 30 carbon atoms and/or heteroatoms, selected from O, S and N, preferably, the aryl radical or heteroaryl radical are selected from the group consisting of an unsubstituted aryl radical, having from 6 to 18 carbon atoms, a monosubstituted aryl radical having from 6 to 18 carbon atoms, a disubstituted aryl radical having from 6 to 18 carbon atoms, an unsubstituted heteroaryl radical, having a total of from 5 to 18 carbon atoms and/or heteroatoms, a monosubstituted heteroaryl radical, having a total of from 5 to 18 carbon atoms and/or heteroatoms, a disubstituted heteroaryl radical, having a total of from 5 to 18 carbon atoms and/or heteroatoms, more preferably, the aryl radical or heteroaryl radical are selected from the group consisting of phenyl, tolyl, xylyl, diisopropylphenyl, pyridyl, methylpyridyl, pyrimidyl, pyazinyl, carbazolyl, dibenzofuranyl, dibenzothiophenyl, fluorenyl, dimethylfluorenyl, indolyl, methylindolyl, benzofuranyl and benzothiophenyl; or $SiR^9R^{10}R^{11}$, preferably $SiMe_3$, $SiPh_3$, $SiEt_3$ or $SiPh_2tBu$;

$R^9$, $R^{10}$, $R^{11}$ are each independently a linear or branched alkyl radical, having from 1 to 6 carbon atoms, preferably methyl, ethyl, n-propyl, iso-propyl, n-butyl, tert-butyl, sec-butyl or iso-butyl; a substituted or unsubstituted aryl radical, having from 6 to 18 carbon atoms, preferably phenyl or tolyl; a substituted or unsubstituted heteroaryl radical, having a total of from 5 to 18 carbon atoms and/or heteroatoms; a substituted or unsubstituted cycloalkyl radical having a total of from 3 to 18 carbon atoms, preferably cyclopentyl or cyclohexyl;

$R^7$ and $R^8$ are each independently hydrogen, deuterium, a linear or branched alkyl radical, having from 1 to 6 carbon atoms, preferably methyl, ethyl, n-propyl, iso-propyl; a linear or branched alkyl radical having a total of from 1 to 6 carbon atoms bearing at least one fluoro radical, preferably a linear or branched perfluoroalkyl radical, more preferably $CF_3$ and $CF_2CF_3$; or halogen, preferably F;

m is 1, 2, 3, 4 or 5, preferably 1, 2 or 3, more preferably 1 or 2;

~ is the bonding site to the ligand of formula (I) or (I').

Examples for more preferred radicals $R^1$ are:

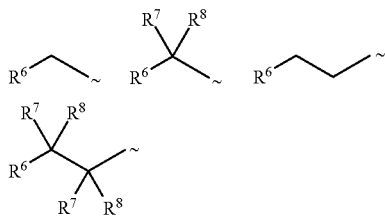

wherein $R^6$ is hydrogen, deuterium, methyl, ethyl, n-propyl, iso-propyl, n-butyl, tert-butyl, iso-butyl, sec-butyl, phenyl, tolyl, xylyl, pyridyl, methylpyridyl, pyrimidyl, pyazinyl, carbazolyl, dibenzofuranyl, dibenzothiophenyl, fluorenyl, dimethylfluorenyl, indolyl, methylindolyl, benzofuranyl, benzothiophenyl; cyclopentyl, cyclohexyl; $CF_3$, $CF_2CF_3$; $SiMe_3$, $SiEt_3$, $SiPh_3$ or $SiPh_2tBu$;

and $R^7$ and $R^8$ are hydrogen, deuterium, methyl, ethyl or n-propyl, preferably hydrogen or methyl, ethyl, or fluoro; more preferably, $R^7$ and $R^8$ are at the same time hydrogen or $R^7$ and $R^8$ are at the same time methyl;

is the bonding site to the ligand of formula (I) or (I').

$A^1$, $A^{1'}$, $A^2$, $A^{2'}$, $A^3$, $A^{3'}$, $A^4$ and $A^{4'}$ have preferably the following meanings:

$A^1$ is $CR^2$;

$A^2$ is $CR^3$;

$A^3$ is $CR^4$;

$A^4$ is $CR^5$;

$A^{1'}$ is $CR^{2'}$;

$A^{2'}$ is $CR^{3'}$;

$A^{3'}$ is $CR^{4'}$;

$A^{4'}$ is $CR^{5'}$;

Preferably, at least $A^1$, $A^{1'}$, $A^4$ and $A^{4'}$ are each CH, more preferably, $A^1$, $A^{1'}$, $A^2$, $A^{2'}$, $A^3$, $A^{3'}$, $A^4$ and $A^{4'}$ are each CH.

$R^2$, $R^3$, $R^4$, $R^5$, $R^{2'}$, $R^{3'}$, $R^{4'}$ and $R^{5'}$ have preferably the following meanings:

$R^2$, $R^3$, $R^4$, $R^5$, $R^{2'}$, $R^{3'}$, $R^{4'}$ and $R^{5'}$ are each independently hydrogen; deuterium; a linear or branched, substituted or unsubstituted alkyl radical having 1 to 20 carbon atoms, optionally interrupted by at least one heteroatom, selected from O, S and N; a substituted or unsubstituted cycloalkyl radical, having a total of from 3 to 10 carbon atoms; a substituted or unsubstituted heterocycloalkyl radical, interrupted by at least one heteroatom, selected from O, S and N, and having a total of from 3 to 10 carbon atoms and/or heteroatoms; a group with donor or acceptor action, selected from halogen radicals, preferably F or Cl, more preferably F, $CF_3$, CN, $SiPh_3$ and $SiMe_3$; a substituted or unsubstituted aryl radical, having from 6 to 30 carbon atoms;

preferably hydrogen; deuterium; a linear or branched alkyl radical, having from 1 to 4 carbon atoms; a group with donor or acceptor action, selected from the group consisting of F, $CF_3$, CN, $SiPh_3$ and $SiMe_3$; or a unsubstituted, monosubstituted or disubstituted aryl radical having 6 to 20 carbon atoms;

more preferably hydrogen, methyl, ethyl, n-propyl, iso-propyl, n-butyl, sec-butyl, tert-butyl or isobutyl; or a unsubstituted, monosubstituted or disubstituted aryl radical having 6 to 20 carbon atoms.

According to the invention, the carbene ligands (I) and (I')

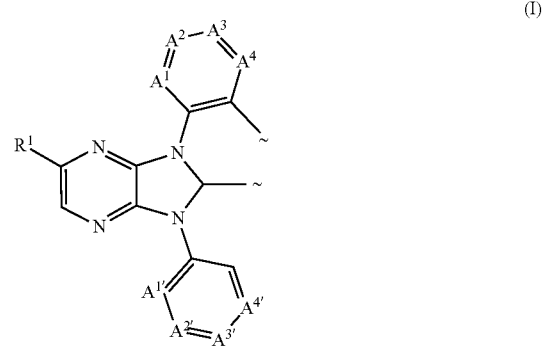

-continued

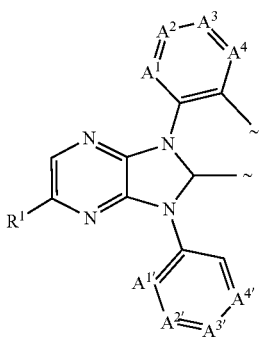
(I')

in the metal-carbene complex are monoanionic bidentate ligands.

Particularly preferably, the present invention concerns an organic electronic device, preferably an OLED, comprising at least one metal-carbene complex, wherein the metal is Ir, comprising three bidentate ligands of formula (I) and/or (I')

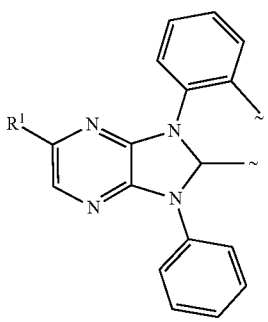
(Ia)

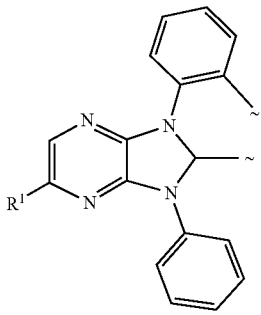
(Ia')

wherein
R$^1$
is a linear or branched alkyl radical having 1 to 20 carbon atoms, which is linked to the diazabenzimidazole carbene unit via a sp$^3$ hybridized carbon atom, optionally interrupted by at least one heteroatom, selected from O, S and N, optionally substituted with at least one of the following groups: a group with donor or acceptor action; deuterium; a substituted or unsubstituted cycloalkyl radical having a total of from 3 to 30 carbon atoms; a substituted or unsubstituted heterocyclo alkyl radical, interrupted by at least one heteroatom, selected from O, S and N, and having a total of from 3 to 30 carbon atoms and/or heteroatoms; a substituted or unsubstituted aryl radical, having a total of from 6 to 30 carbon atoms; or a substituted or an unsubstituted heteroaryl radical, having a total of from 5 to 30 carbon atoms and/or heteroatoms, selected from O, S and N;

a cycloalkyl radical having a total of from 4 to 30 carbon atoms, optionally substituted by a linear or branched, substituted or unsubstituted alkyl radical, optionally interrupted by at least one heteroatom, selected from O, S and N, and/or at least one of the groups mentioned above concerning the linear or branched alkyl radical; or a heterocyclo alkyl radical, which is linked to the diazabenzimidazole carbene unit via a sp$^3$ hybridized carbon atom, interrupted by at least one heteroatom, selected from O, S and N, and having a total of from 3 to 30 carbon atoms and/or heteroatoms, optionally substituted by a linear or branched, substituted or unsubstituted alkyl radical, optionally interrupted by at least one heteroatom, selected from O, S and N, and/or at least one of the groups mentioned above concerning the linear or branched alkyl radical; and ~ is the bonding site to the metal.

Preferred radicals R$^1$ are mentioned above.

More preferably, the metal-carbene complex comprising one, two or three bidentate ligands of formula (I) and/or (I') has one of the following formulae (II), (II') or (II"):

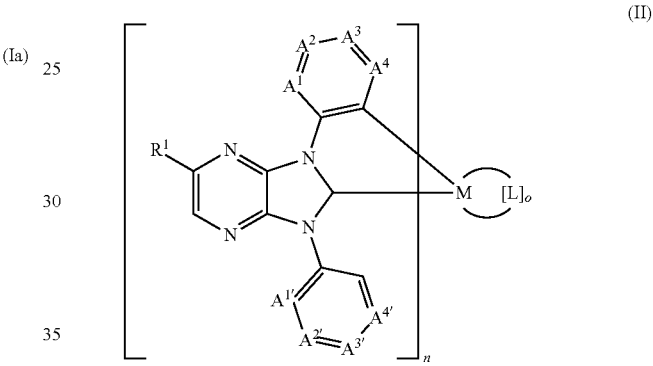
(II)

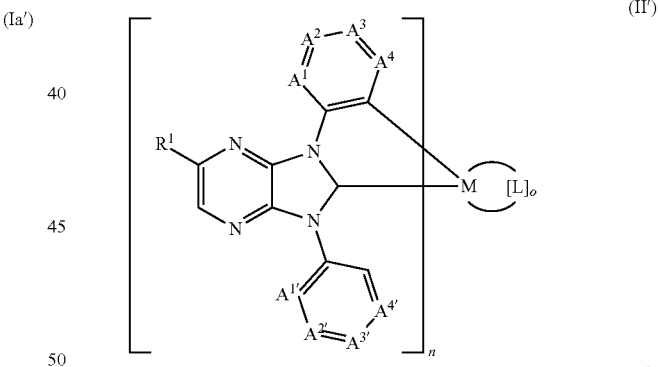
(II')

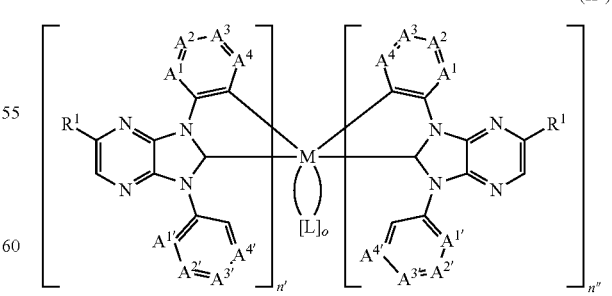
(II")

wherein
R$^1$
is a linear or branched alkyl radical having 1 to 20 carbon atoms, which is linked to the diazabenzimidazole carbene unit via a sp³ hybridized carbon atom, optionally interrupted by at least one heteroatom, selected from O, S and N, optionally substituted with at least one of the following groups: a group with donor or acceptor action; deuterium; a substituted or unsubstituted cycloalkyl radical having a total of from 3 to 30 carbon atoms; a substituted or unsubstituted heterocyclo alkyl radical, interrupted by at least one heteroatom, selected from O, S and N, and having a total of from 3 to 30 carbon atoms and/or heteroatoms; a substituted or unsubstituted aryl radical, having a total of from 6 to 30 carbon atoms; or a substituted or an unsubstituted heteroaryl radical, having a total of from 5 to 30 carbon atoms and/or heteroatoms, selected from O, S and N;

a cycloalkyl radical having a total of from 4 to 30 carbon atoms, optionally substituted by a linear or branched, substituted or unsubstituted alkyl radical, optionally interrupted by at least one heteroatom, selected from O, S and N, and/or at least one of the groups mentioned above concerning the linear or branched alkyl radical; or a heterocyclo alkyl radical, which is linked to the diazabenzimidazole carbene unit via a sp³ hybridized carbon atom, interrupted by at least one heteroatom, selected from O, S and N, and having a total of from 3 to 30 carbon atoms and/or heteroatoms, optionally substituted by a linear or branched, substituted or unsubstituted alkyl radical, optionally interrupted by at least one heteroatom, selected from O, S and N, and/or at least one of the groups mentioned above concerning the linear or branched alkyl radical;

$A^1$ is $CR^2$ or N; preferably $CR^2$;
$A^2$ is $CR^3$ or N; preferably $CR^3$;
$A^3$ is $CR^4$ or N; preferably $CR^4$;
$A^4$ is $CR^5$ or N; preferably $CR^5$;
$A^{1'}$ is $CR^{2'}$ or N; preferably $CR^{2'}$;
$A^{2'}$ is $CR^{3'}$ or N; preferably $CR^{3'}$;
$A^{3'}$ is $CR^{4'}$ or N; preferably $CR^{4'}$;
$A^{4'}$ is $CR^{5'}$ or N; preferably $CR^{5'}$;
$R^2$, $R^3$, $R^4$, $R^5$, $R^{2'}$, $R^{3'}$, $R^{4'}$ and $R^{5'}$
are each independently hydrogen; deuterium; a linear or branched, substituted or unsubstituted alkyl radical having 1 to 20 carbon atoms, optionally interrupted by at least one heteroatom, selected from O, S and N; a substituted or unsubstituted cycloalkyl radical having a total of from 3 to 30 carbon atom; a substituted or unsubstituted heterocyclo alkyl radical, interrupted by at least one heteroatom selected from O, S and N and having a total of from 3 to 30 carbon atoms and/or heteroatoms; a substituted or unsubstituted aryl radical, having a total of from 6 to 30 carbon atoms; a substituted or unsubstituted heteroaryl radical, having a total of from 5 to 30 carbon atoms and/or heteroatoms, selected from O, S and N; or a group with donor or acceptor action;

preferably, $R^2$, $R^3$, $R^4$, $R^5$, $R^{2'}$, $R^{3'}$, $R^{4'}$ and $R^{5'}$ are each independently hydrogen, deuterium, a linear or branched, substituted or unsubstituted alkyl radical, having 1 to 20 carbon atoms; an unsubstituted aryl radical, having from 6 to 18 carbon atoms, a monosubstituted aryl radical having from 6 to 18 carbon atoms, a disubstituted aryl radical having from 6 to 18 carbon atoms; an unsubstituted heteroaryl radical, having a total of from 5 to 18 carbon atoms and/or heteroatoms, a monosubstituted heteroaryl radical, having a total of from 5 to 18 carbon atoms and/or heteroatoms, a disubstituted heteroaryl radical, having a total of from 5 to 18 carbon atoms and/or heteroatoms; more preferably, the aryl radical or heteroaryl radical are selected from the group consisting of phenyl, tolyl, xylyl, diisopropylphenyl, pyridyl, methylpyridyl, pyrimidyl, pyrazinyl, carbazolyl, dibenzofuranyl, dibenzothiophenyl, fluorenyl, dimethylfluorenyl, indolyl, methylindolyl, benzofuranyl and benzothiophenyl; a group with donor or acceptor action, selected from halogen radicals, preferably F or Cl, more preferably F; $CF_3$, CN; or $SiR^9R^{10}R^{11}$, preferably $SiMe_3$, $SiPh_3$, $SiEt_3$ or $SiPh_2tBu$;

$R^9$, $R^{10}$, $R^{11}$
are each independently a linear or branched alkyl radical, having from 1 to 6 carbon atoms, preferably methyl, ethyl, n-propyl, iso-propyl, n-butyl, tert-butyl, sec-butyl or iso-butyl; a substituted or unsubstituted aryl radical, having from 6 to 18 carbon atoms, preferably phenyl or tolyl; a substituted or unsubstituted heteroaryl radical, having a total of from 5 to 18 carbon atoms and/or heteroatoms; a substituted or unsubstituted cycloalkyl radical having a total of from 3 to 18 carbon atoms, preferably cyclopentyl or cyclohexyl;

or $R^2$ and $R^3$, $R^3$ and $R^4$ or $R^4$ and $R^5$ or $R^{2'}$ and $R^{3'}$, $R^{3'}$ and $R^{4'}$ or $R^{4'}$ and $R^{5'}$ may form, independently of each other, together with the carbon atoms to which they are bonded, a saturated or unsaturated or aromatic, optionally substituted ring, which is optionally interrupted by at least one heteroatom, selected from O, S and N, has a total of from 5 to 18 carbon atoms and/or heteroatoms, and may optionally be fused to at least one further optionally substituted saturated or unsaturated or aromatic ring, optionally interrupted by at least one heteroatom, selected from O, S and N, and having a total of from 5 to 18 carbon atoms and/or heteroatoms;

M is Ir or Pt, preferably Ir(III) or Pt(II), more preferably Ir(III);

n is in the case that M is Ir 1, 2 or 3, preferably 3; in the case that M is Pt 1 or 2, preferably 1;

L is a monoanionic bidentate ligand, o is in the case that M is Ir 0, 1 or 2, where, when o=2, the L ligands may be the same or different, preferably 0; in the case that M is Pt 0 or 1, preferably 1;

n' is in the case that M is Ir 1 or 2; in the case that M is Pt 1;

n" is in the case that M is Ir 1 or 2; in the case that M is Pt 1;

wherein in the case that M is Ir, the sum of n'+n" is 2 or 3, preferably 3; in the case that M is Pt, the sum of n'+n" is 2;

o' is in the case that M is Ir 0 or 1, preferably 0; in the case that M is Pt 0;

wherein in the case that M is Ir the sum of n+o in formulae (II) and (II') and the sum of n'+n"+o' in formula (II") is 3, with the proviso that n in formula (II) and (II') is at least 1 and n', as well as n" in formula (II") are at least 1; and in the case that M is Pt the sum of n+o in formulae (II) and (II') and the sum of n'+n"+o' in formula (II") is 2, with the proviso that n in formula (II) and (II') is at least 1 and n', as well as n" in formula (II") are both 1.

The carbene ligands in the Ir metal-carbene complexes of formulae (II), (II') and (II") are monoanionic bidentate ligands The carbene ligands in the metal-carbene complexes of formulae (II), (II') and (II") correspond to the carbene ligands of formulae (I) and (I') mentioned above.

The Ir metal-carbene complexes of formulae (II), (II') and (II") are cyclometallation isomers.

Preferred definitions mentioned concerning the radicals and groups $R^1$, $A^1$, $A^2$, $A^3$, $A^4$, $A^{1'}$, $A^{2'}$, $A^{3'}$ and $A^{4'}$ in the carbene ligands of formulae (I) and (I') mentioned above are also preferred definitions concerning said radicals and groups in the metal-carbene complexes of formulae (II), (II') and (II"). The ~ in the definition of $R^1$ is in the case of the metal-carbene complexes of formulae (II), (II') and (II") the bonding site to the carbene ligand in the metal-carbene complexes of formulae (II), (II') and (II").

A bidentate ligand is understood to mean a ligand coordinated at two sites to the transition metal atom M.

Suitable monoanionic bidentate ligands L are preferably selected from the group of ligands (A), (B) and (C). Ligands (A), (B) and (C) are mentioned below:

Ligands of the formula (A):

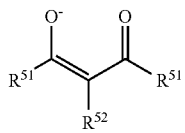

(A)

in which $R^{51}$ is in each case independently a linear or branched alkyl radical having 1 to 6 carbons atoms, preferably methyl, ethyl, isopropyl or tert-butyl; a substituted or unsubstituted aryl radical having 6 to 18 carbon atoms, preferably an unsubstituted phenyl or 2,6-dialkylphenyl; a substituted or unsubstituted heteroaryl radical having a total of 5 to 18 carbon atoms and/or heteroatoms, $R^{52}$ is hydrogen; a linear or branched alkyl radical having 1 to 6 carbon atoms; a substituted or unsubstituted aryl radical having 6 to 18 carbon atoms; preferably hydrogen or 2,6-dimethylphenyl;

where the ligand of the formula (A) is preferably acetylacetonato.

Ligands of the formula (B):

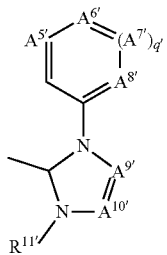

(B)

where $A^{9'}$ is $CR^{12'}$ Or N;

$A^{10'}$ is $CR^{13'}$ or N;

$R^{11'}$ is a linear or branched, substituted or unsubstituted alkyl radical having 1 to 20 carbon atoms, optionally interrupted by at least one heteroatom, selected from O, S and N; a substituted or unsubstituted cycloalkyl radical having 3 to 18 carbon atoms; a substituted or unsubstituted heterocycloalkyl radical interrupted by at least one heteroatom, selected from O, S and N, and having 3 to 18 carbon atoms and/or heteroatoms; a substituted or unsubstituted aryl radical having 6 to 30 carbon atoms, a substituted or unsubstituted heteroaryl radical interrupted by at least one heteroatom, selected from O, S and N and having a total of 5 to 30 carbon atoms and/or heteroatoms;

$R^{12'}$, $R^{13'}$ are each independently hydrogen; deuterium; a linear or branched, substituted or unsubstituted alkyl radical having 1 to 20 carbon atoms, optionally interrupted by at least one heteroatom, selected from O, S and N; a substituted or unsubstituted cycloalkyl radical having 3 to 18 carbon atoms; a substituted or unsubstituted heterocycloalkyl radical interrupted by at least one heteroatom, selected from O, S and N, and having 3 to 18 carbon atoms and/or heteroatoms; a substituted or unsubstituted aryl radical having 6 to 30 carbon atoms; a substituted or unsubstituted heteroaryl radical interrupted by at least one heteroatom, selected from O, S and N and having a total of 5 to 30 carbon atoms and/or heteroatoms; or a group with donor or acceptor action;

if $A^{9'}$ is $CR^{12'}$ and $A^{10'}$ is $CR^{13'}$, $CR^{12'}$ and $CR^{13'}$ together may form, a saturated or unsaturated or aromatic, optionally substituted ring, which is optionally interrupted by at least one heteroatom, selected from O, S and N, has a total of from 5 to 18 carbon atoms and/or heteroatoms, and may optionally be fused to at least one further optionally substituted saturated or unsaturated or aromatic ring, optionally interrupted by at least one heteroatom, selected from O, S and N, and having a total of from 5 to 18 carbon atoms and/or heteroatoms;

$A^{5'}$ is $CR^{14'}$ or N; preferably $CR^{14'}$;

$A^{6'}$ is $CR^{15'}$ or N; preferably $CR^{15'}$;

$A^{7'}$ is $CR^{16'}$ or N; preferably $CR^{16'}$;

$A^{8'}$ is $CR^{17'}$ or N; preferably $CR^{17'}$;

$R^{14'}$, $R^{15'}$, $R^{16'}$, $R^{17'}$ are each independently hydrogen; deuterium; a linear or branched, substituted or unsubstituted alkyl radical having 1 to 20 carbon atoms, optionally interrupted by at least one heteroatom, selected from O, S and N; a substituted or unsubstituted cycloalkyl radical having 3 to 18 carbon atoms; a substituted or unsubstituted heterocycloalkyl radical interrupted by at least one heteroatom, selected from O, S and N, and having 3 to 18 carbon atoms and/or heteroatoms; a substituted or unsubstituted aryl radical having 6 to 30 carbon atoms; a substituted or unsubstituted heteroaryl radical interrupted by at least one heteroatom, selected from O, S and N and having a total of 5 to 30 carbon atoms and/or heteroatoms; or a group with donor or acceptor action;

or $R^{14'}$ and $R^{15'}$, $R^{15'}$ and $R^{16'}$ or $R^{16'}$ and $R^{17'}$ may form, together with the carbon atoms to which they are bonded, a saturated or unsaturated or aromatic, optionally substituted ring, which is optionally interrupted by at least one heteroatom, selected from O, S and N, has a total of from 5 to 18 carbon atoms and/or heteroatoms, and may optionally be fused to at least one further optionally substituted saturated or unsaturated or aromatic ring, optionally interrupted by at least one heteroatom, selected from O, S and N, and having a total of from 5 to 18 carbon atoms and/or heteroatoms;

or if $A^{9'}$ is $CR^{12'}$, $R^{12'}$ and $R^{17'}$ together may form a saturated or unsaturated, linear or branched bridge optionally comprising heteroatoms, selected from O, S and N, to which is optionally fused a substituted or unsubstituted, five- to eight-membered ring comprising carbon atoms and/or heteroatoms, and which are optionally substituted with aromatic units, heteroaromatic units or groups with donor or acceptor action;

q' is 0 or 1.

More preferred ligands of formula (B) are:

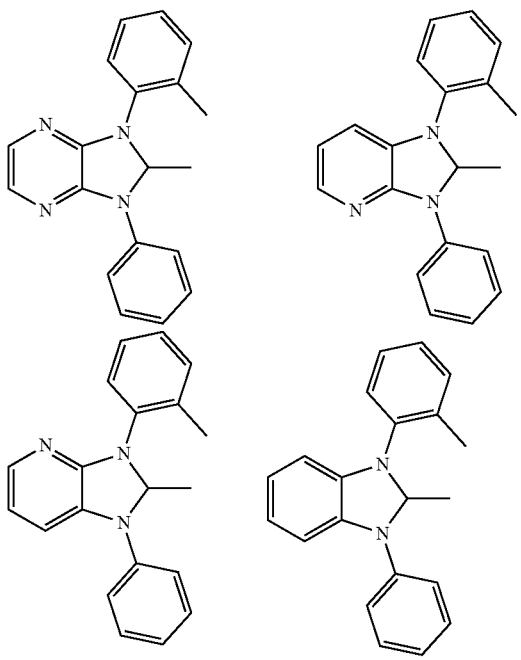

A most preferred ligand of formula (B) is:

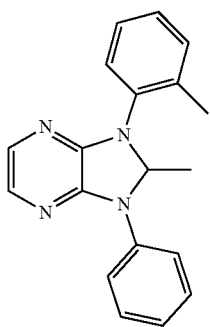 [SMILES: Cc1ccccc1N1c2nccnc2N(c2ccccc2)C1C]

Ligands of formula (C):

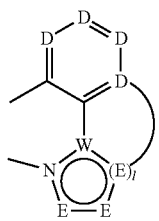

(C)

in which the symbols are each defined as follows:
D are each independently CR$^{34'''}$ or N;
W is C or N;
E are each independently CR$^{35'''}$, N, NR$^{36'''}$ or O;
I is 1 or 2;
R$^{34'''}$, R$^{35'''}$, R$^{36'''}$
are each independently hydrogen; alkyl; aryl or heteroaryl;

or
in each case two R$^{34'''}$, R$^{35'''}$ or R$^{36'''}$ radicals together form a fused ring which may optionally comprise at least one heteroatom;

or

R$^{34'''}$, R$^{35'''}$, R$^{36'''}$ or R$^{37'''}$ is a radical having donor or acceptor action;

where the dotted line means an optional bridge between one of the D groups and one of
the E groups; where the bridge may be defined as follows:
alkylene, arylene, heteroarylene, alkynylene, alkenylene, NR$^{38'''}$, O, S, SiR$^{41'''}$R$^{42'''}$, CO, CO—O, O—CO and (CR$^{43'''}$R$^{44'''}$)$_v$, where one or more nonadjacent (CR$^{43'''}$R$^{44'''}$) groups may be replaced by NR$^{38'''}$, O, S, SiR$^{41'''}$R$^{42'''}$, CO, CO—O or O—CO, where v is from 2 to 10;

and

R$^{38'''}$, R$^{41'''}$, R$^{42'''}$, R$^{43'''}$, R$^{44'''}$ are each H, alkyl, aryl or heteroaryl.

Preferred ligands L in the Ir(III) complexes of formulae (II), (II') and (II") are ligands (B). Therefore, in a preferred embodiment, the metal-carbene complexes of formulae (II), (II') and (II"), wherein M is Ir(III), exclusively have carbene ligands.

Preferably, o in the metal-carbene complexes of the formulae (II) and (II'), wherein M is Ir(III), is 0 and o' in the metal-carbene complexes of the formula (II") is 0. In this case, n in formulae (II) and (II') is preferably 3 and n' and n" in formula (II") are 1 or 2, wherein the sum of n' and n" is 3.

Preferred ligands L in the Pt(II) complexes of formulae (II), (II') and (II") are ligands (A).

Preferably, o in the metal-carbene complexes of the formulae (II) and (II'), wherein M is Pt(II), is 1 and o' in the metal-carbene complexes of the formula (II") is 1. In this case, n in formulae (II) and (II') is preferably 1 and one of n' and n" in formula (II") is 1 and the other one is 0, wherein the sum of n' and n" is 1.

The n diazabenzimidazole carbene ligands may each be the same or different in the metal-carbene complexes of the general formulae (II), (II') and (II"). They are preferably the same.

The metal-carbene complex of the general formula (II") preferably comprises three identical carbene ligands—in the case that M is Ir(III)—or two identical carbene ligands—in the case that M is Pt(II)—wherein the bonding situation in one of the carbene ligands is different from the bonding situation in the other one (in the case that M is Pt(II)) or two (in the case that M is Ir(III)) further carbene ligands as shown in formula (II").

Particularly preferably, the metal-carbene complex comprising one, two or three bidentate ligands of formula (I) and/or (I') has one of the following formulae (IIa), (II'a), (II"a) or (II"a'):

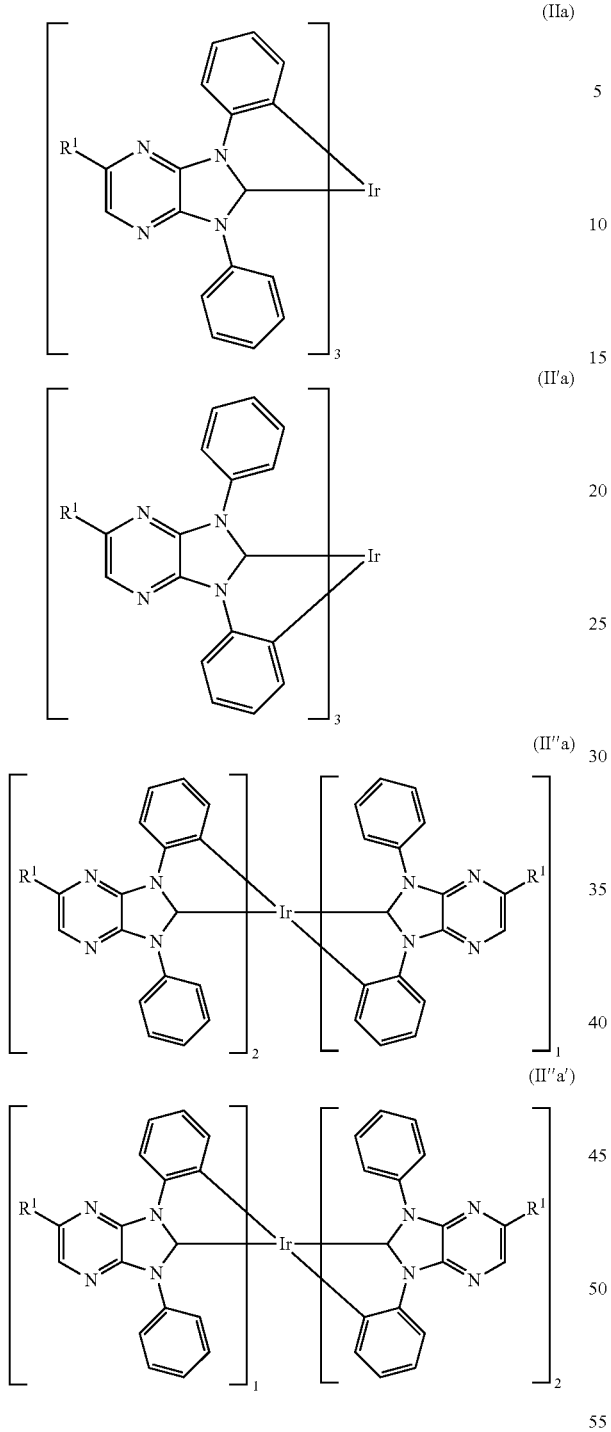

(IIa)

(II'a)

(II''a)

(II''a')

wherein
R¹ is a linear or branched alkyl radical having 1 to 20 carbon atoms, which is linked to the diazabenzimidazole carbene unit via a sp³ hybridized carbon atom, optionally interrupted by at least one heteroatom, selected from O, S and N, optionally substituted with at least one of the following groups: a group with donor or acceptor action; deuterium; a substituted or unsubstituted cycloalkyl radical having a total of from 3 to 30 carbon atoms; a substituted or unsubstituted heterocyclo alkyl radical, interrupted by at least one heteroatom, selected from O, S and N, and having a total of from 3 to 30 carbon atoms and/or heteroatoms; a substituted or unsubstituted aryl radical, having a total of from 6 to 30 carbon atoms; or a substituted or an unsubstituted heteroaryl radical, having a total of from 5 to 30 carbon atoms and/or heteroatoms, selected from O, S and N;

a cycloalkyl radical having a total of from 4 to 30 carbon atoms, optionally substituted by a linear or branched, substituted or unsubstituted alkyl radical, optionally interrupted by at least one heteroatom, selected from O, S and N, and/or at least one of the groups mentioned above concerning the linear or branched alkyl radical; or a heterocyclo alkyl radical, which is linked to the diazabenzimidazole carbene unit via a sp³ hybridized carbon atom, interrupted by at least one heteroatom, selected from O, S and N, and having a total of from 3 to 30 carbon atoms and/or heteroatoms, optionally substituted by a linear or branched, substituted or unsubstituted alkyl radical, optionally interrupted by at least one heteroatom, selected from O, S and N, and/or at least one of the groups mentioned above concerning the linear or branched alkyl radical.

Preferred radicals R¹ are mentioned above.

There exist cyclometallation isomers of the complexes mentioned below which are covered by the disclosure of the present invention, even if only one cyclometallation isomer is shown.

Examples for carbene complexes of the general formulae (II), (II') and (II'') are the following Ir- and Pt-carbene complexes, wherein the following Ir carbene complexes are preferred:

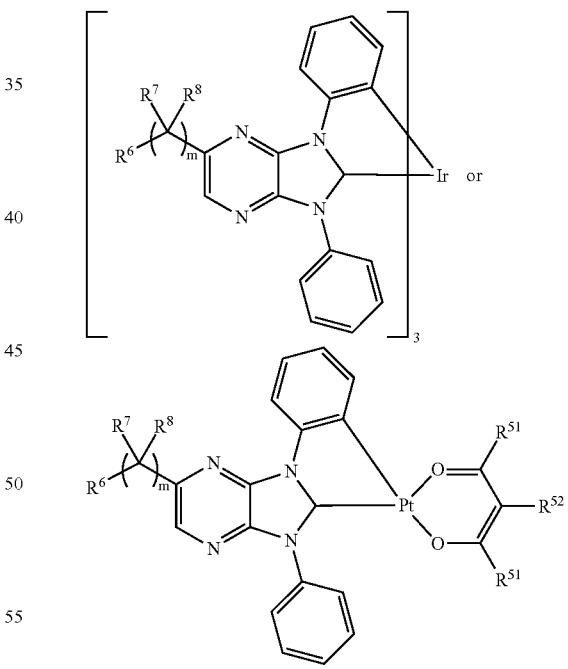

wherein
R⁶ is hydrogen; deuterium; a linear or branched alkyl radical having a total of from 1 to 10 carbon atoms, preferably methyl, ethyl, n-propyl, iso-propyl, n-butyl, tert-butyl or iso-butyl; a linear or branched alkyl radical having a total of from 1 to 10 carbon atoms bearing at least one fluoro radical, preferably a linear or branched perfluoroalkyl radical, more preferably $CF_3$ and $CF_2CF_3$; a substituted or unsubstituted cycloalkyl radical, having a total of from 3 to 30 carbon atoms, preferably cyclopentyl or cyclohexyl; a substituted or unsubstituted heterocyclo alkyl radical, interrupted by at least one heteroatom, selected from O, S and N, having a total of from 3 to 30 carbon atoms and/or heteroatoms; a substituted or unsubstituted aryl radical, having from 6 to 18 carbon atoms; a substituted or unsubstituted heteroaryl radical, having a total of from 5 to 18 carbon atoms and/or heteroatoms, selected from O, S and N, preferably, the aryl radical or heteroaryl radical are selected from the group consisting of an unsubstituted aryl radical, having from 6 to 18 carbon atoms, a monosubstituted aryl radical having from 6 to 18 carbon atoms, a disubstituted aryl radical having from 6 to 18 carbon atoms, an unsubstituted heteroaryl radical, having a total of from 5 to 18 carbon atoms and/or heteroatoms, a monosubstituted heteroaryl radical, having a total of from 5 to 18 carbon atoms and/or heteroatoms, a disubstituted heteroaryl radical, having a total of from 5 to 18 carbon atoms and/or heteroatoms, more preferably, the aryl radical or heteroaryl radical are selected from the group consisting of phenyl, tolyl, xylyl, pyridyl, methylpyridyl, pyrimidyl, pyazinyl, carbazolyl, dibenzofuranyl, dibenzothiophenyl, fluorenyl, dimethylfluorenyl, indolyl, methylindolyl, benzofuranyl and benzothiophenyl; or $SiR^9R^{10}R^{11}$, preferably $SiMe_3$, $SiPh_3$, $SiEt_3$ or $SiPh_2tBu$;

$R^9$, $R^{10}$, $R^{11}$ are each independently a linear or branched alkyl radical, having from 1 to 6 carbon atoms, preferably methyl, ethyl, n-propyl, iso-propyl, n-butyl, tert-butyl or iso-butyl; a substituted or unsubstituted aryl radical, having from 6 to 18 carbon atoms, preferably phenyl or tolyl; a substituted or unsubstituted heteroaryl radical, having a total of from 5 to 18 carbon atoms and/or heteroatoms; a substituted or unsubstituted cycloalkyl radical having a total of from 3 to 18 carbon atoms, preferably cyclopentyl or cyclohexyl;

$R^7$ and $R^8$ are each independently hydrogen, deuterium, a linear or branched alkyl radical, having from 1 to 6 carbon atoms, preferably methyl, ethyl, n-propyl, iso-propyl; a linear or branched alkyl radical having a total of from 1 to 6 carbon atoms bearing at least one fluoro radical, preferably a linear or branched perfluoroalkyl radical, more preferably $CF_3$ and $CF_2CF_3$; or halogen, preferably F;

m is 1, 2, 3, 4 or 5, preferably 1, 2 or 3 more preferably 1 or 2; $R^{51}$ is in each case independently a linear or branched alkyl radical having 1 to 6 carbons atoms, preferably methyl, ethyl, isopropyl or tert-butyl; a substituted or unsubstituted aryl radical having 6 to 18 carbon atoms, preferably an unsubstituted phenyl or 2,6-dialkylphenyl or 2,4,6-trialkylphenyl; a substituted or unsubstituted heteroaryl radical having a total of 5 to 18 carbon atoms and/or heteroatoms; most preferably, $R^{51}$ is methyl, phenyl, 2,6-xylyl, 2,4,6-mesityl or 2,4,6-triisopropylphenyl;

$R^{52}$ is hydrogen; a linear or branched alkyl radical having 1 to 6 carbon atoms; a substituted or unsubstituted aryl radical having 6 to 18 carbon atoms; preferably hydrogen.

Further examples of inventive Ir- and Pt-complexes are:

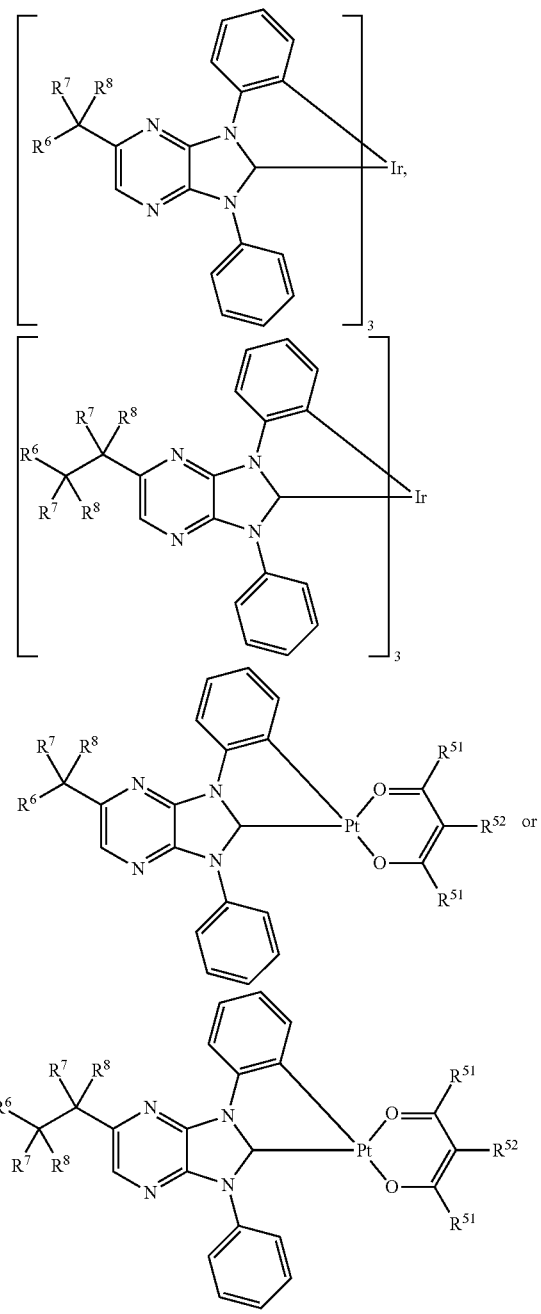

wherein
$R^6$
is hydrogen, deuterium, methyl, ethyl, n-propyl, iso-propyl, n-butyl, tert-butyl, iso-butyl, phenyl, tolyl, xylyl, pyridyl, methylpyridyl, pyrimidyl, pyazinyl, carbazolyl, dibenzofuranyl, dibenzothiophenyl, fluorenyl, dimethylfluorenyl, indolyl, methylindolyl, benzofuranyl, benzothiophenyl; cyclopentyl, cyclohexyl; $CF_3$, $CF_2CF_3$; $SiMe_3$, $SiPh_3$, $SiEt_3$ or $SiPh_2tBu$; and
$R^7$ and $R^8$
are hydrogen, deuterium, methyl, ethyl or n-propyl, preferably hydrogen or methyl, or fluoro; more preferably, $R^7$ and $R^8$ are at the same time hydrogen or $R^7$ and $R^8$ are at the same time methyl;

$R^{51}$ is in each case independently methyl, tert-butyl, phenyl, xylyl, 2,6-xylyl, 2,4,6-mesityl or 2,4,6-triisopropylphenyl; and $R^{52}$ is hydrogen.

Further examples for inventive Ir- and Pt-complexes are the following complexes:

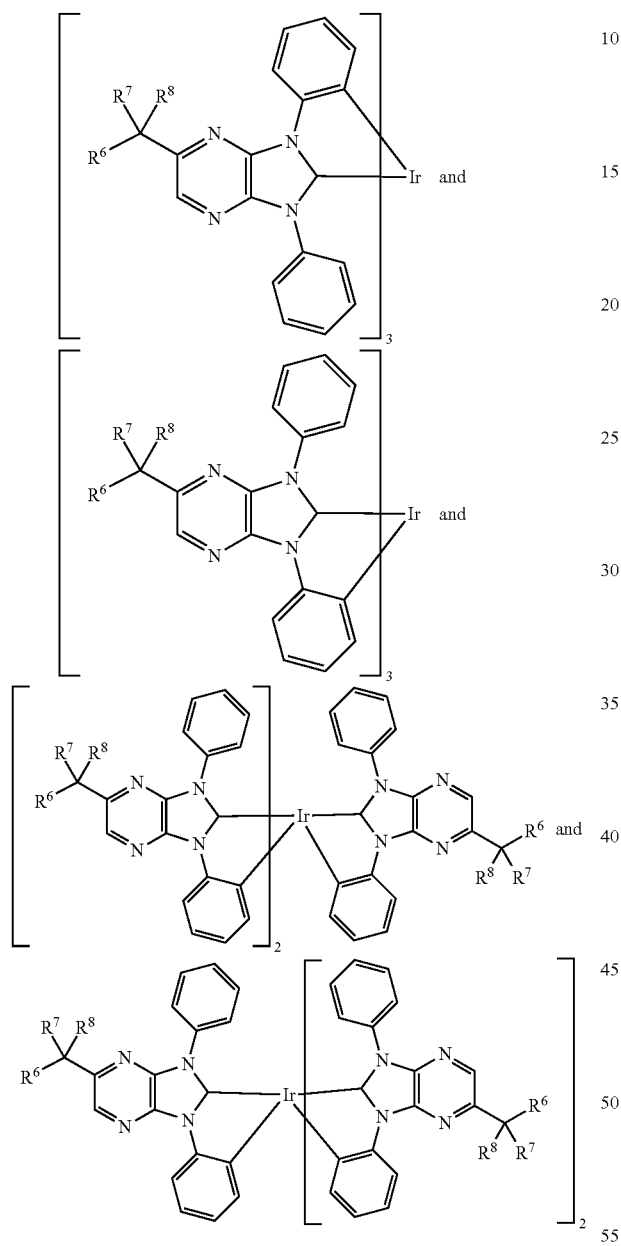

| | $R^6$ | $R^7$ | $R^8$ |
|---|---|---|---|
| 1 | hydrogen | hydrogen | hydrogen |
| 2 | methyl | hydrogen | hydrogen |
| 3 | ethyl | hydrogen | hydrogen |
| 4 | n-propyl | hydrogen | hydrogen |
| 5 | iso-propyl | hydrogen | hydrogen |
| 6 | n-butyl | hydrogen | hydrogen |
| 7 | iso-butyl | hydrogen | hydrogen |
| 8 | tert-butyl | hydrogen | hydrogen |
| 9 | methyl | methyl | hydrogen |
| 10 | ethyl | methyl | hydrogen |
| 11 | n-propyl | methyl | hydrogen |
| 12 | n-butyl | methyl | hydrogen |
| 13 | iso-butyl | methyl | hydrogen |
| 14 | tert-butyl | methyl | hydrogen |
| 15 | Ethyl | ethyl | hydrogen |
| 16 | n-propyl | ethyl | hydrogen |
| 17 | n-butyl | ethyl | hydrogen |
| 18 | iso-butyl | ethyl | hydrogen |
| 19 | tert-butyl | ethyl | hydrogen |
| 20 | iso-propyl | n-propyl | hydrogen |
| 21 | n-butyl | n-propyl | hydrogen |
| 22 | iso-butyl | n-propyl | hydrogen |
| 23 | tert-butyl | n-propyl | hydrogen |
| 24 | methyl | methyl | methyl |
| 25 | ethyl | methyl | methyl |
| 26 | n-propyl | methyl | methyl |
| 27 | iso-propyl | methyl | methyl |
| 28 | n-butyl | methyl | methyl |
| 29 | iso-butyl | methyl | methyl |
| 30 | tert-butyl | methyl | methyl |
| 31 | ethyl | ethyl | ethyl |
| 32 | n-propyl | ethyl | ethyl |
| 33 | iso-propyl | ethyl | ethyl |
| 34 | n-butyl | ethyl | ethyl |
| 35 | iso-butyl | ethyl | ethyl |
| 36 | tert-butyl | ethyl | ethyl |
| 37 | ethyl | ethyl | butyl |
| 38 | n-propyl | ethyl | propyl |
| 39 | iso-propyl | ethyl | propyl |
| 40 | n-butyl | ethyl | propyl |
| 41 | iso-butyl | ethyl | propyl |
| 42 | tert-butyl | ethyl | propyl |

As well as the following complexes:

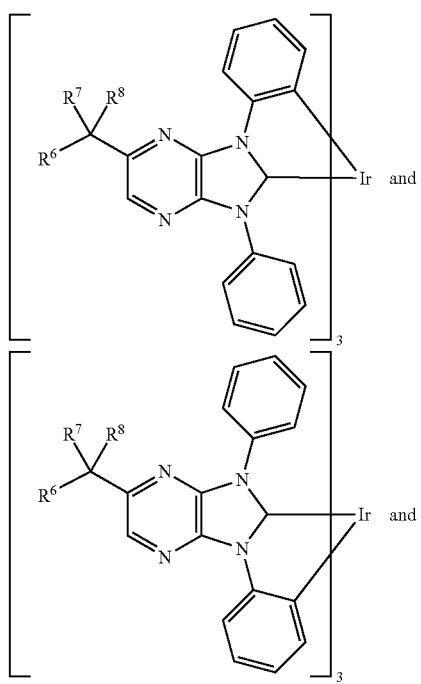

-continued

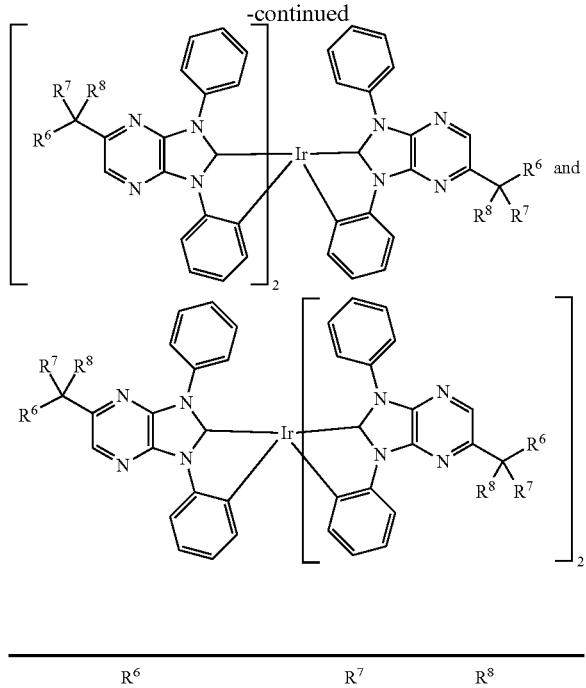

| | R⁶ | R⁷ | R⁸ |
|---|---|---|---|
| 51 | phenyl | hydrogen | hydrogen |
| 52 | Tolyl | hydrogen | hydrogen |
| 53 | Xylyl | hydrogen | hydrogen |
| 54 | pyridyl | hydrogen | hydrogen |
| 55 | methylpyridyl | hydrogen | hydrogen |
| 56 | pyrimidyl | hydrogen | hydrogen |
| 57 | pyrazinyl | hydrogen | hydrogen |
| 58 | carbazolyl | hydrogen | hydrogen |
| 59 | dibenzofuranyl | hydrogen | hydrogen |
| 60 | dimethylfluorenyl | hydrogen | hydrogen |
| 61 | methylindonyl | hydrogen | hydrogen |
| 62 | —CH₂-tolyl | hydrogen | hydrogen |
| 63 | —CH₂-xylyl | hydrogen | hydrogen |
| 64 | —CH₂-pyridyl | hydrogen | hydrogen |
| 65 | —CH₂-pyrazinyl | hydrogen | hydrogen |
| 66 | —CH₂-methylpyridinyl | hydrogen | hydrogen |
| 67 | —CH₂-dibenzofuranyl | hydrogen | hydrogen |
| 68 | —CMe₂-methyl | hydrogen | Hydrogen |
| 69 | —CMe₂-ethyl | hydrogen | hydrogen |
| 70 | —CMe₂-propyl | hydrogen | hydrogen |
| 71 | —CMe₂-iso-butyl | hydrogen | hydrogen |
| 72 | cyclopentyl | hydrogen | hydrogen |
| 73 | cyclohexyl | hydrogen | hydrogen |
| 74 | adamantyl | hydrogen | hydrogen |
| 75 | —CH₂-adamantyl | hydrogen | hydrogen |
| 76 | CF₃ | hydrogen | hydrogen |
| 77 | CF₂CF₃ | hydrogen | hydrogen |
| 78 | SiMe₃ | hydrogen | hydrogen |
| 79 | SiPh₃ | hydrogen | hydrogen |
| 80 | phenyl | methyl | methyl |
| 81 | tolyl | methyl | methyl |
| 82 | xylyl | methyl | methyl |
| 83 | pyridyl | methyl | methyl |
| 84 | methylpyridyl | methyl | methyl |
| 85 | pyrimidyl | methyl | methyl |
| 86 | pyrazinyl | methyl | methyl |
| 87 | carbazolyl | methyl | methyl |
| 88 | dibenzofuranyl | methyl | methyl |
| 89 | dimethylfluorenyl | methyl | methyl |
| 90 | methylindonyl | methyl | methyl |
| 91 | —CH₂-tolyl | methyl | methyl |
| 92 | —CH₂-xylyl | methyl | methyl |
| 93 | —CH₂-pyridyl | methyl | methyl |
| 94 | —CH₂-pyrazinyl | methyl | methyl |
| 95 | —CH₂-methylpyridinyl | methyl | methyl |
| 96 | —CH₂-dibenzofuranyl | methyl | methyl |
| 97 | —CMe₂-methyl | methyl | methyl |
| 98 | —CMe₂-ethyl | methyl | methyl |
| 99 | —CMe₂-propyl | methyl | methyl |
| 100 | —CMe₂-iso-butyl | methyl | methyl |
| 101 | cyclopentyl | methyl | methyl |
| 102 | cyclohexyl | methyl | methyl |
| 103 | CF₃ | methyl | methyl |
| 104 | CF₂CF₃ | methyl | methyl |
| 105 | SiMe₃ | methyl | methyl |
| 106 | SiPh₃ | methyl | methyl |

As well as the following complexes:

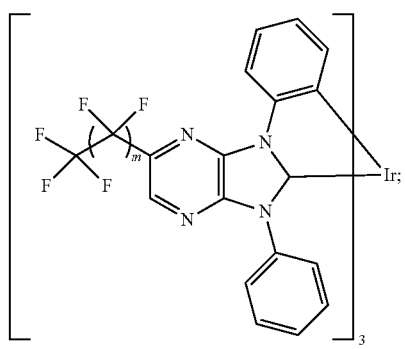

m is 0, 1, 2, 3, 4 or 5

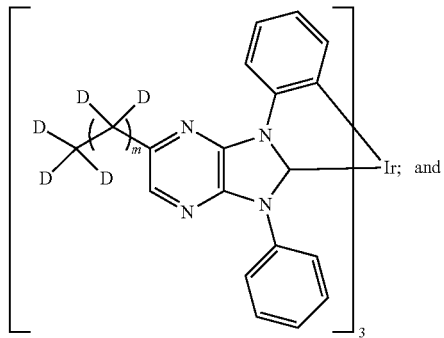

m is 0, 1, 2, 3, 4 or 5

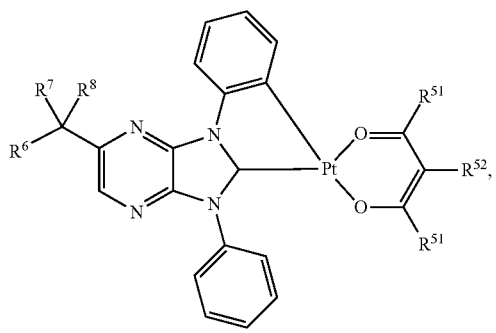

wherein $R^6$ is methyl, ethyl, n-propyl, iso-propyl, SiMe₃, SiEt₃, SiPh₃, cyclopentyl or cyclohexyl; $R^7$, $R^8$ are independently hydrogen, methyl, ethyl, n-propyl or iso-propyl; $R^{51}$ is in each case independently methyl, phenyl or 2,4,6-triisopropylphenyl; and $R^{52}$ is hydrogen.

As well as the following complexes:
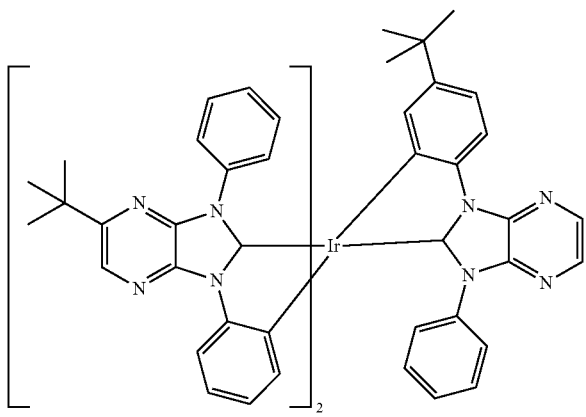
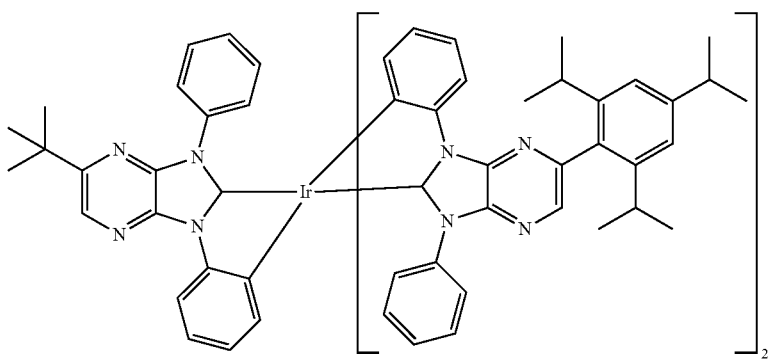
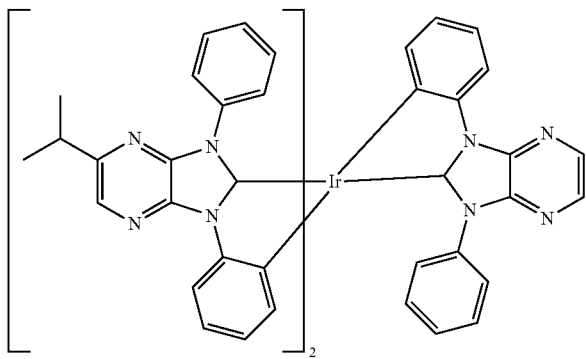
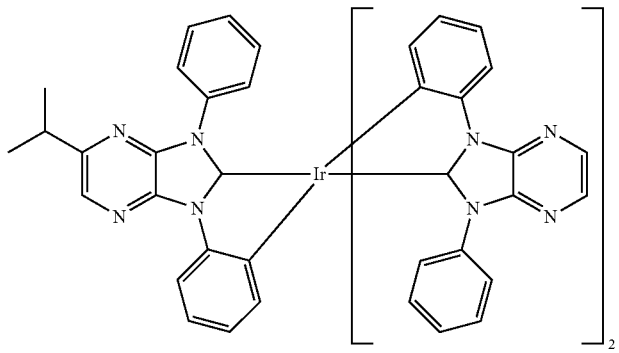

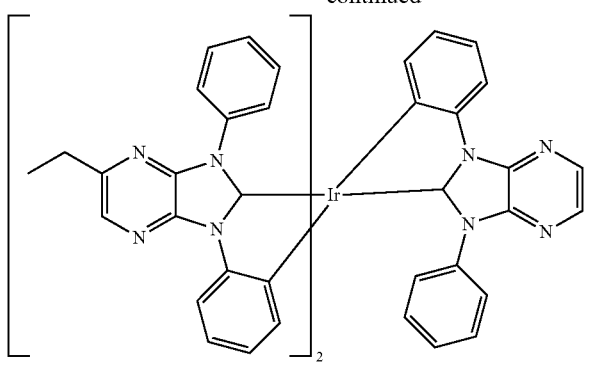
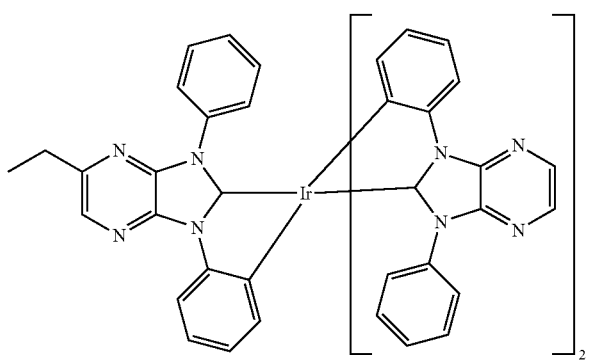
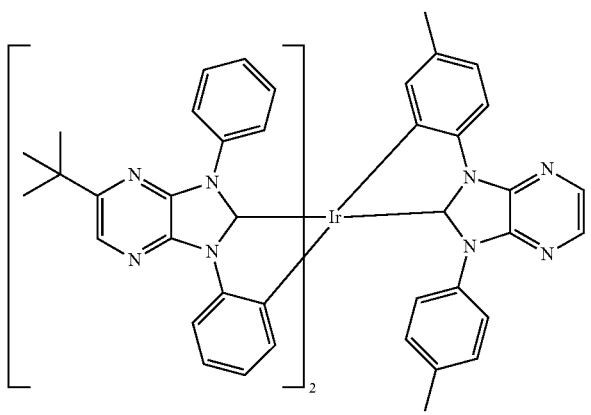
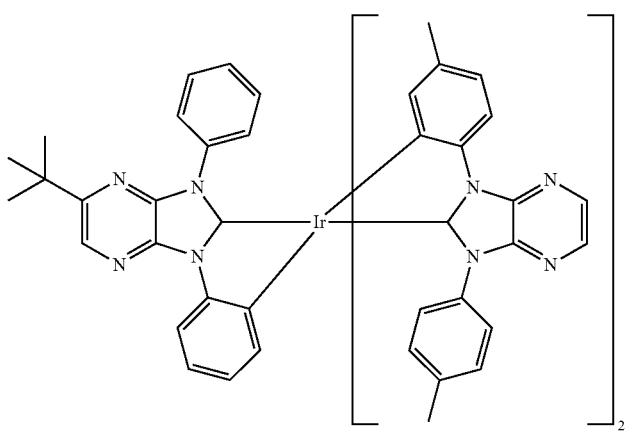

-continued
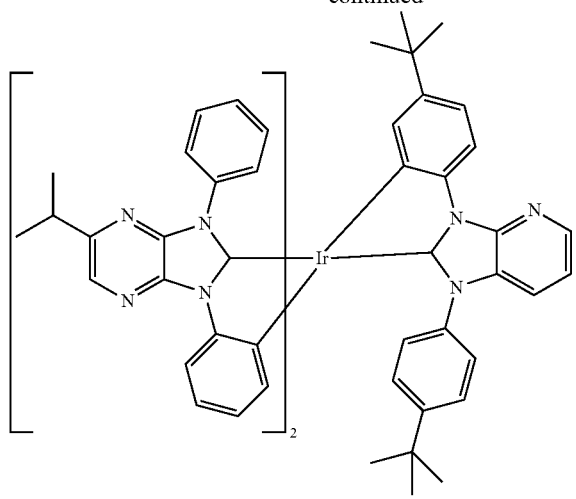
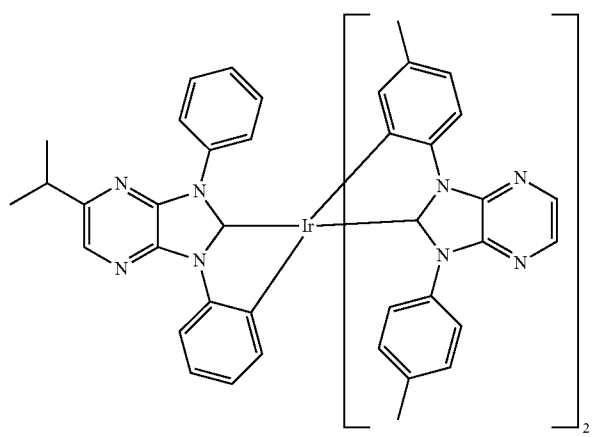
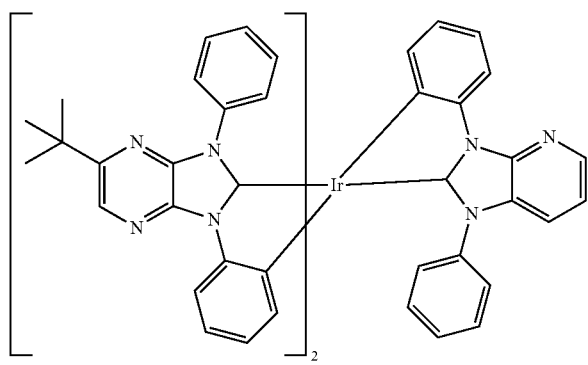
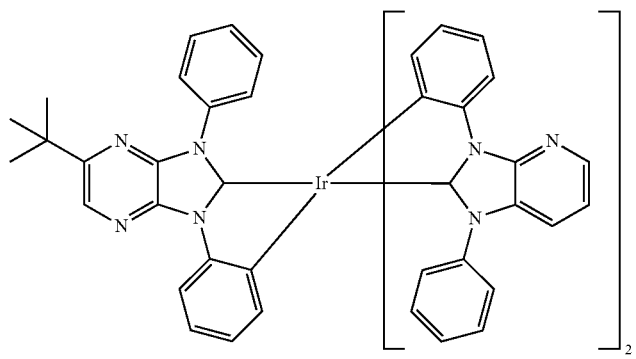

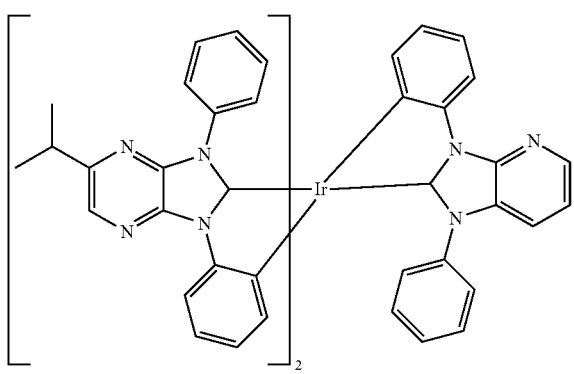
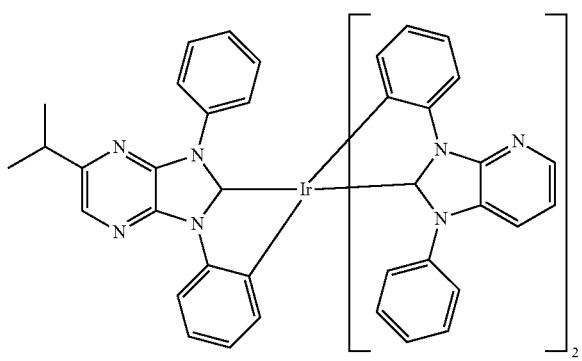
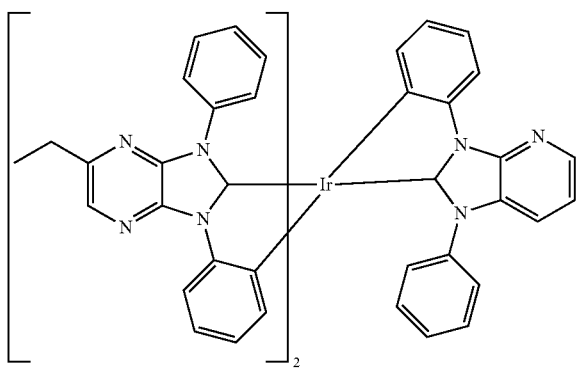
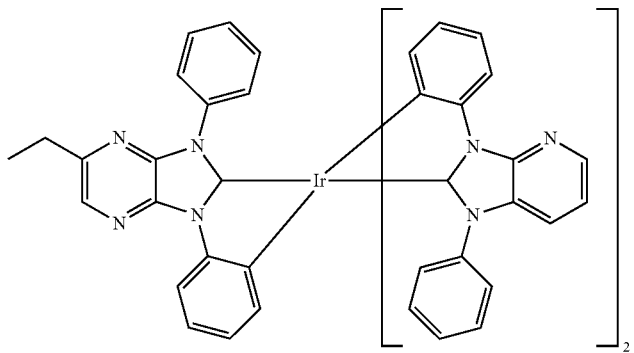

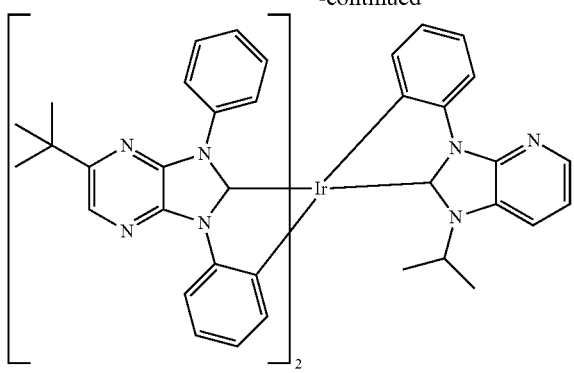
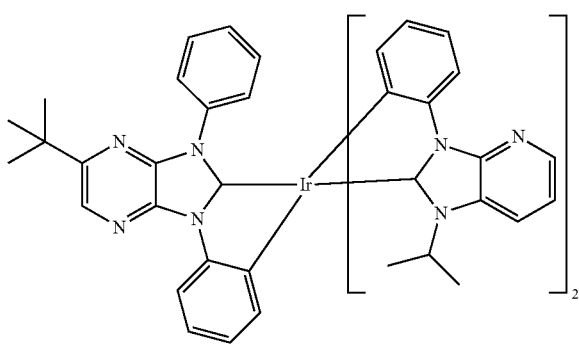
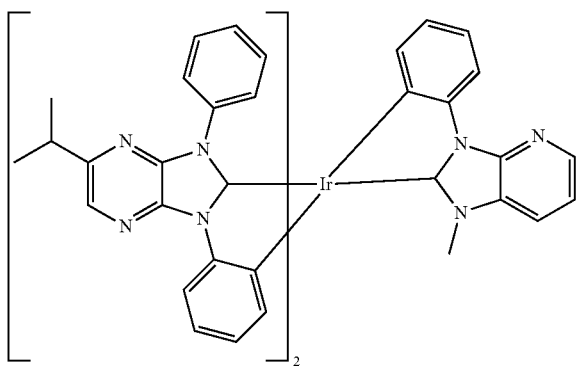
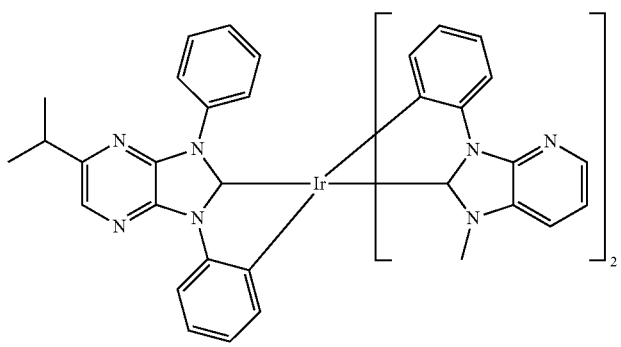

-continued
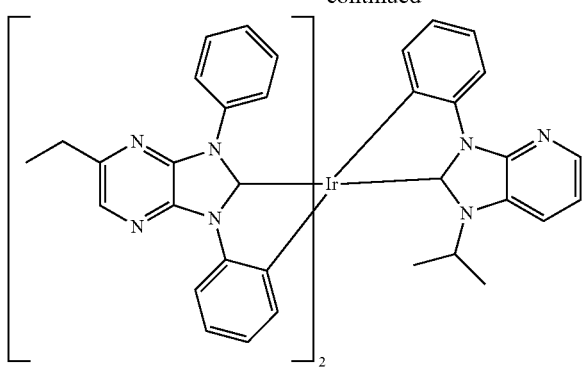
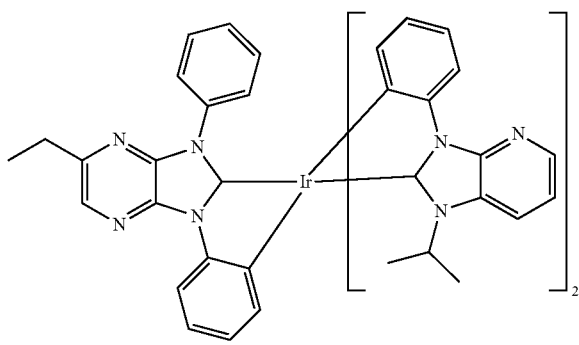
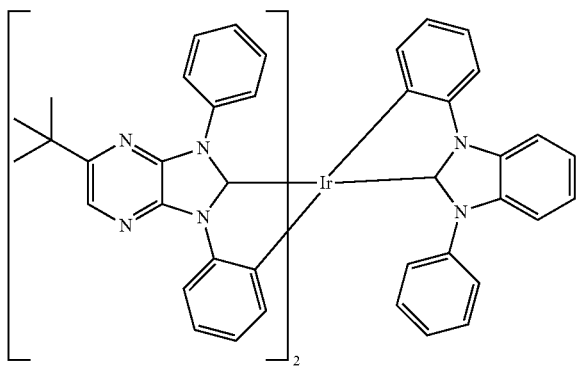
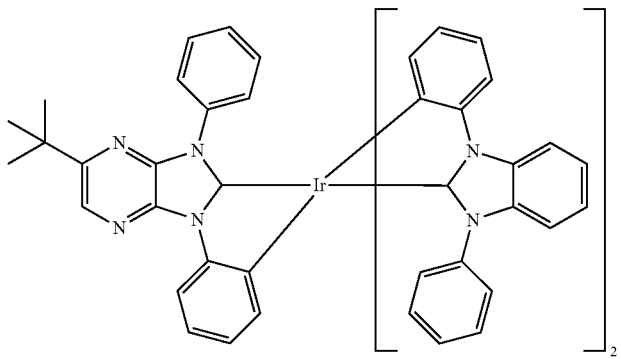

-continued
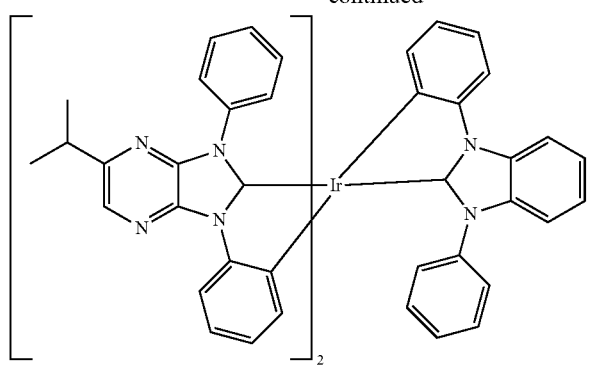
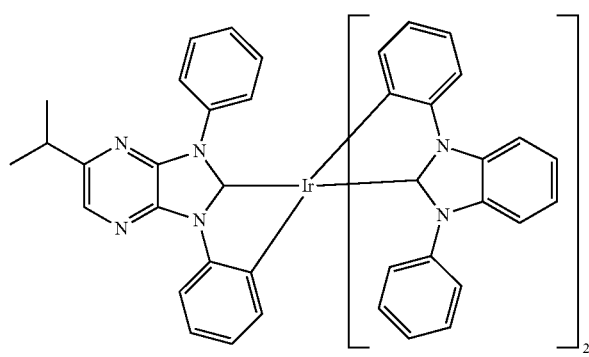
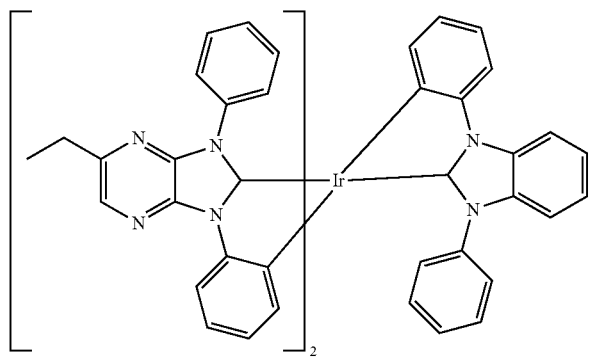
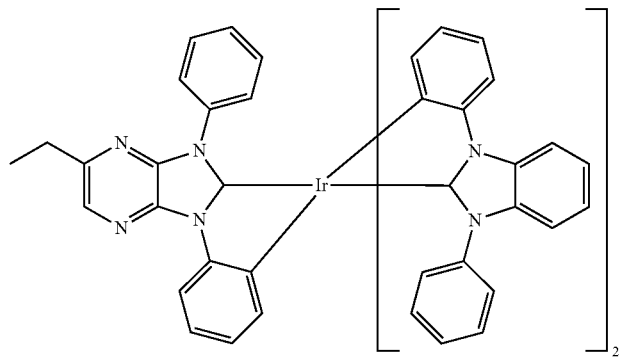

-continued
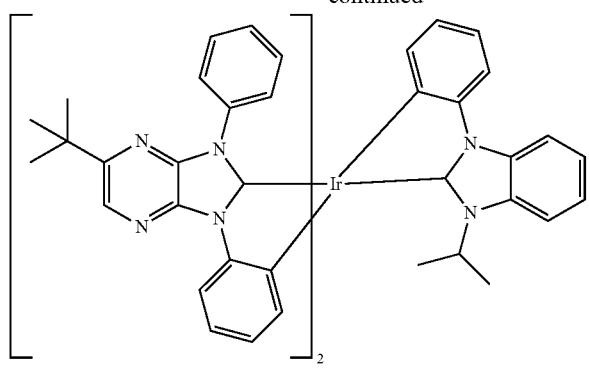
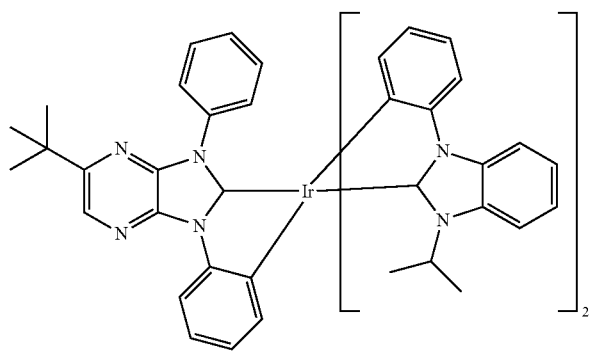
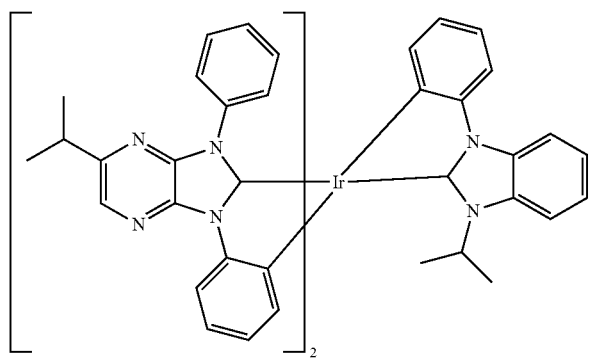
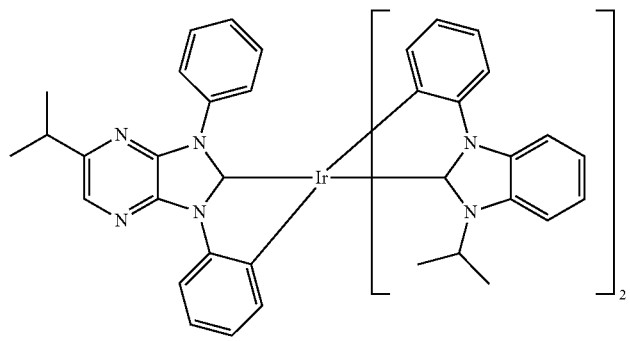

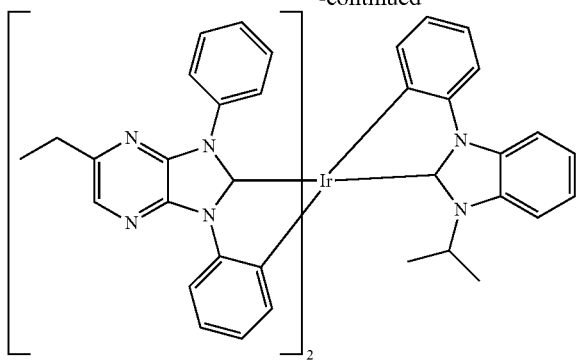
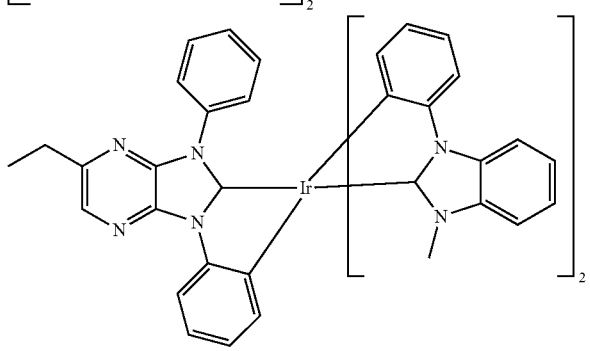
Further suitable complexes are the following complexes:
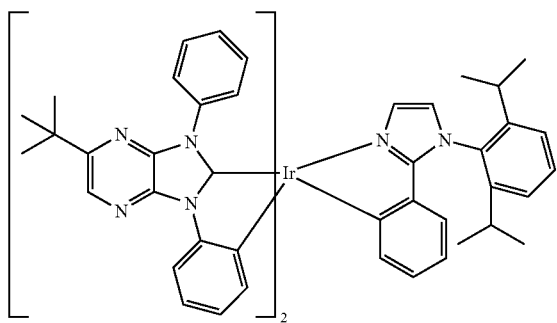
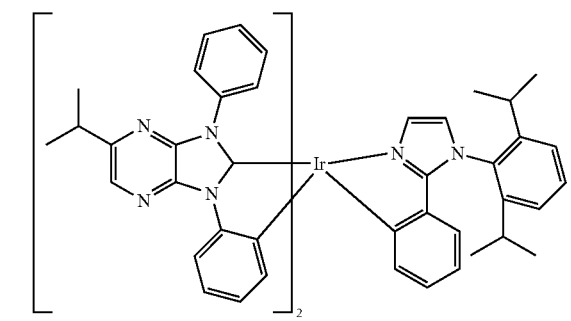
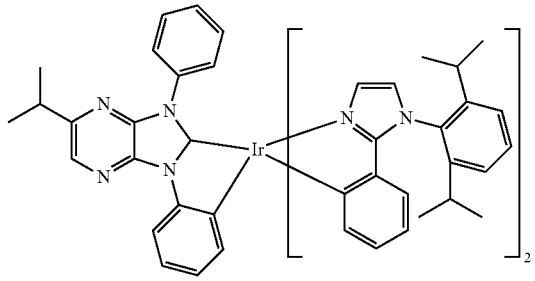
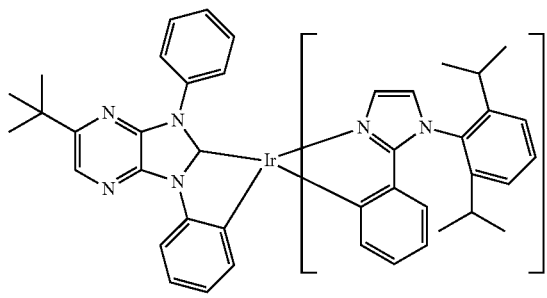
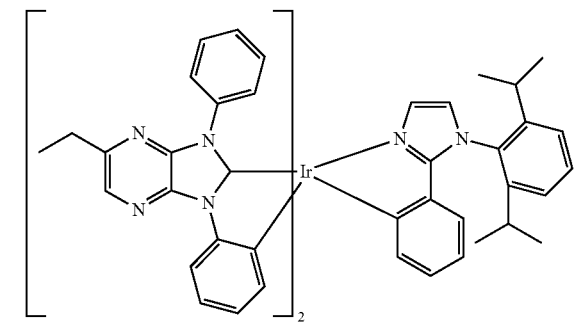

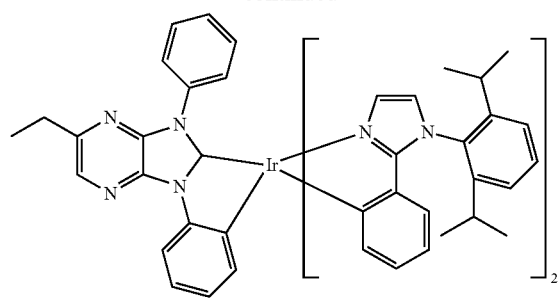
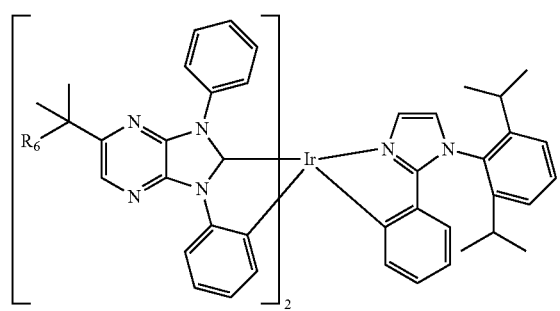
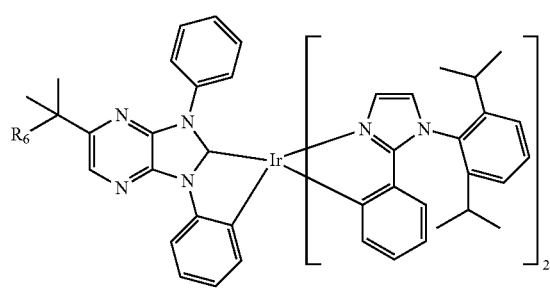
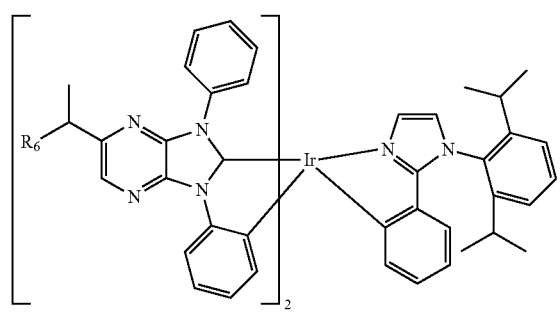
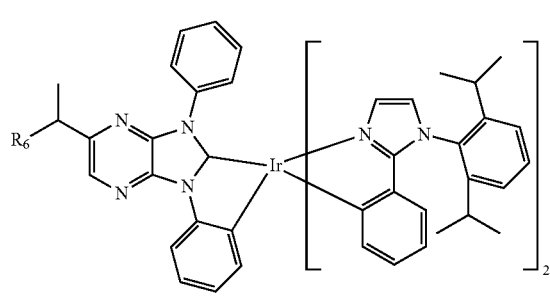
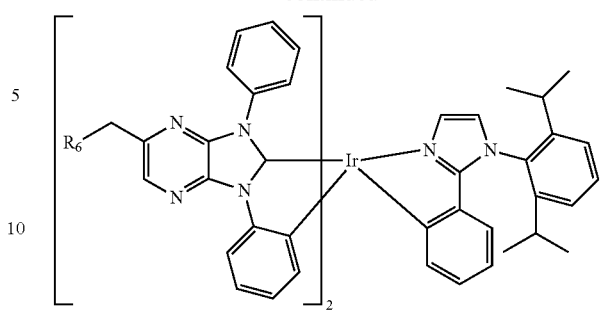
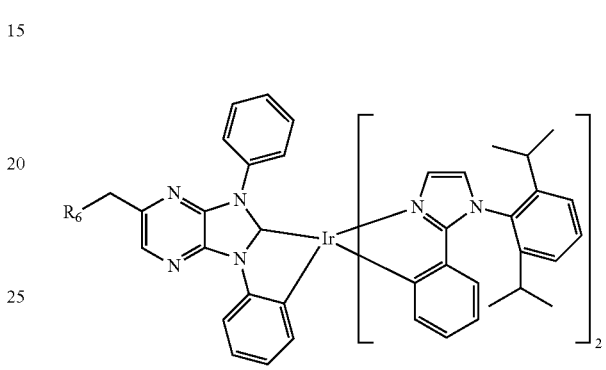
wherein $R^6$ is methyl, ethyl, n-propyl, iso-propyl, SiMe$_3$, SiEt$_3$, SiPh$_3$, cyclopentyl or cyclohexyl.
Further examples for inventive Ir- and Pt-complexes are:
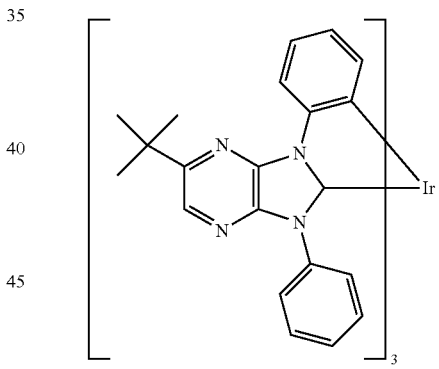
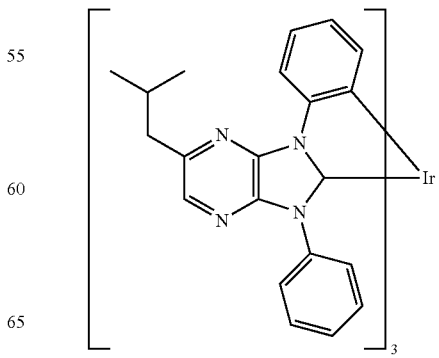

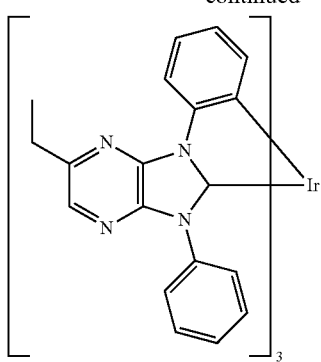
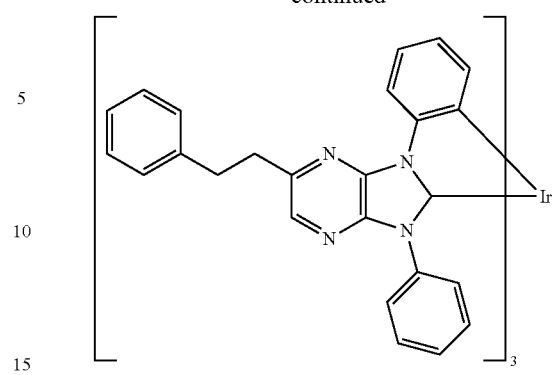
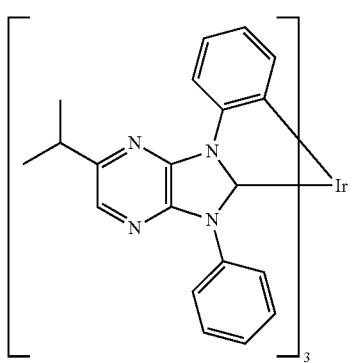
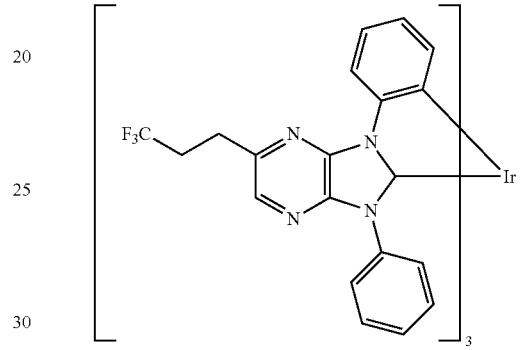
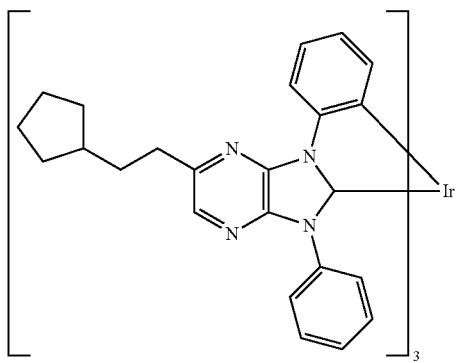
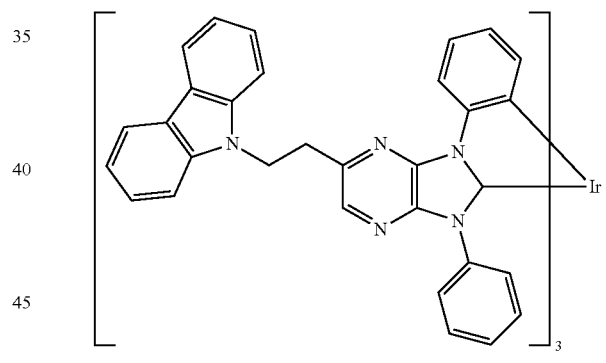
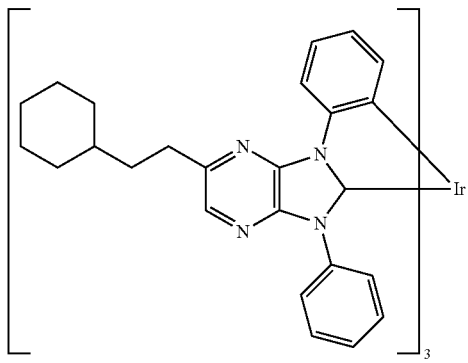
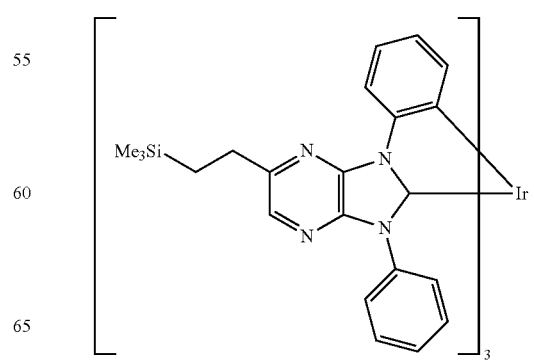

-continued
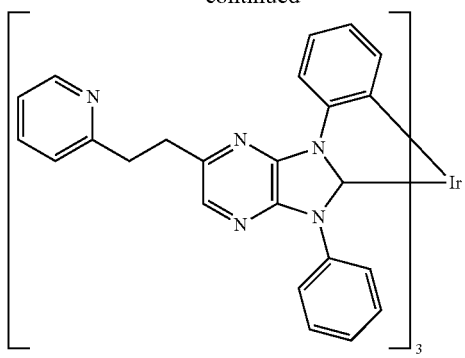
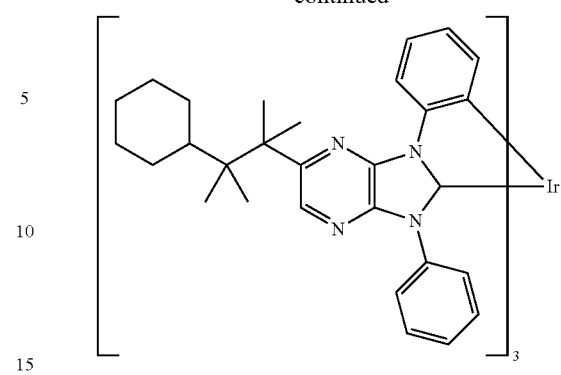
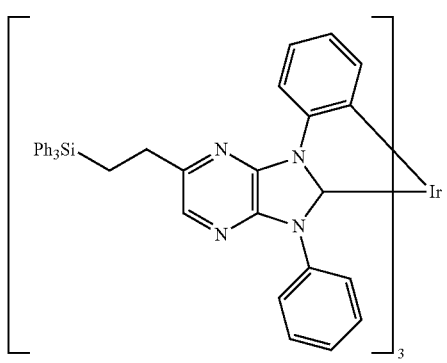
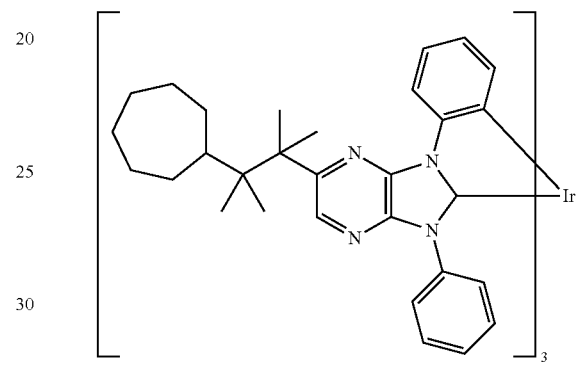
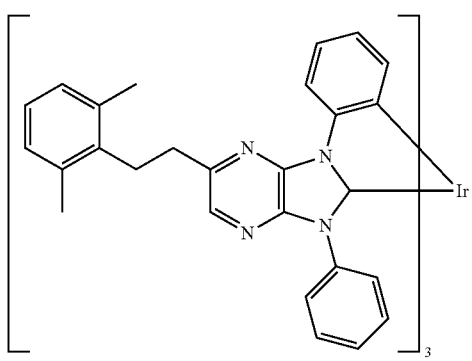
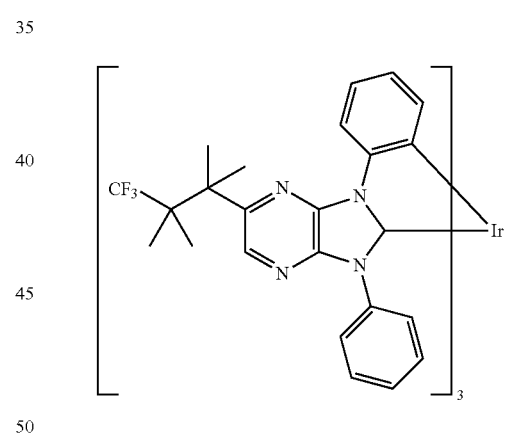
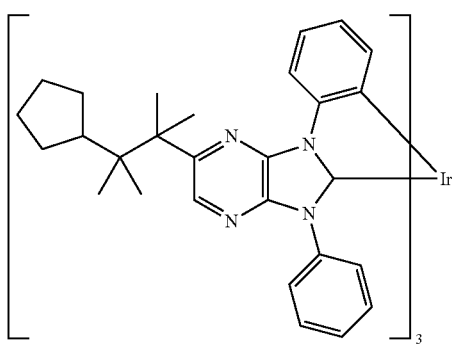
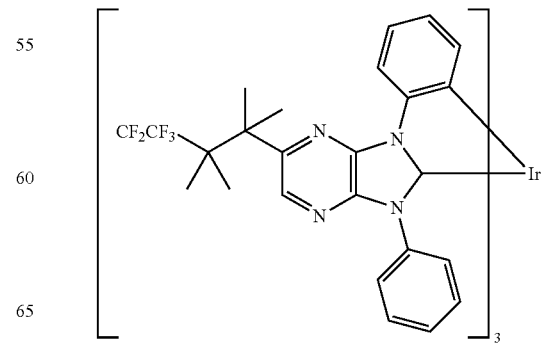

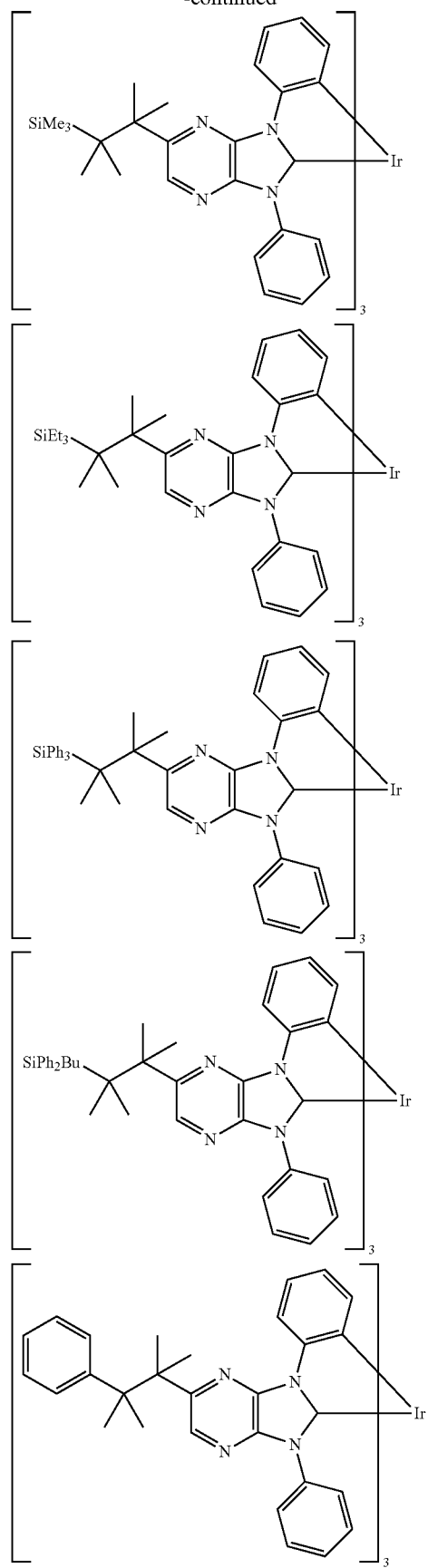
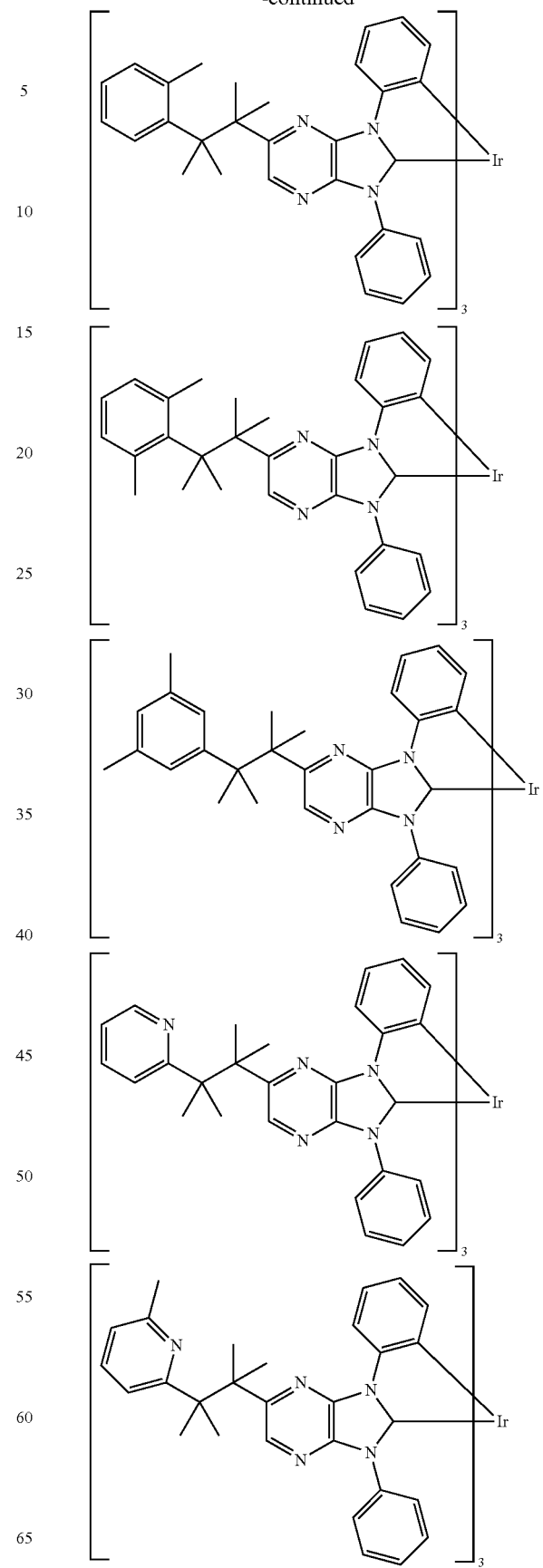

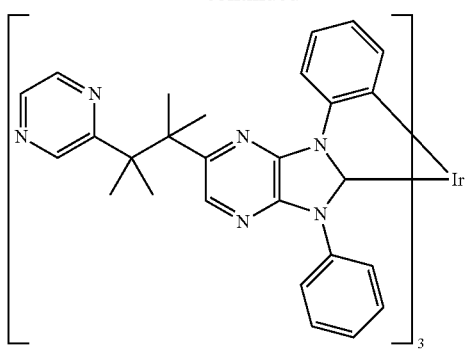
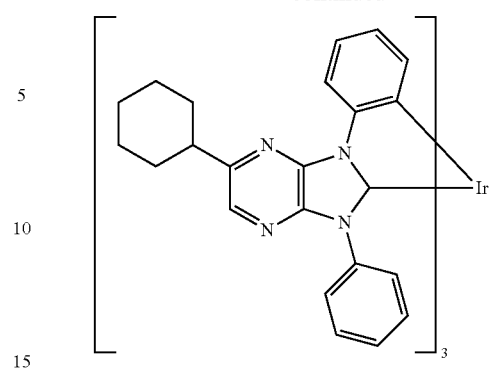
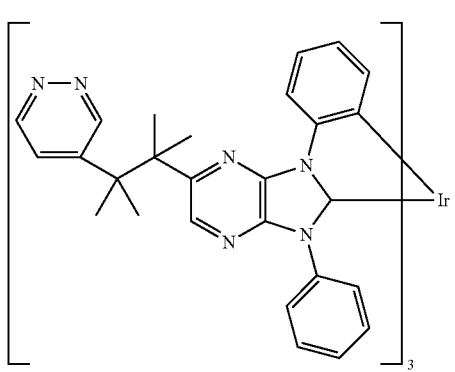
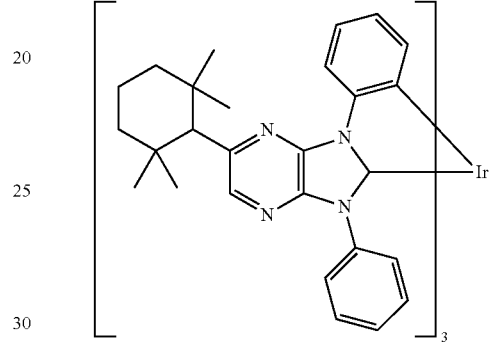
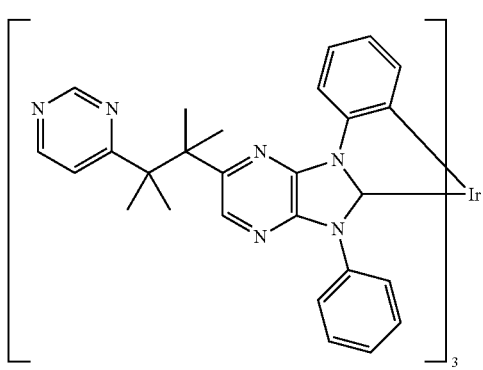
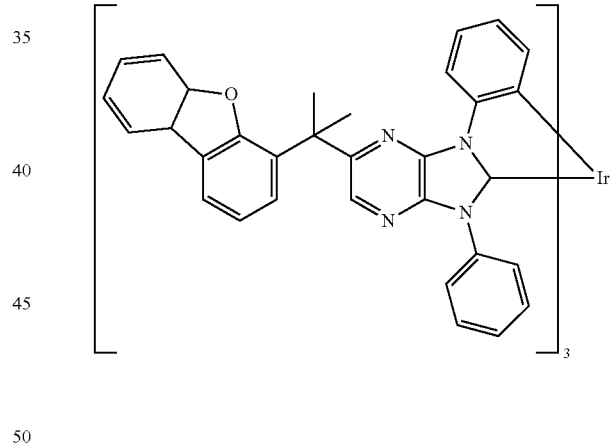
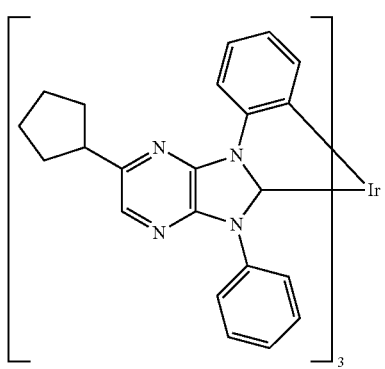
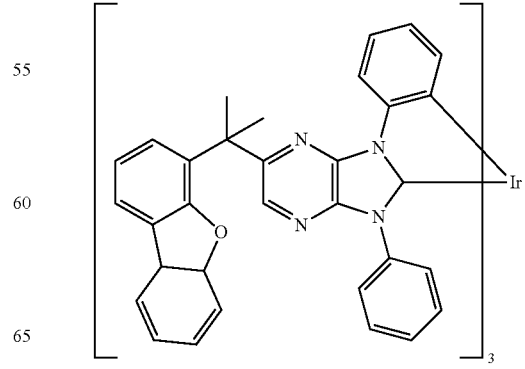

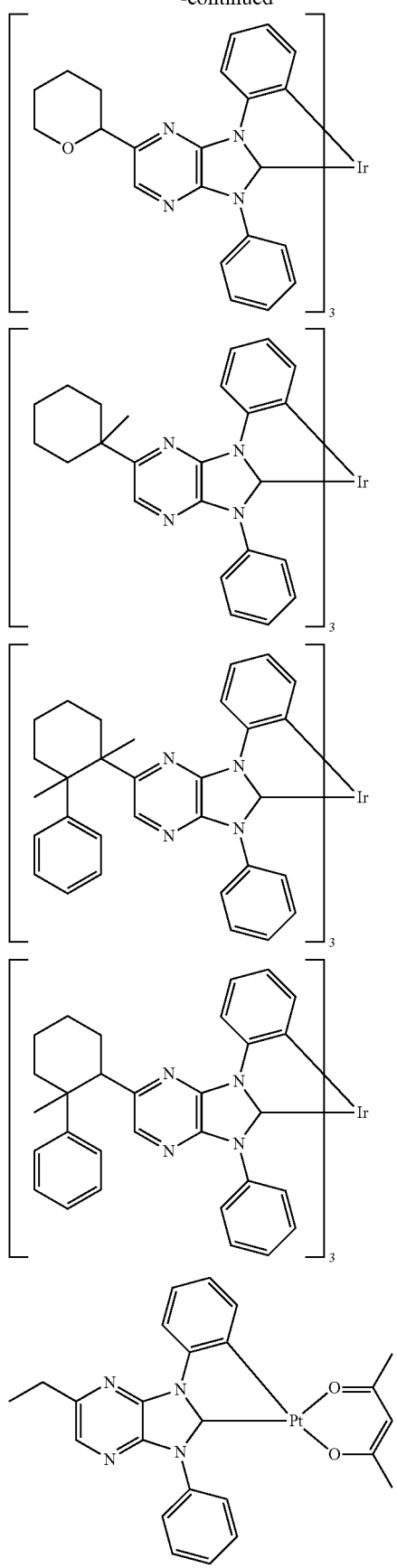
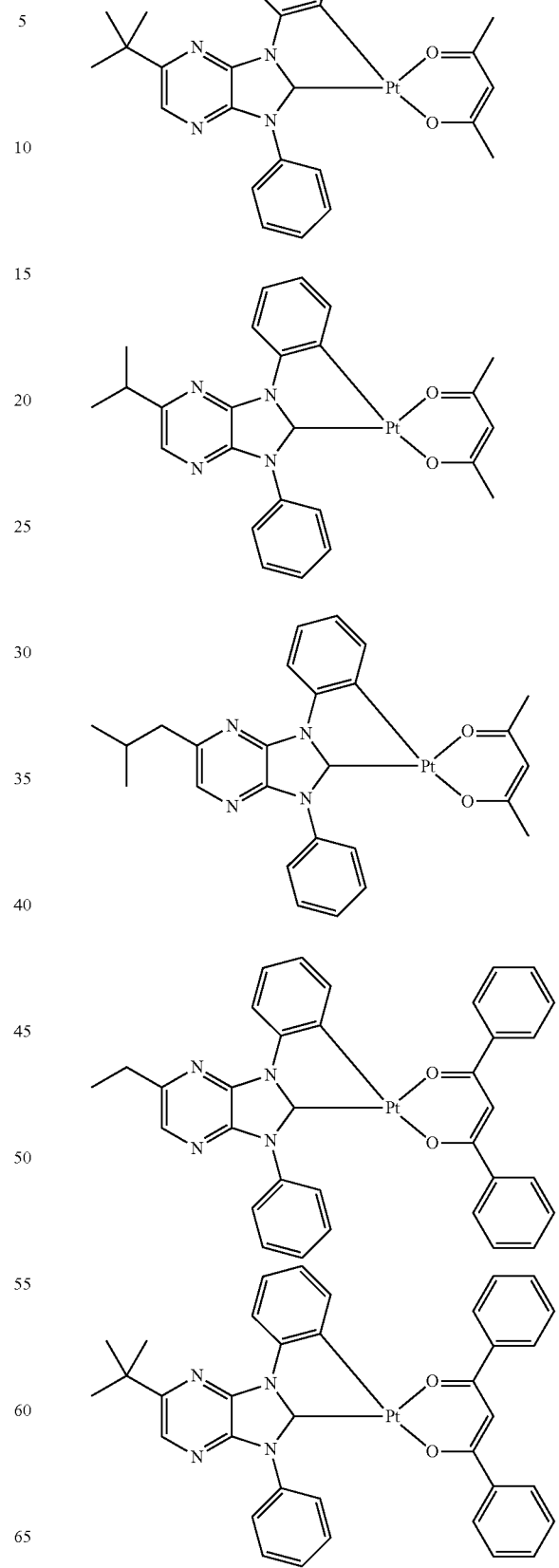

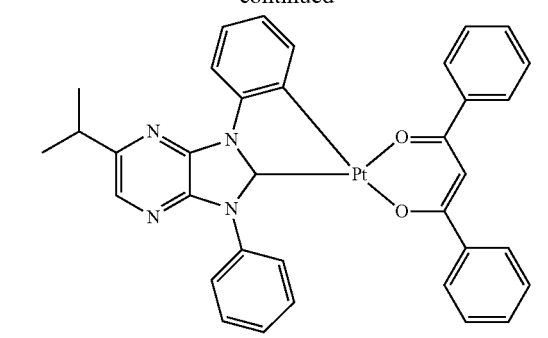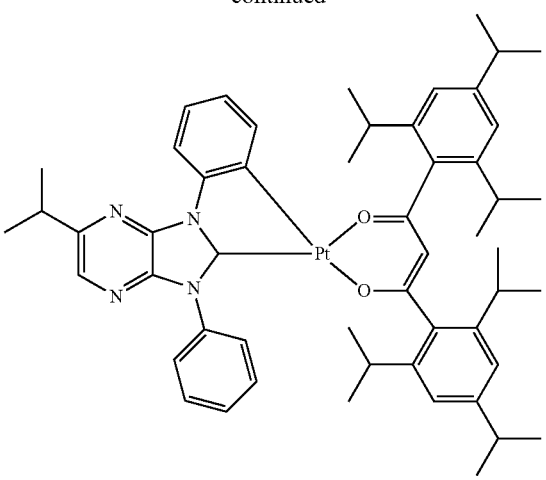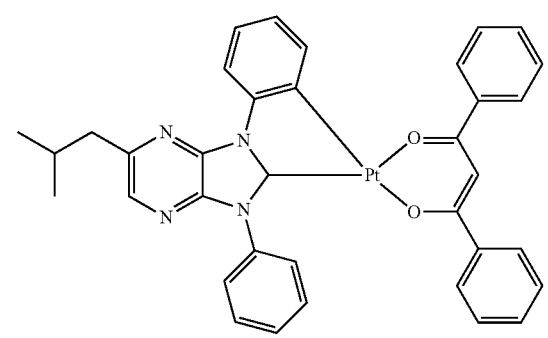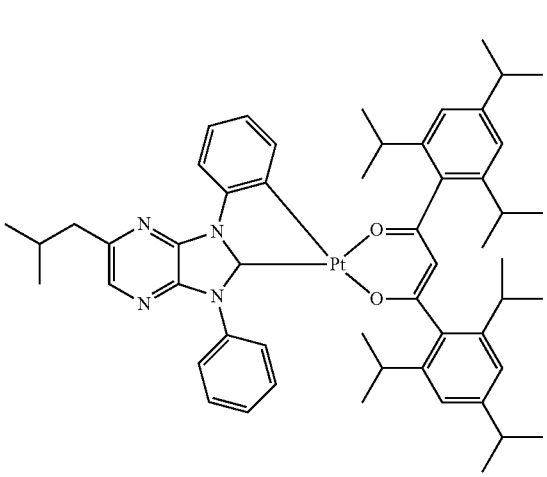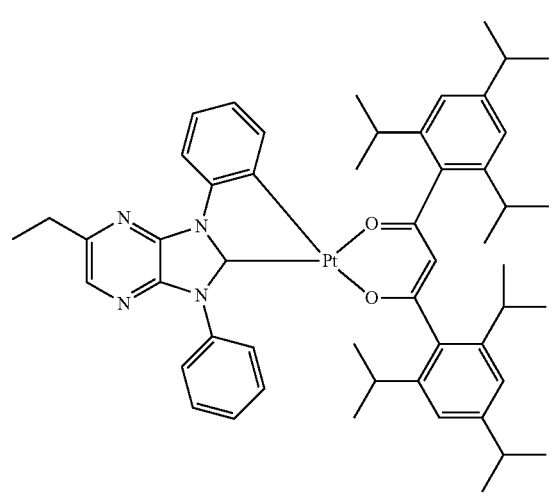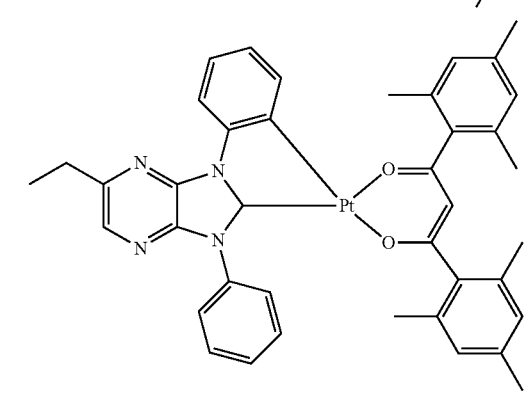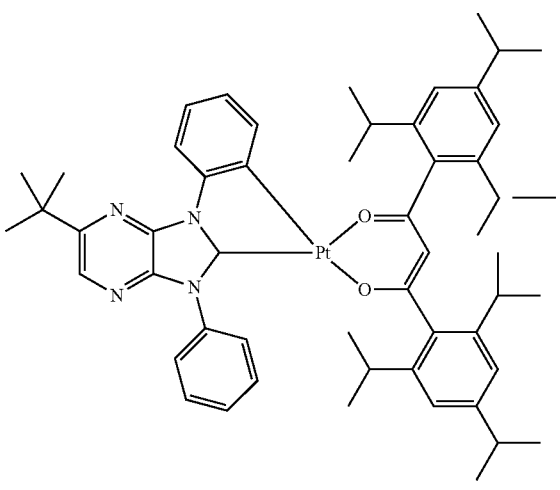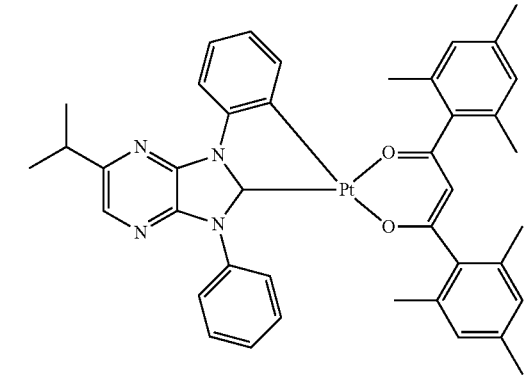

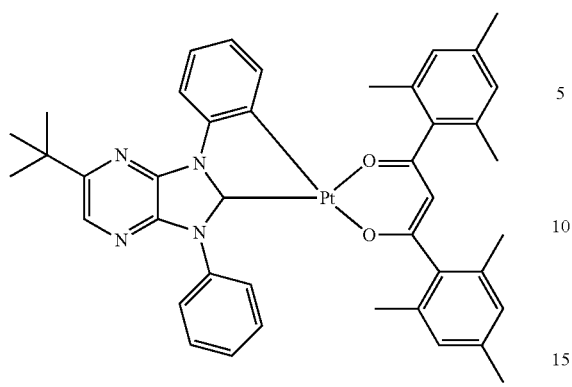
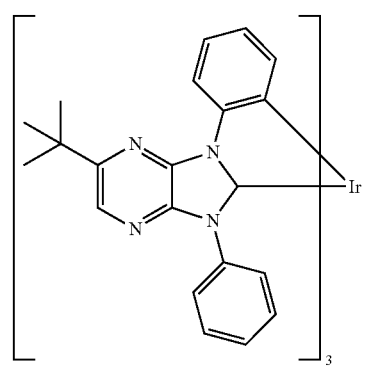
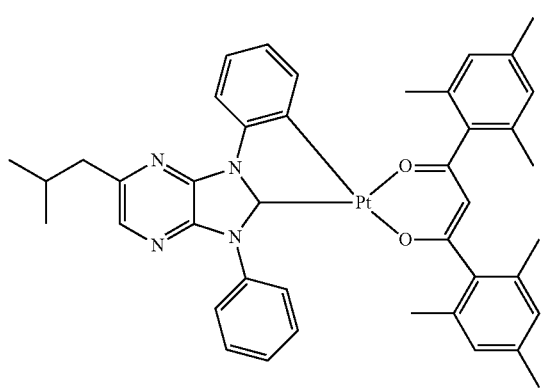
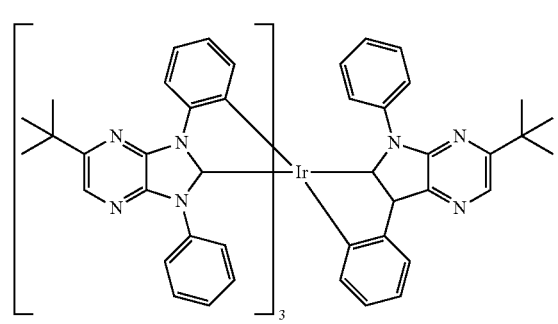
Particularly preferred inventive metal-carbene complexes comprising three bidentate ligands of formula (I) and/or (I') are the following complexes:
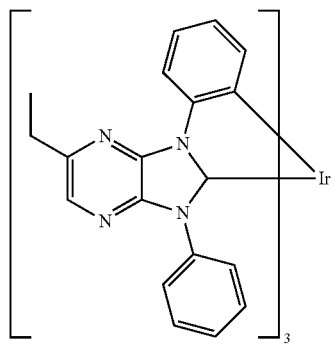
BE-1
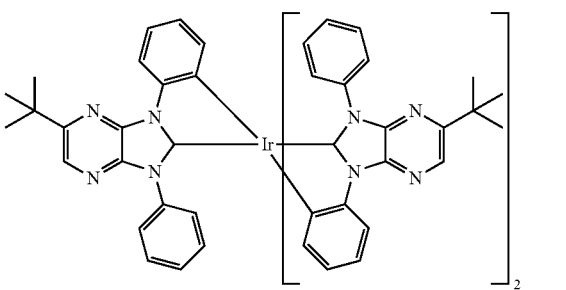
BE-5
and
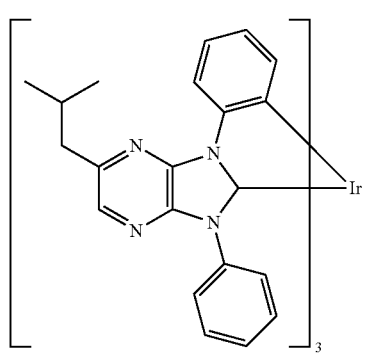
BE-2
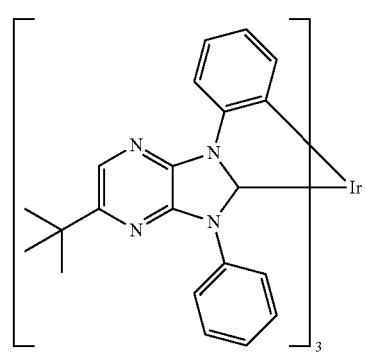
BE-6

BE-7

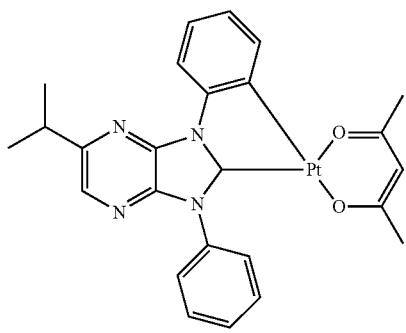

BE-8

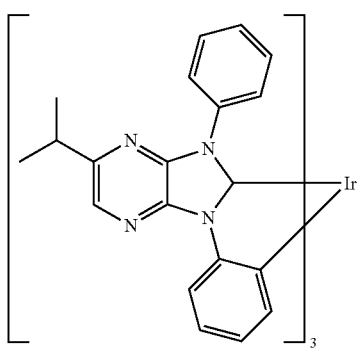

BE-9

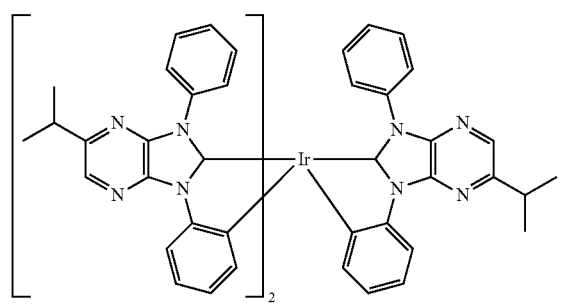

BE-10

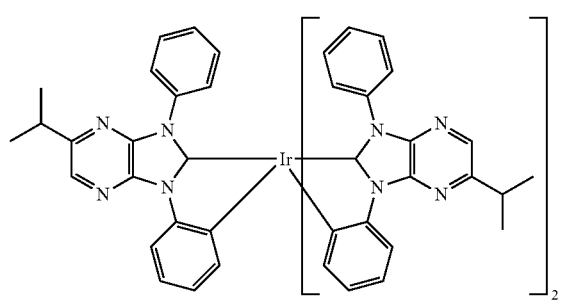

BE-11

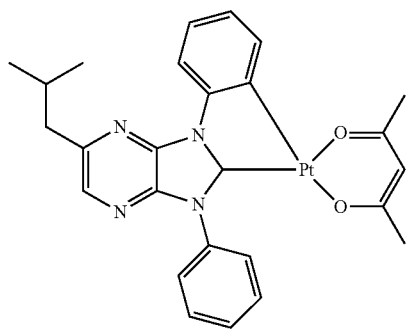 +

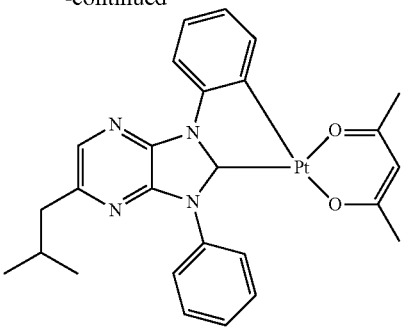

(isomeric mixture of cyclometallation isomers, shown are both cyclometallation isomers)

There exist cyclometallation isomers of the complexes mentioned above which are covered by the disclosure of the present invention, even if only one cyclometallation isomer is shown.

The present invention also relates to a process for preparing the inventive metal-carbene complexes comprising one, two or three, preferably three in the case of Ir and preferably one in the case of Pt, bidentate ligands of formula (I) and/or (I') by contacting suitable compounds comprising Ir or Pt with the appropriate ligands or ligand precursors.

In one embodiment of the process according to the invention, a suitable compound comprising iridium or platinum, preferably iridium, and appropriate carbene ligands, preferably in deprotonated form as the free carbene or in the form of a protected carbene, for example as the silver-carbene complex, are contacted.

The present invention therefore relates—in one embodiment—to a process according to the invention wherein the ligand precursor used is a corresponding Ag-carbene complex.

In a further preferred embodiment of the process according to the invention, the ligand precursors used are organic compounds which are reacted with suitable Ir or Pt comprising compounds. The carbene can be released from precursors of the carbene ligands by removing volatile substances, for example lower alcohols such as methanol or ethanol, for example at elevated temperature and/or under reduced pressure and/or using molecular sieves which bind the alcohol molecules eliminated. Corresponding processes are known to those skilled in the art.

The present invention also relates to the process according to the invention wherein the ligand precursor used is a compound of the general formula (IV)

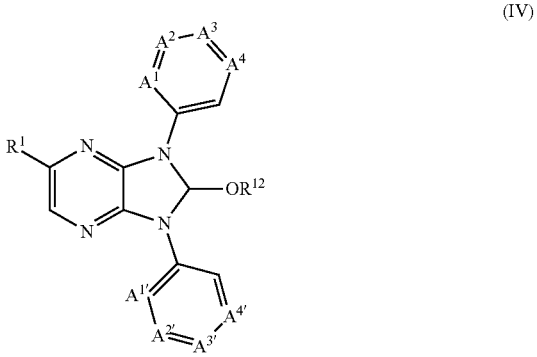

(IV)

wherein $R^1$, $A^1$, $A^2$, $A^3$, $A^4$, $A^{1'}$, $A^{2'}$, $A^{3'}$ and $A^{4'}$ are each as already defined above for the compounds of the general formula (I), and $R^{12}$ is defined as follows:

$R^{12}$ is independently $SiR^{13}R^{14}R^{15}$, aryl, heteroaryl, alkyl, cycloalkyl or heterocycloalkyl, $R^{13}$, $R^{14}$, $R^{15}$ are each independently aryl, heteroaryl, alkyl, cycloalkyl or heterocycloalkyl.

The definitions of aryl, heteroaryl, alkyl, cycloalkyl and heterocycloalkyl have been specified above.

In a particularly preferred embodiment, $R^{12}$ is alkyl, especially $C_1$-$C_{20}$-alkyl, preferably $C_1$-$C_{10}$-alkyl, more preferably $C_1$-$C_8$-alkyl, for example methyl, ethyl, propyl such as n-propyl, isopropyl, butyl such as n-butyl, isobutyl, tert-butyl, pentyl, hexyl, heptyl or octyl.

$R^{12}$ in the compound of the general formula (IV) is most preferably methyl or ethyl.

Compounds of the general formula (IV) are generally obtainable by processes known to those skilled in the art. Compounds of the general formula (IV) can be obtained for example by reacting compounds of the general formula (Va)

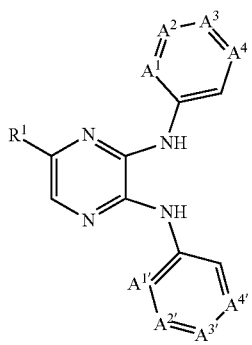

(Va)

or the corresponding Cl or $BF_4$ salt of formula (Vb)

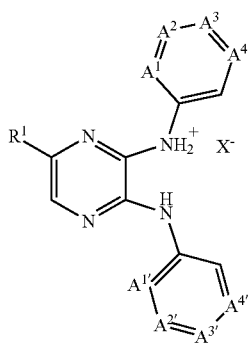

(Vb)

wherein X is Cl⁻ or $BF_4^-$,
with compounds of the general formula (VI)

$HC(OR^{12})_3$ (VI), or by reacting compounds of the general formula (V) in a first step with Vilsmeier reagent ((chloromethylene)dimethylammonium chloride) and a sodium salt selected from $NaBF_4$, NaCl, NaBr or NaI to obtain a compound of formula (Vc)

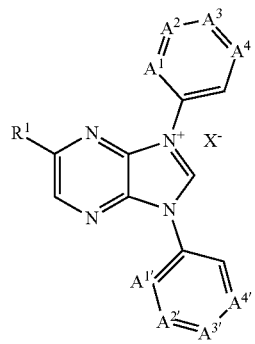

(VC)

wherein X⁻ is $BF_4^-$, Cl⁻, Br⁻ or I⁻ and in a second step with $R^{12}OH$ or $M''OR^{12}$, wherein M'' is an alkali metal salt, preferably Na, and where $R^1$, $A^1$, $A^2$, $A^3$, $A^4$, $A^{1'}$, $A^{2'}$, $A^{3'}$, $A^{4'}$ and $R^{12}$ are each as already defined above for the compounds of the general formula (IV) or for the metal-carbene complexes, wherein the metal is Ir or Pt, comprising one, two or three bidentate ligands of formula (I) and/or (I').

This preparation of the compounds of the general formula (IV) can be effected in the presence or in the absence of a solvent. Suitable solvents are specified below. In one preferred embodiment, the compounds of the general formula (IV) are prepared in substance, or the compound of the general formula (VI) is added in an excess, such that it functions as a solvent.

Compounds of the general formulae (V) and (VI) are commercially available and/or obtainable by processes known to those skilled in the art; for example, compounds of the general formula (V) are obtainable by reacting the appropriate chlorides with the appropriate amines.

The compounds of the general formula (IV) are prepared generally at a temperature of 10 to 150° C., preferably 40 to 120° C., more preferably 60 to 110° C.

The reaction time is generally 2 to 48 hours, preferably 6 to 24 hours, more preferably 8 to 16 hours.

After the reaction has ended, the desired product can be isolated and purified by customary processes known to those skilled in the art, for example filtration, recrystallization, column chromatography, etc.

Appropriate compounds, especially complexes, comprising Ir or Pt, preferably iridium, are known to those skilled in the art. Particularly suitable compounds comprising platinum or iridium comprise, for example, ligands such as halides, preferably chloride, 1,5-cyclooctadiene (COD), cyclooctene (COE), phosphines, cyanides, alkoxides, pseudohalides and/or alkyl.

Particularly preferred complexes comprising the appropriate metal, especially iridium, are selected from the group consisting of $[Ir(COD)Cl]_2$, $[Ir(COE)_2Cl]_2$ $IrCl_3 \times H_2O$, $Ir(acac)_3$, $Ir(COD)_2BF_4$, $Ir(COD)_2BARF$ (BARF=tetrakis[3,5-bis(trifluoromethyl)phenyl]borate)), $Pt(COD)Cl_2$, $Pt(acac)_2$, $[Pt(C_6H_{10})Cl_2]_2$, $K_2PtCl_6$, $Pt(pyridine)_2Cl_2$, $[PtMe_2(SMe_2)]_2$, $Pt(SMe_2)_2Cl_2$, $Pt(SEt_2)_2Cl_2$, $Pt(phenanthroline)Cl_2$, $Pt(NH_3)_2Cl_2$ and mixtures thereof.

The carbene ligand precursors are deprotonated, preferably before the reaction, for example, by basic compounds known to those skilled in the art, for example basic metalates, basic metal acetates, acetylacetonates or alkoxides, or bases such as $KO^tBu$, $NaO^tBu$, $LiO^tBu$, NaH, silylamides, $Ag_2O$ and phosphazene bases. Particular preference is given to deprotonating with Ag$_2$O to obtain the corresponding Ag-carbene, which is reacted with the compound comprising M to give the inventive complexes.

Particularly preferably, the carbene can be released from precursors of the carbene ligands by removing volatile substances, for example lower alcohols.

The process according to the invention for preparing the metal-carbene complexes, wherein the metal is Ir or Pt, comprising one, two or three bidentate ligands of formula (I) and/or (I') according to the present invention using the compounds of the general formula (IV) has the advantage that the compounds of the general formula (IV) are stable intermediates which can be handled readily and can be isolated under standard laboratory conditions. In addition, the compounds of the general formula (IV) are soluble in customary organic solvents, such that the preparation of the inventive metal-carbene complexes, wherein the metal is Ir or Pt, comprising one, two or three bidentate ligands of formula (I) and/or (I') in homogeneous solution is possible, such that a workup of the desired product, i.e. of the metal-carbene complexes, wherein the metal is Ir or Pt, comprising one, two or three bidentate ligands of formula (I) and/or (I') is more readily possible, for example for isolation and/or purification.

The contacting is preferably effected in a solvent. Suitable solvents are known per se to those skilled in the art and are preferably selected from the group consisting of aromatic or aliphatic solvents, for example benzene, toluene, xylene or mesitylene, cyclic or acyclic ethers, for example dioxane or THF, alcohols, esters, amides, ketones, nitriles, halogenated compounds and mixtures thereof. Particularly preferred solvents are toluene, xylenes, mesitylene and dioxane.

The molar ratio of metal-noncarbene complex used to carbene ligand precursor used is generally 1:10 to 10:1, preferably 1:1 to 1:6, more preferably 1:2 to 1:5.

The contacting is generally effected at a temperature of 20 to 200° C., preferably 50 to 150° C., more preferably 60 to 150° C.

The reaction time depends on the desired carbene complex and is generally 0.02 to 50 hours, preferably 0.1 to 24 hours, more preferably 1 to 24 hours.

The metal-carbene complexes, wherein the metal is Ir or Pt, comprising one, two or three bidentate ligands of formula (I) and/or (I') obtained after the reaction can optionally be purified by processes known to those skilled in the art, for example washing, crystallization or chromatography, and optionally isomerized under conditions likewise known to those skilled in the art, for example with acid mediation, thermally or photochemically.

Suitable processes for preparing the metal-carbene complex comprising one, two or three, preferably three, bidentate ligands of formula (I) and/or (I'), especially suitable processes for preparing the inventive complexes of formulae (II), (II') and (II"), wherein at least one ligand L is present (o or o' are 1 or 2), are for example mentioned in WO 2011/073149 A1.

The resulting complexes may yield different isomers that can be separated or converted into a form with a major isomer by isomerization of the mixture.

Metal-Carbene Complex Comprising One, Two or Three, Preferably Three, Bidentate Ligands of Formula (I) and/or (I') as Emitter Material According to the present invention, the metal-carbene complex comprising one, two or three, preferably three, bidentate ligands of formula (I) and/or (I') are employed in an organic electronic device, preferably in an OLED. More preferably, the metal-carbene complex comprising one, two or three, preferably three, bidentate ligands of formula (I) and/or (I') are employed as emitter material, preferably as emitter material in the light-emitting layer of an OLED. Suitable OLEDs are known in the art and the preferred structures of suitable OLEDs are described above and—in more detail—below.

The metal-carbene complex comprising one, two or three, preferably three, bidentate ligands of formula (I) and/or (I') have an emission maximum ($\lambda_{max}$) of from 400 to 500 nm. Preferably, the emitter has an emission maximum (A), which of from 425 nm to 490 nm, more preferably of from 440 nm to 475 nm, preferably with a FWHM (full width at half maximum) of from 1 nm to 140 nm, more preferably of from 30 nm to 120 nm, most preferably of from 40 nm to 80 nm.

The metal-carbene complex comprising one, two or three, preferably three, bidentate ligands of formula (I) and/or (I') are characterized by a high color purity, especially in the blue region of the electromagnetic spectrum. The preferred CIE-y values of said metal-carbene complexes according to the present invention are <035, more preferably <0.30, most preferably <0.25. (CIE 1931 XYZ color space, created by the International Commission on Illumination (CIE)). The CIE x and y values (coordinates) are extracted from the spectra according to CIE 1931 as known by a person skilled in the art.

The metal-carbene complex comprising one, two or three, preferably three, bidentate ligands of formula (I) and/or (I') are preferably phosphorescence emitter showing emission of light by phosphorescence. However, this does not exclude that the phosphorescence emitter additionally shows emission of light by fluorescence.

The phosphorescence emitter show phosphorescence emission from triplet excited states, preferably at the operating temperatures of the OLED. Phosphorescence may be preceded by a transition from a triplet excited state to an intermediate non-triplet state from which the emissive decay occurs.

The emission decay time (intensity reduced to 1/e=0.367879441 times its initial value) of the luminescence emission of the metal-carbene complex comprising one, two or three, preferably three, bidentate ligands of formula (I) and/or (I') is preferably of from 0.5 to 20 micro seconds, more preferably of from 0.5 to 10 micro seconds, most preferably of from 0.5 to 4 micro seconds.

Further Emitter Materials

The metal-carbene complex comprising one, two or three, preferably three, bidentate ligands of formula (I) and/or (I') may be employed alone as the only emitter material or in a mixture with one or more metal-carbene complexes comprising one, two or three, preferably three, bidentate ligands of formula (I) and/or (I') and/or one or more further emitter materials, preferably in the light-emitting layer of an OLED. Suitable further emitter materials are known by a person skilled in the art.

Suitable Further Emitter Materials are for Example:

Phosphorescence emitter compounds based on metal complexes, and especially the complexes of the metals Ru, Rh, Ir, Pd and Pt, in particular the complexes of Ir Suitable metal complexes for use in the inventive organic electronic device, preferably in the OLEDs, are described, for example, in documents WO 02/60910 A1, US 2001/0015432 A1, US 2001/0019782 A1, US 2002/0055014 A1, US 2002/0024293 A1, US 2002/0048689 A1, EP 1 191 612 A2, EP 1 191 613 A2, EP 1 211 257 A2, US 2002/0094453 A1, WO 02/02714 A2, WO 00/70655 A2, WO 01/41512 A1, WO 02/15645 A1, WO 2005/019373 A2, WO 2005/113704 A2, WO 2006/115301 A1, WO 2006/067074 A1, WO 2006/

056418, WO 2006121811 A1, WO 2007095118 A2, WO 2007/115970, WO 2007/115981, WO 2008/000727, WO 2010/086089, WO 2012/121936 A2, US 2011/0057559, WO 2011/106344, US 2011/0233528 and WO 2011/157339, WO2008156879, WO2010068876, US20110233528, WO2012048266, WO2013031662, WO2013031794.

Further suitable metal complexes are the commercially available metal complexes tris(2-phenylpyridine)iridium (III), iridium(III) tris(2-(4-tolyl)pyridinato-N,$C^{2'}$), bis(2-phenylpyridine)(acetylacetonato)iridium(III), iridium(III) tris(1-phenylisoquinoline), iridium(III) bis(2,2'-benzothienyl)(pyridinato-N,$C^{3'}$)(acetylacetonate), tris(2-phenylquinoline)iridium(III), iridium(III) bis(2-(4,6-difluorophenyl)pyridinato-N,$C^{2'}$)picolinate, iridium(III) bis(1-phenylisoquinoline)(acetylacetonate), bis(2-phenylquinoline)(acetylacetonato)iridium(III), iridium(III) bis(dibenzo[f,h]quinoxaline)-(acetylacetonate), iridium(III) bis(2-methyldibenzo[f,h]quinoxaline)(acetylacetonate), bis[1-(9,9-dimethyl-9H-fluoren-2-yl)isoquinoline](acetylacetonato)iridium(III), bis(2-phenylbenzo-thiazolato)(acetylacetonato)iridium(III), bis(2-(9,9-dihexylfluorenyl)-1-pyridine)(acetyl-acetonato)iridium(III), bis(2-benzo[b]thiophen-2-ylpyridine)(acetylacetonato)iridium(III).

Preferred further phosphorescence emitters are carbene complexes. Carbene complexes which are suitable phosphorescent blue emitters are specified in the following publications: WO 2006/056418 A2, WO 2005/113704, WO 2007/115970, WO 2007/115981, WO 2008/000727, WO2009050281, WO2009050290, WO2011051404, US2011/057559 WO2011/073149, WO2012/121936A2, US2012/0305894A1, WO2012170571, WO2012170461, WO 2012170463, WO2006121811, WO2007095118, WO2008156879, WO2008156879, WO2010068876, US20110057559, WO2011106344, US20110233528, WO2012048266 and WO2012172482.

Preferably, the metal-carbene complex comprising one, two or three, preferably three, bidentate ligands of formula (I) and/or (I') is employed alone—as the only emitter material, preferably in the light-emitting layer of an OLED.

In the case that more than one emitter material is used, for example in a white OLED, 0.01 to 20% by weight, preferably 0.1 to 10% by weight, more preferably 0.1 to 2% by weight of a red emitter are employed, 5 to 40% by weight, preferably 10 to 30% by weight, more preferably 15 to 25% by weight of the metal-carbene complex according to the present invention as blue emitter are employed and 0.05 to 5% by weight, preferably 0.05 to 3% by weight, more preferably 0.1 to 1% by weight of a green emitter are employed. The residual amount to 100% in each emitter system is at least one host compound. Suitable host compounds for each emitter material are known to a person skilled in the art.

Host Material

The metal-carbene complex comprising one, two or three, preferably three, bidentate ligands of formula (I) and/or (I') or the mixture of emitter materials mentioned above may be employed, preferably in the light-emitting layer of an OLED, without further additional components or with one or more further components in addition to the emitter material. For example, a fluorescent dye may be present in the light-emitting layer of an OLED in order to alter the emission color of the emitter material. In addition—in a preferred embodiment—one or more host (matrix) materials can be used. This host material may be a polymer, for example poly(N-vinylcarbazole) or polysilane. The host material may, however, likewise be a small molecule, for example 4,4'-N,N'-dicarbazolebiphenyl (CDP=CBP) or tertiary aromatic amines, for example TCTA.

Suitable as host material are carbazole derivatives, for example 4,4'-bis(carbazol-9-yl)-2,2'-dimethylbiphenyl (CDBP), 4,4'-bis(carbazol-9-yl)biphenyl (CBP), 1,3-bis(N-carbazolyl)benzene (mCP), and the host materials specified in the following applications: WO2008/034758, WO2009/003919.

Further suitable host materials, which may be small molecules or (co)polymers of the small molecules mentioned, are specified in the following publications: WO2007108459 (H-1 to H-37), preferably H-20 to H-22 and H-32 to H-37, most preferably H-20, H-32, H-36, H-37, WO2008035571 A1 (Host 1 to Host 6), JP2010135467 (compounds 1 to 46 and Host-1 to Host-39 and Host-43), WO2009008100 compounds No. 1 to No. 67, preferably No. 3, No. 4, No. 7 to No. 12, No. 55, No. 59, No. 63 to No. 67, more preferably No. 4, No. 8 to No. 12, No. 55, No. 59, No. 64, No. 65, and No. 67, WO2009008099 compounds No. 1 to No. 110, WO2008140114 compounds 1-1 to 1-50, WO2008090912 compounds OC-7 to OC-36 and the polymers of Mo-42 to Mo-51, JP2008084913H-1 to H-70, WO2007077810 compounds 1 to 44, preferably 1, 2, 4-6, 8, 19-22, 26, 28-30, 32, 36, 39-44, WO201001830 the polymers of monomers 1-1 to 1-9, preferably of 1-3, 1-7, and 1-9, WO2008029729 the (polymers of) compounds 1-1 to 1-36, WO20100443342 HS-1 to HS-101 and BH-1 to BH-17, preferably BH-1 to BH-17, JP2009182298 the (co)polymers based on the monomers 1 to 75, JP2009170764, JP2009135183 the (co)polymers based on the monomers 1-14, WO2009063757 preferably the (co)polymers based on the monomers 1-1 to 1-26, WO2008146838 the compounds a-1 to a-43 and 1-1 to 1-46, JP2008207520 the (co)polymers based on the monomers 1-1 to 1-26, JP2008066569 the (co)polymers based on the monomers 1-1 to 1-16, WO2008029652 the (co)polymers based on the monomers 1-1 to 1-52, WO2007114244 the (co)polymers based on the monomers 1-1 to 1-18, JP2010040830 the compounds HA-1 to HA-20, HB-1 to HB-16, HC-1 to HC-23 and the (co)polymers based on the monomers HD-1 to HD-12, JP2009021336, WO2010090077 the compounds 1 to 55, WO2010079678 the compounds $H_1$ to $H_{42}$, WO2010077746, WO2010044342 the compounds HS-1 to HS-101 and Poly-1 to Poly-4, JP2010114180 the compounds PH-1 to PH-36, US2009284138 the compounds 1 to 111 and $H_1$ to $H_{71}$, WO2008072596 the compounds 1 to 45, JP2010021336 the compounds H-1 to $H_{38}$, preferably H-1, WO2010004877 the compounds H-1 to H-60, JP2009267255 the compounds 1-1 to 1-105, WO2009104488 the compounds 1-1 to 1-38, WO2009086028, US2009153034, US2009134784, WO2009084413 the compounds 2-1 to 2-56, JP2009114369 the compounds 2-1 to 2-40, JP2009114370 the compounds 1 to 67, WO2009060742 the compounds 2-1 to 2-56, WO2009060757 the compounds 1-1 to 1-76, WO2009060780 the compounds 1-1 to 1-70, WO2009060779 the compounds 1-1 to 1-42, WO2008156105 the compounds 1 to 54, JP2009059767 the compounds 1 to 20, JP2008074939 the compounds 1 to 256, JP2008021687 the compounds 1 to 50, WO2007119816 the compounds 1 to 37, WO2010087222 the compounds H-1 to H-31, WO2010095564 the compounds HOST-1 to HOST-61, WO2007108362, WO2009003898, WO2009003919, WO2010040777, US2007224446, WO06128800, WO2012014621, WO2012105310, WO2012/130709, European patent applications EP12175635.7 and EP12185230.5 and EP12191408.9 (in particular page 25 to 29 of EP12191408.9), WO2012048266, WO2012145173, WO2012162325, and EP2551932.

In a particularly preferred embodiment, one or more compounds of the general formula (IX) specified hereinafter are used as host material

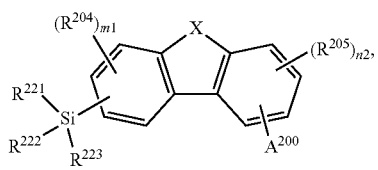
(IX)

wherein
X is NR, S, O or PR;
R is aryl, heteroaryl, alkyl, cycloalkyl, or heterocycloalkyl;
$A^{200}$ is —$NR^{206}R^{207}$, —$P(O)R^{208}R^{209}$, —$PR^{210}R^{211}$, —$S(O)_2R^{212}$, —$S(O)R^{213}$, —$SR^{214}$, or —$OR^{215}$; $R^{221}$, $R^{222}$ and $R^{223}$ are independently of each other aryl, heteroaryl, alkyl, cycloalkyl, or heterocycloalkyl, wherein at least on of the groups $R^{221}$, $R^{222}$, or $R^{223}$ is aryl, or heteroaryl;
$R^{204}$ and $R^{205}$ are independently of each other alkyl, cycloalkyl, heterocycloalkyl, aryl, heteroaryl, a group $A^{200}$, or a group having donor, or acceptor characteristics;
n2 and m1 are independently of each other 0, 1, 2, or 3;
$R^{206}$, $R^{207}$ form together with the nitrogen atom a cyclic residue having 3 to 10 ring atoms, which can be unsubstituted, or which can be substituted with one, or more substituents selected from alkyl, cycloalkyl, heterocycloalkyl, aryl, heteroaryl and a group having donor, or acceptor characteristics; and/or which can be annulated with one, or more further cyclic residues having 3 to 10 ring atoms, wherein the annulated residues can be unsubstituted, or can be substituted with one, or more substituents selected from alkyl, cycloalkyl, heterocycloalkyl, aryl, heteroaryl and a group having donor, or acceptor characteristics; and
$R^{208}$, $R^{209}$, $R^{210}$, $R^{211}$, $R^{212}$, $R^{213}$, $R^{214}$ and $R^{215}$ are independently of each other aryl, heteroaryl, alkyl, cycloalkyl, or heterocycloalkyl.

Compounds of formula (IX) and their preparation processes, such as, for example,

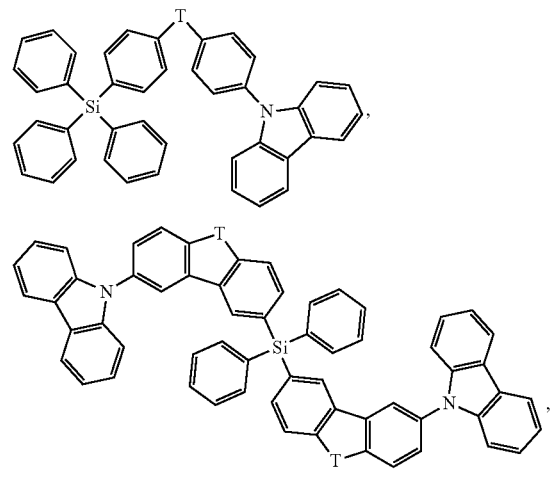

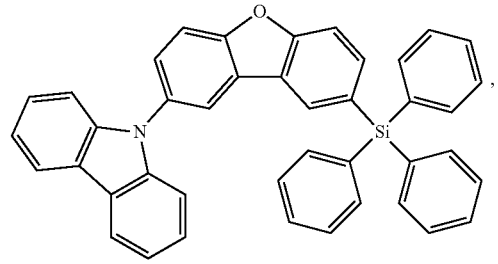
(SH-4)

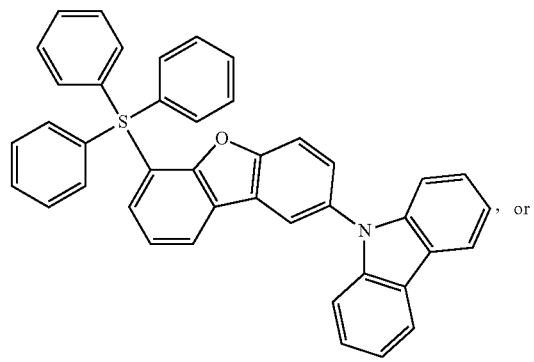
(SH-5), or

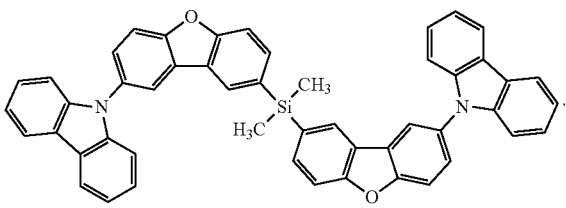
(SH-6)

are described in WO 2010/079051 A1 (in particular pages on 19 to 26 and in tables on pages 27 to 34, pages 35 to 37 and pages 42 to 43).

Additional host materials on basis of dibenzofurane are, for example, described in US 2009066226, EP1 885 818 B1, EP 1 970 976, EP 1 998 388 and EP 2 034 538. Examples of particularly preferred host materials are shown below:

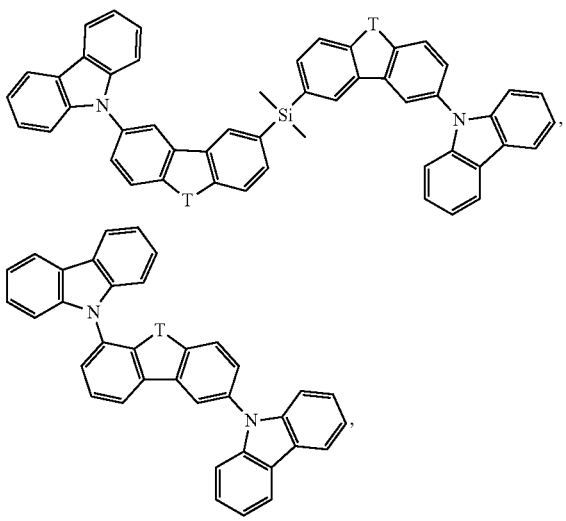

-continued
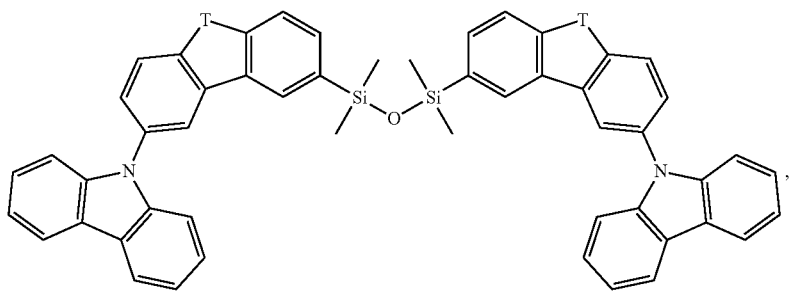
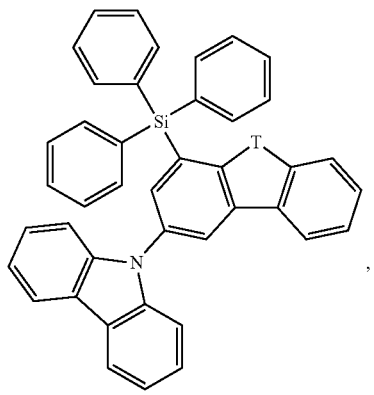
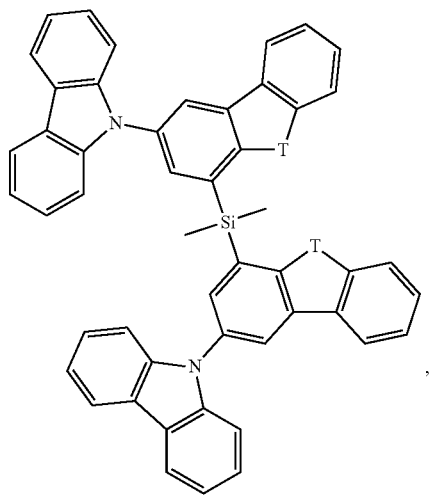
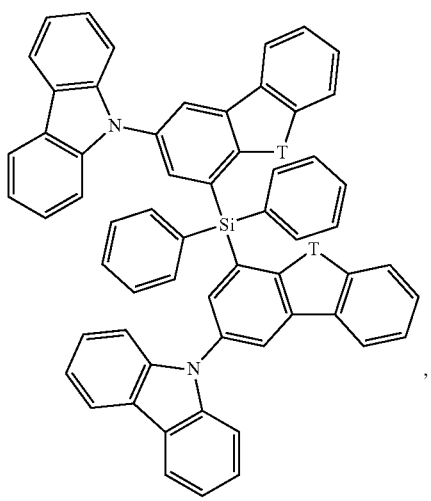
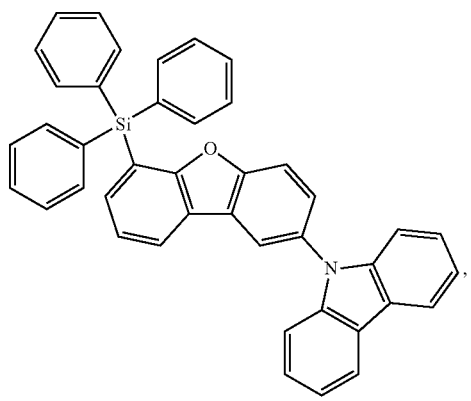
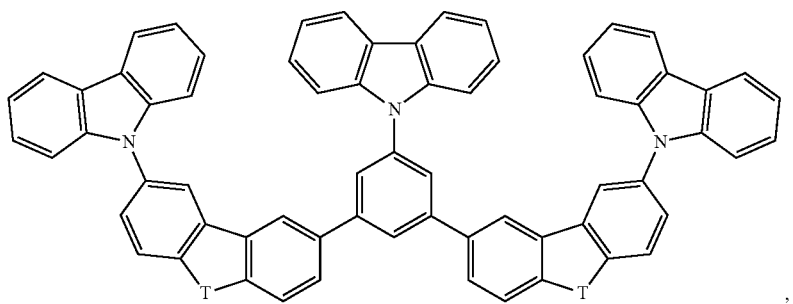

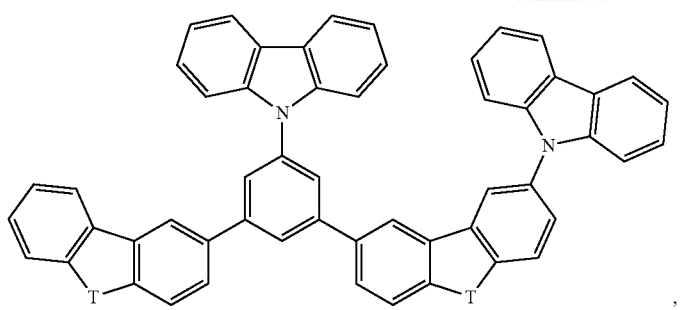
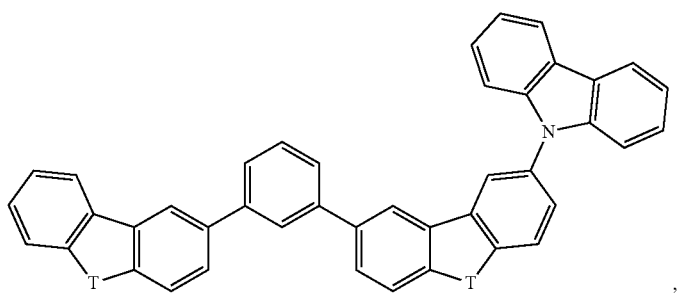
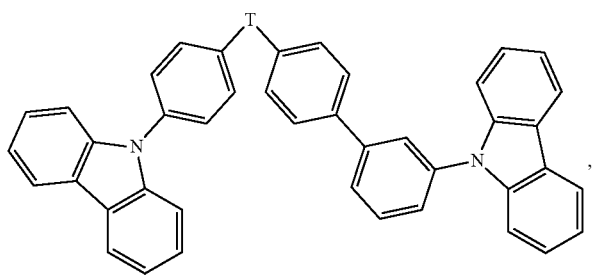
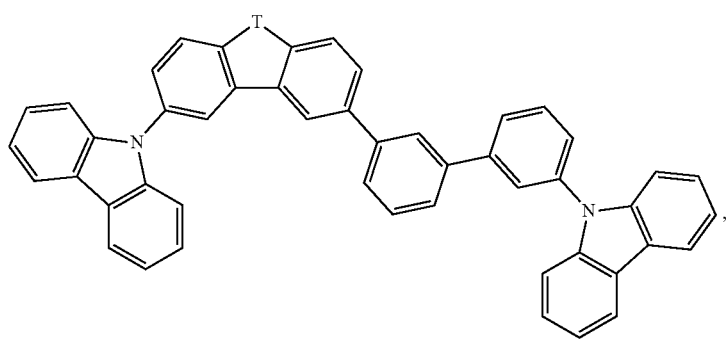
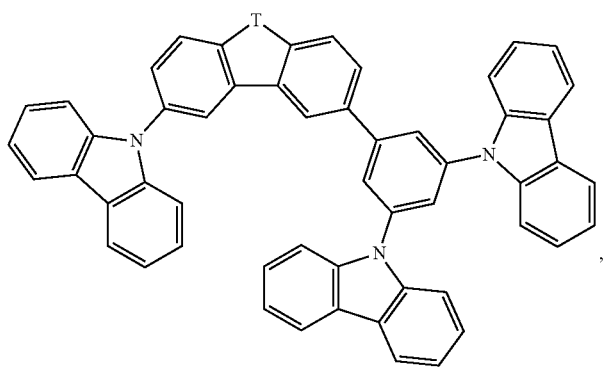

-continued
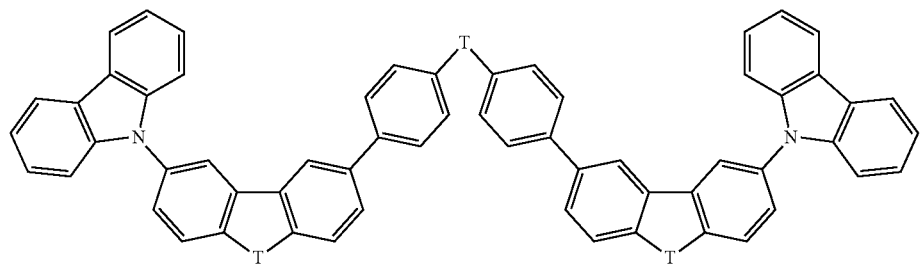
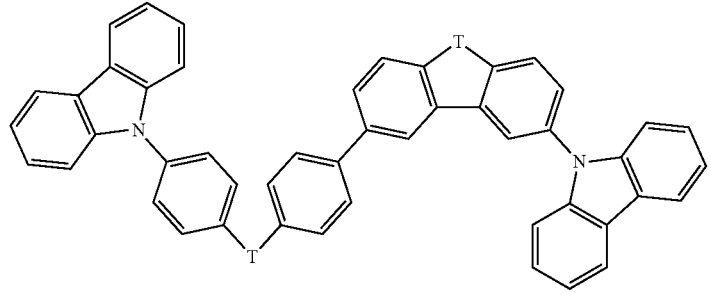
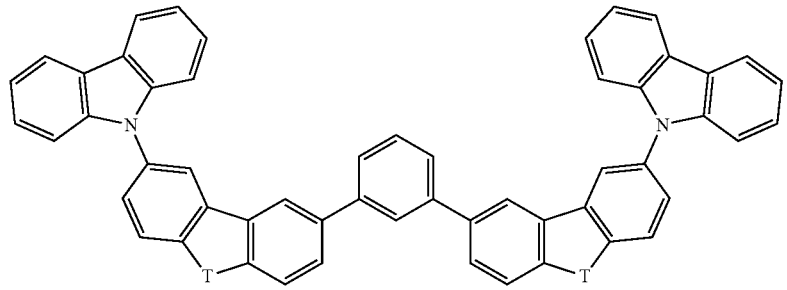
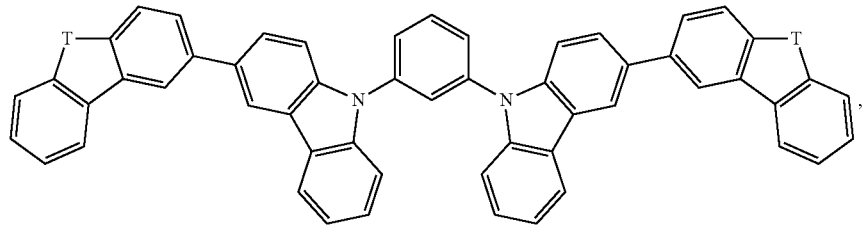
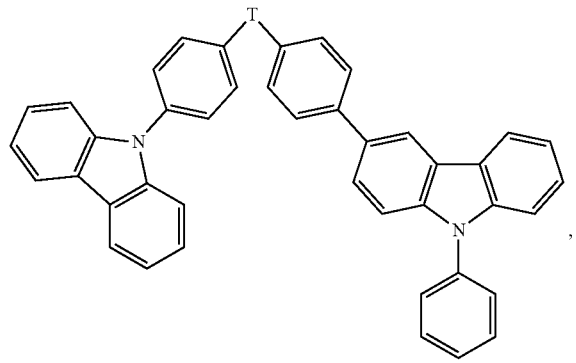
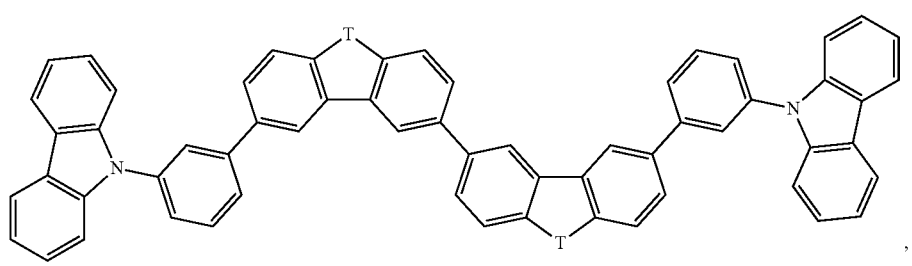

-continued
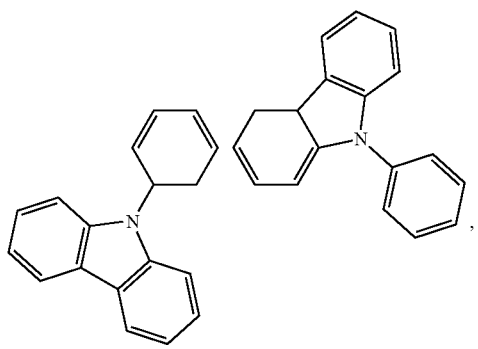
,
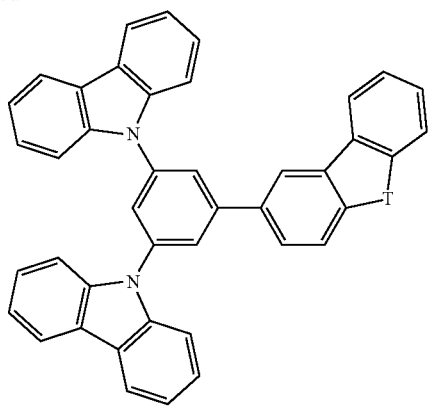
,
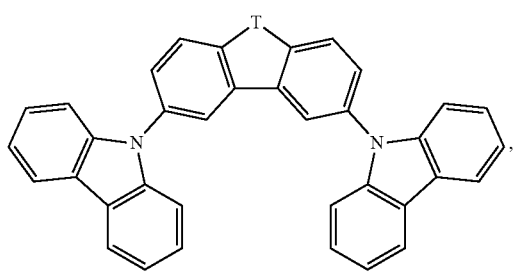
,
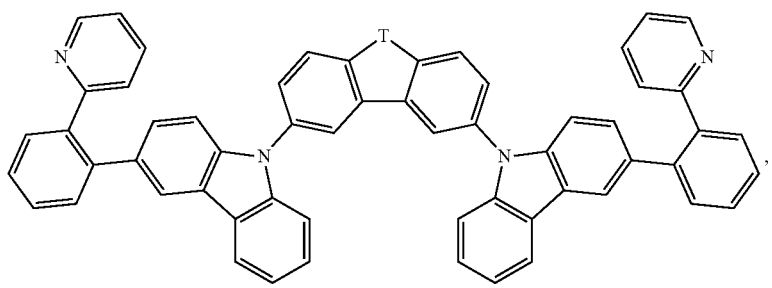
,
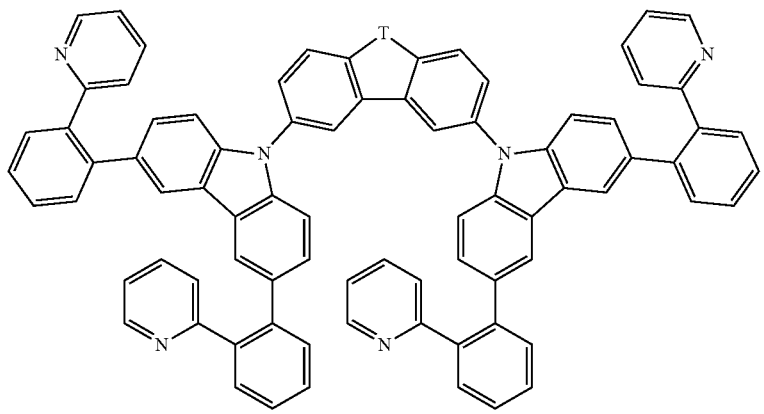
,
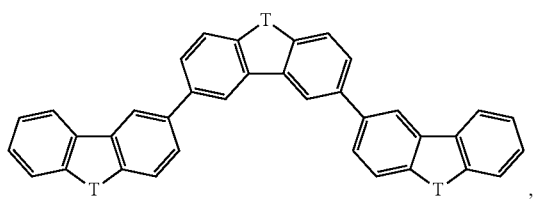
,
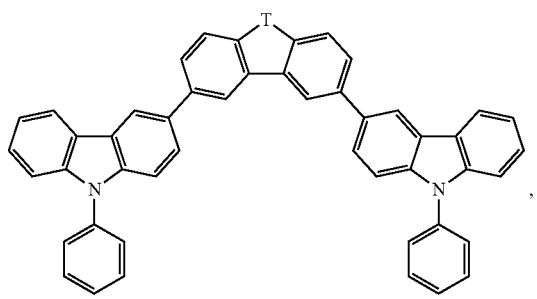
, 81
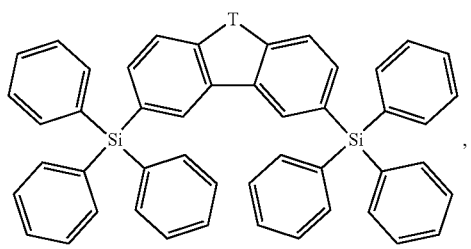
82
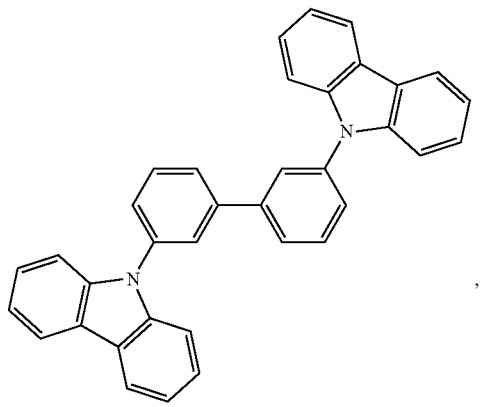
-continued
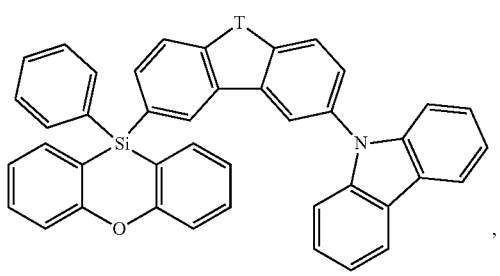
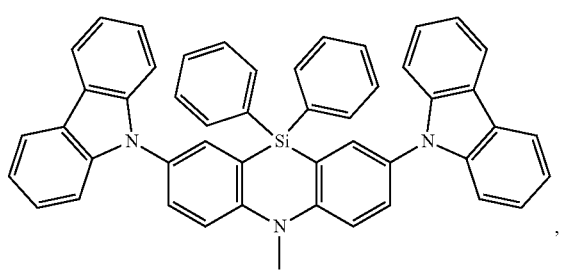
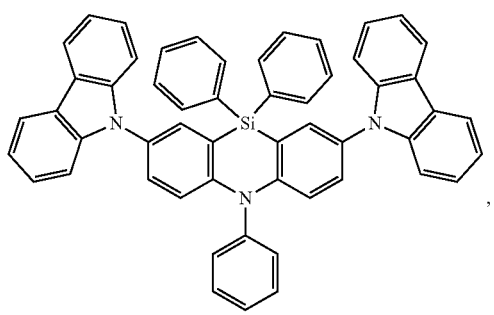
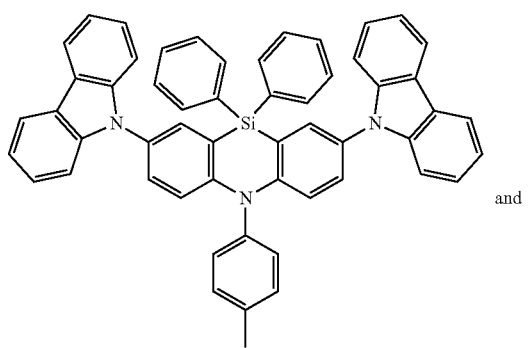
and
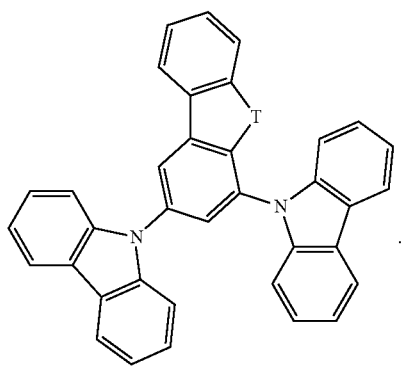

In the above-mentioned compounds T is O, or S, preferably O. If T occurs more than one time in a molecule, all groups T have the same meaning.
The more preferred host compounds are shown below:
(SH-1)
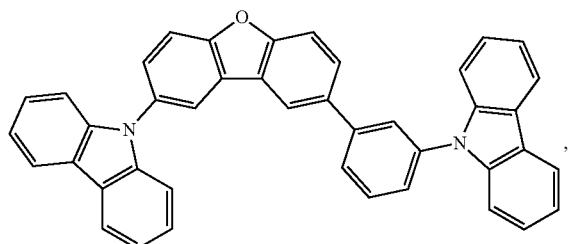
(SH-2)
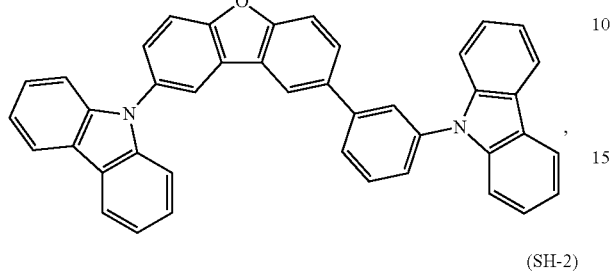
(SH-3), (SH-4), (SH-5), (SH-6)
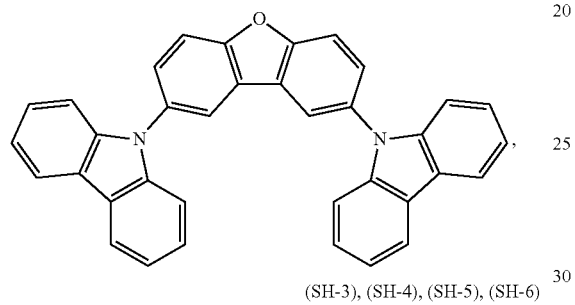
(SH-7a)
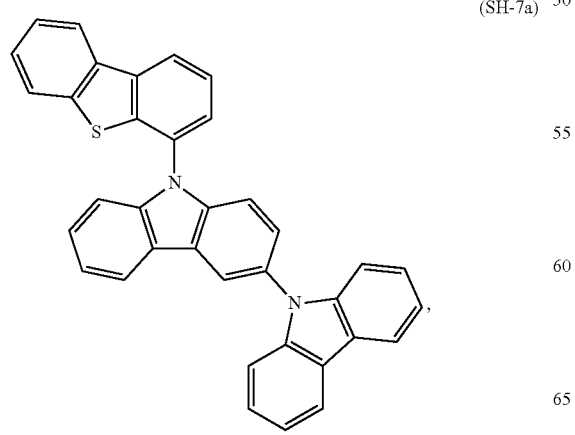
(SH-7b)
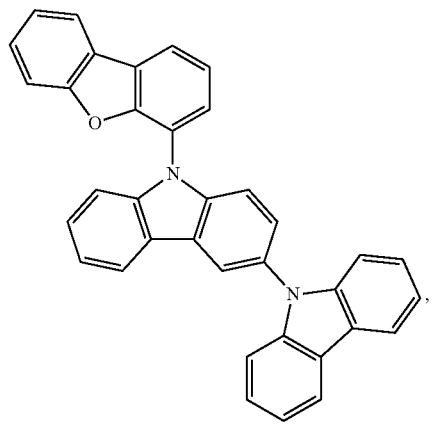
(SH-8)
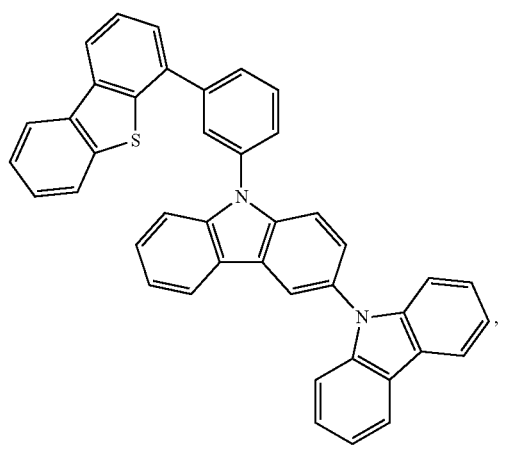
(SH-9)
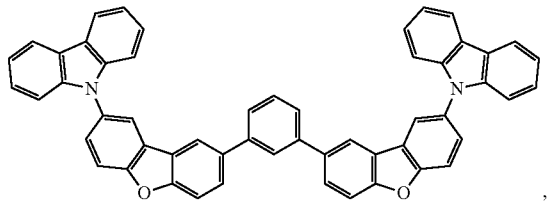
(SH-10)
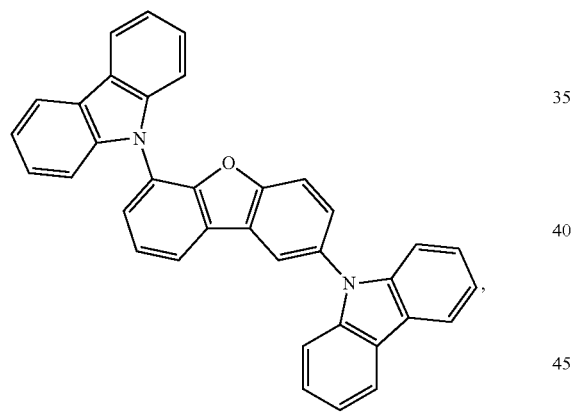

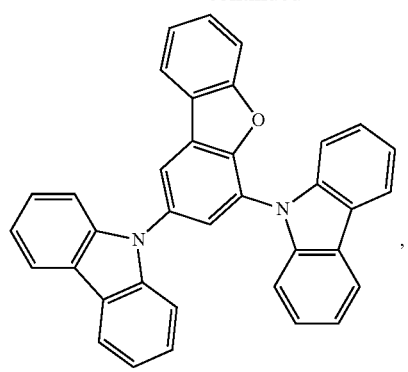
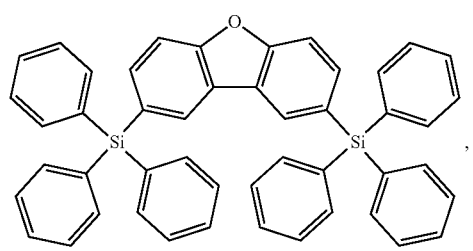
(SH-11)
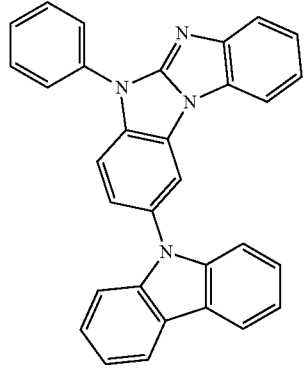
and
(SH-12)
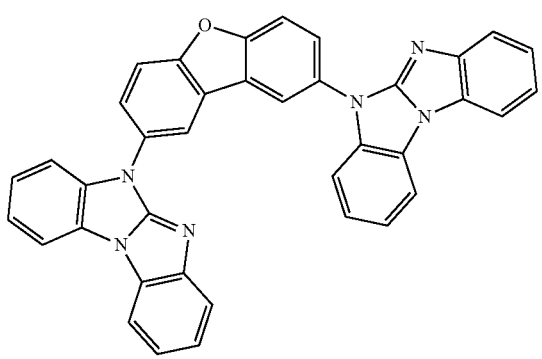
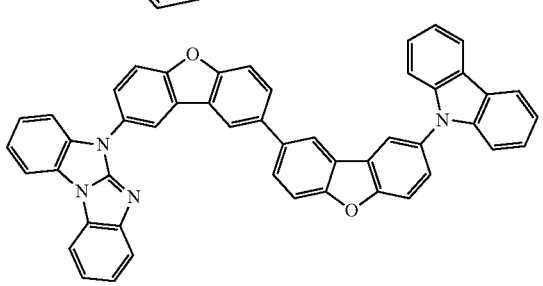
(published in WO2012/130709)
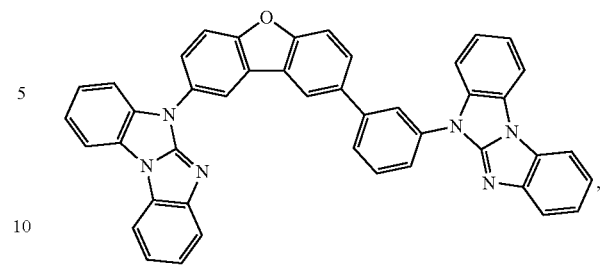
(published in WO2012/130709)
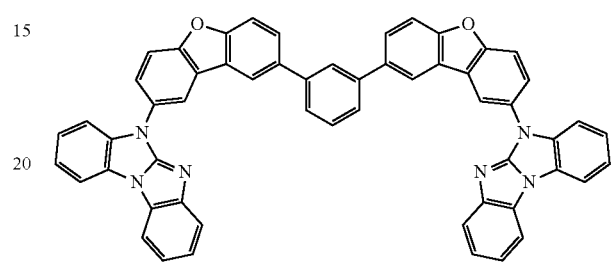
(published in WO2012/130709)
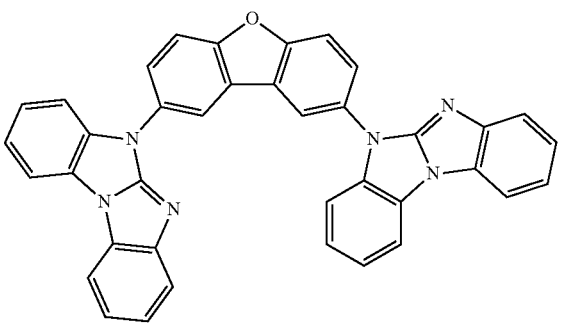
(published in WO2012/130709)
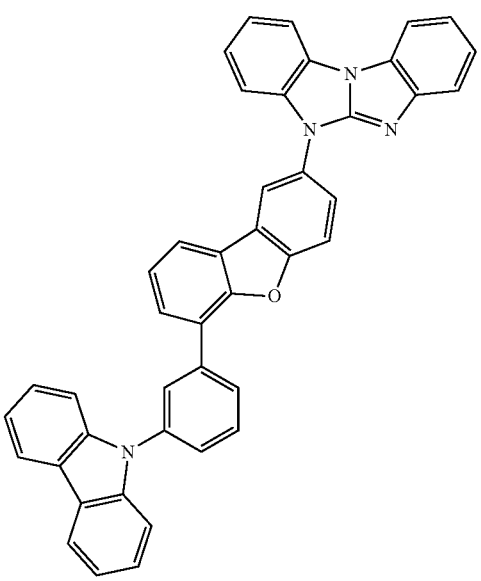
(published in WO2012/130709)

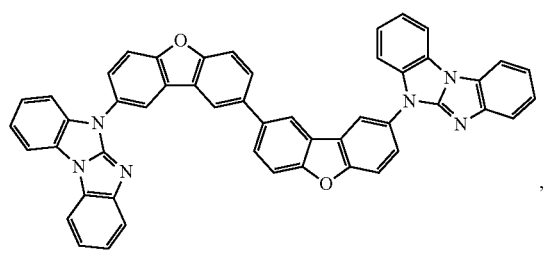
(published in WO2012/130709)
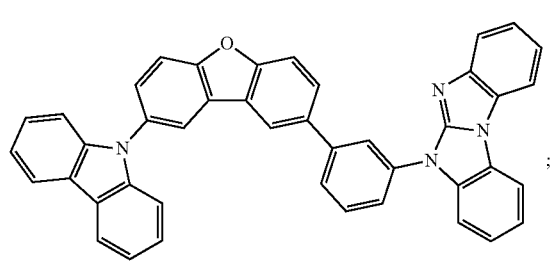
(published in WO2012/130709)
as well as the host materials published in WO2012048266, WO2012145173, WO2012162325, and EP2551932.
The most preferred host compounds are shown below:
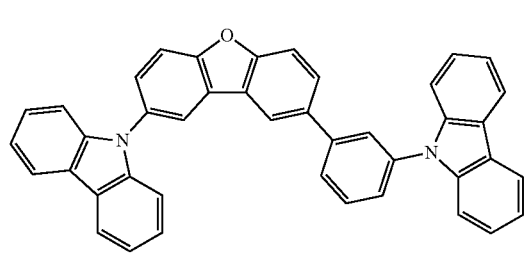
(SH-1; published in WO 2009/008100, example 4)
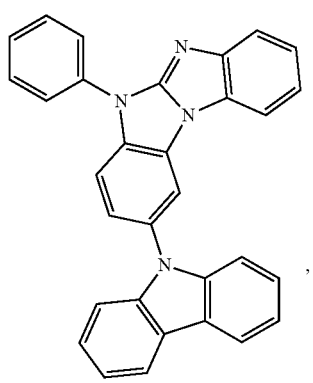
(SH-11; disclosed in EP12175635.7 nd US61/669677),
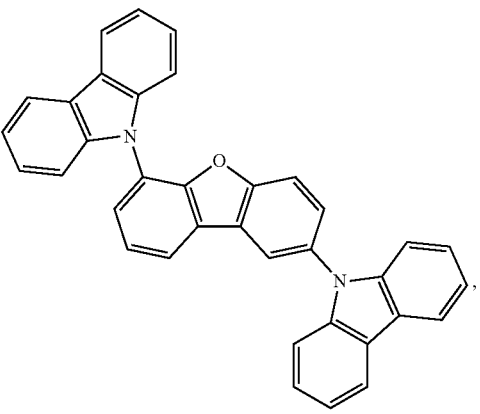
(published in WO 2011/004639, compound I-1, synthesis described in [0163],
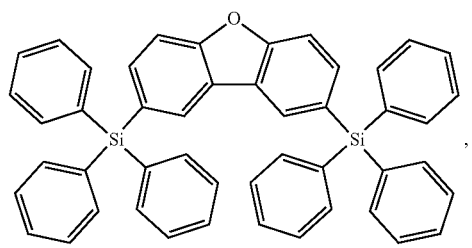
(published in WO2009/003898, compound 4g)
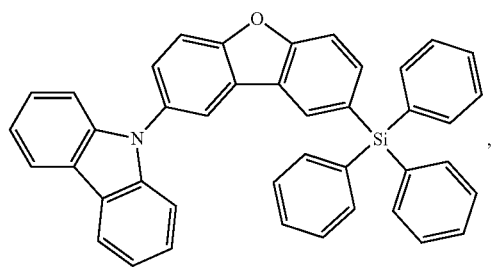
(SH-4, published in WO 2010/079051, compound 14)
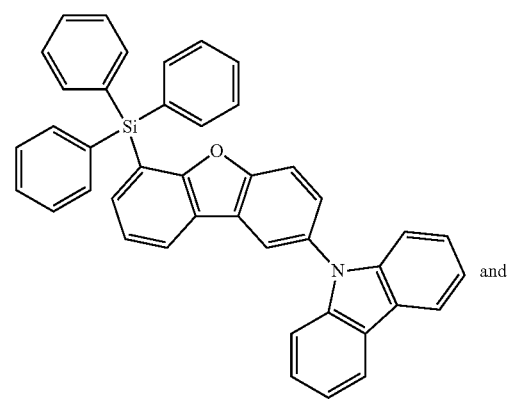
(SH-5, published in WO 2010/079051, structure on page 22 X = O)

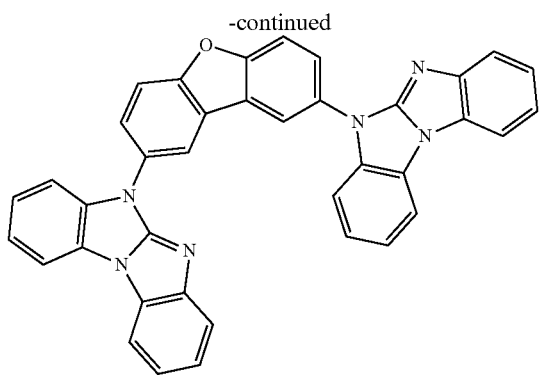

(SH-12; published in WO 20112/130709)

The present invention therefore also concerns the organic electronic device, preferably the OLED, according to the present invention, wherein the at least one metal-carbene complex comprising one, two or three, preferably three in the case of Ir and preferably one in the case of Pt, bidentate ligands of formula (I) and/or (I') is employed in combination with at least one host material. Suitable and preferred host materials are mentioned above. More preferably, the at least one host material comprises at least one dibenzofuranyl unit and/or at least one benzimidazo[1,2-a]benzimidazolyl unit and/or at least one carbazolyl and/or at least one dibenzothiofuranyl unit. Suitable host materials and preferred host materials comprising at least one dibenzofuranyl unit and/or at least one benzimidazo[1,2-a]benzimidazolyl unit and/or at least one carbazolyl and/or at least one dibenzothiofuranyl unit are mentioned above. The at least one metal-carbene complex comprising one, two or three, preferably three in the case of Ir and preferably one in the case of Pt, bidentate ligands of formula (I) and/or (I') which is employed in combination with at least one host material is preferably employed in the light-emitting layer of an OLED.

Preferably, the light-emitting layer comprises at least one emitter material, which is a metal-carbene complex comprising one, two or three, preferably three, bidentate ligands of formula (I) and/or (I') according to the present invention, and at least one host material. Suitable and preferred emitter materials as well as suitable and preferred host materials are mentioned above.

Most preferably, the organic electronic device, preferably the OLED, comprises a light-emitting layer comprising at least one metal-carbene complex comprising one, two or three, preferably three, bidentate ligands of formula (I) and/or (I') as emitter material in an amount of 5 to 40% by weight, preferably 5 to 30% by weight, more preferably 5 to 20 by weight, and at least one host material, preferably at least one host material comprising at least one dibenzofuranyl unit and/or at least one benzimidazo[1,2-a]benzimidazolyl unit and/or at least one carbazolyl and/or at least one dibenzothiofuranyl unit, more preferably at least one host material selected from the preferred and most preferred host materials comprising at least one dibenzofuranyl unit and/or at least one benzimidazo[1,2-a]benzimidazolyl unit and/or at least one carbazolyl and/or at least one dibenzothiofuranyl unit mentioned above, in an amount of 60 to 95% by weight, preferably 70 to 95% by weight, more preferably 80 to 95% by weight, where the amount of the at least one emitter material and the at least one host material adds up to a total of 100% by weight.

The light-emitting layer may comprise a second host compound. The second host compound can be one compound or it can be a mixture of two or more compounds. The carbene complexes Ir(DPBIC)$_3$ or Ir(DPABIC)$_3$ which are described below may be added as co-host.

Mixed matrix materials with two hosts selected from those hosts mentioned above, or one host from those hosts mentioned above and one Ir complex as described below, comprise preferably 5% by weight to 15% by weight of an Ir complex and 60% by weight to 90% by weight of a further host selected from the hosts as mentioned above.

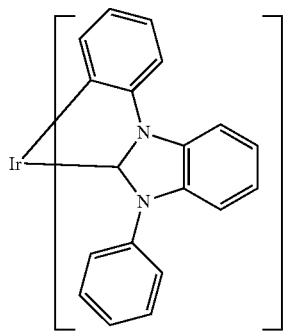

Ir(DPBIC)$_3$ ( as described in WO 2005/019373A2

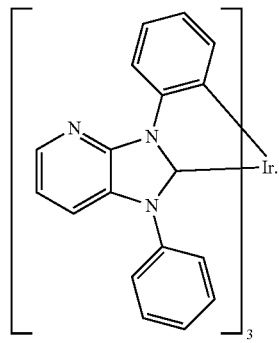

Ir(DPABIC)$_3$
(as described as complex fac-Em1 in WO2012/172182
(synthesis: example 1))

The layer thickness of the light-emitting layer in the inventive OLED is preferably from 1 to 100 nm, more preferably 5 to 60 nm. Preferred OLED structures are mentioned above and—in more detail—below.

Device Structure—OLED Structure

Suitable structures of the organic electronic devices are known to those skilled in the art. Preferred organic electronic devices are selected from organic light-emitting diodes (OLED), light-emitting electrochemical cells (LEEC), organic photovoltaic cells (OPV) and organic field-effect transistors (OFET). More preferred organic electronic devices are OLEDs.

The device structures of said OLEDs, LEECs, OPVs and OFETs have been described above in general terms. In the following, the device structures of preferred OLEDs (which are preferred electronic devices according to the present invention) are described.

As mentioned above, the present invention preferably relates to an organic electronic device which is an OLED, wherein the OLED comprises
(a) an anode,
(b) a cathode,
(c) a light-emitting layer between the anode and the cathode, wherein the metal-carbene complex comprising one, two or three, preferably three, bidentate ligands of formula (I) and/or (I') is present in the light-emitting layer of the OLED.

Preferred metal-carbene complexes comprising one, two or three, preferably three, bidentate ligands of formula (I) and/or (I') are mentioned before.

The layer sequence in the inventive OLED is preferably as follows:
1. anode (a)
2. hole-transport layer (d)
3. electron/exciton blocking layer (e)
4. light-emitting layer (c)
5. cathode (b)

Layer sequences different from the aforementioned construction are also possible, and are known to those skilled in the art. For example, it is possible that the OLED does not have all of the layers mentioned; for example, an OLED with the layers (a) (anode), (c) (light-emitting layer) and (b) (cathode) and layer (d) (hole-transport layer) or layer (e) (electron/exciton blocking layer) are likewise suitable.

The OLEDs may additionally have a blocking layer for holes/excitons (f) adjacent to the cathode side of the light-emitting layer (c) and/or an electron transport layer (g) adjacent to the cathode side of the blocking layer for holes/excitons (f), if present, respectively adjacent to the cathode side of the light-emitting layer (c), if the blocking layer for holes/excitons (f) is not present.

The present invention therefore more preferably relates to an inventive OLED having the following layer sequence:
1. anode (a)
2. hole-transport layer (d)
3. electron/exciton blocking layer (e)
4. light-emitting layer (c)
5. blocking layer for holes/excitons (f)
6. electron transport layer (g)
7. cathode (b)

In a further embodiment, the inventive OLED, in addition to layers (a), (b), (c), (d), (e), (f) and (g), comprises at least one of the further layers mentioned below:
A hole injection layer (h) between the anode (a) and the hole-transport layer (d);
an electron injection layer (i) between the electron-transport layer (g) and the cathode (b).

It is additionally possible that a plurality of the aforementioned functions (electron/exciton blocker, hole/exciton blocker, hole injection, hole conduction, electron injection, electron conduction) are combined in one layer and are assumed, for example, by a single material present in this layer.

Furthermore, the individual layers of the OLED among those specified above may in turn be formed from two or more layers. For example, the hole transport layer may be formed from a layer into which holes are injected from the electrode, and a layer which transports the holes away from the hole-injecting layer into the light-emitting layer. The electron transport layer may likewise consist of a plurality of layers, for example a layer in which electrons are injected by the electrode, and a layer which receives electrons from the electron injection layer and transports them into the light-emitting layer. These layers mentioned are each selected according to factors such as energy level, thermal resistance and charge carrier mobility, and also energy difference of the layers specified with the organic layers or the metal electrodes. The person skilled in the art is capable of selecting the structure of the OLEDs such that it is matched optimally to the organic compounds used as emitter substances in accordance with the invention.

In order to obtain particularly efficient OLEDs, for example, the HOMO (highest occupied molecular orbital) of the hole-transport layer should be matched to the work function of the anode, and the LUMO (lowest unoccupied molecular orbital) of the electron conductor layer should be matched to the work function of the cathode, provided that the aforementioned layers are present in the inventive OLEDs.

Hole-transport material (d) and/or the electron/exciton blocker material (e) The hole-transport material and/or the electron/exciton blocker material in the OLED of the present invention may be an Ir metal-carbene complex comprising one, two or three, preferably three, bidentate ligands of formula (III) and/or (III')

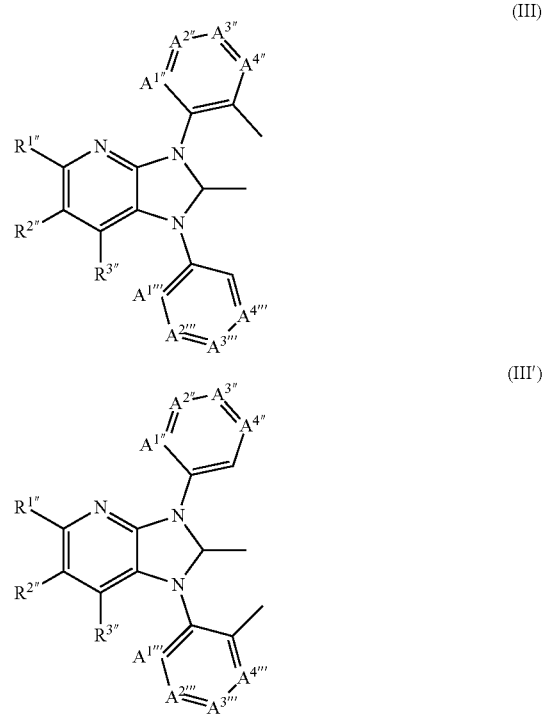

wherein
$R^{1''}$, $R^{2''}$ and $R^{3''}$
are each independently hydrogen, deuterium, a linear or branched alkyl radical, optionally interrupted by at least one heteroatom, optionally bearing at least one functional group and having a total of from 1 to 20 carbon atoms and/or heteroatoms, a substituted or unsubstituted cycloalkyl radical, optionally bearing at least one functional group and having from 3 to 20 carbon atoms, a substituted or unsubstituted heterocyclo alkyl radical, interrupted by at least one heteroatom, optionally bearing at least one functional group and having a total of from 3 to 20 carbon atoms and/or heteroatoms, a substituted or unsubstituted aryl radical, optionally bearing at least one functional group and having 6 to 30 carbon atoms, a substituted or unsubstituted heteroaryl radical, interrupted by at least one heteroatom, optionally bearing at least one functional group and having a total of from 5 to 18 carbon atoms and/or heteroatoms, a group with donor or acceptor action, preferably, $R^{1''}$, $R^{2''}$ and $R^{3''}$ are each independently hydrogen, a linear or branched alkyl radical, having from 1 to 6 carbon atoms, a substituted or unsubstituted aryl radical, having from 6 to 30 carbon atoms, a substituted or unsubstituted heteroaryl radical, having a total of from 5 to 18 carbon atoms and/or heteroatoms, a group with donor or acceptor action, selected from the group consisting of halogen radicals, preferably F or Cl, more preferably F; CF$_3$, SiPh$_3$ and SiMe$_3$;

or

R$^{1''}$ and R$^{2''}$ or R$^{2''}$ and R$^{3''}$ form, independently of each other, together with a carbon atom to which they are bonded an optionally substituted saturated or unsaturated or aromatic ring, optionally interrupted by at least one heteroatom and having a total of from 5 to 18 carbon atoms and/or heteroatoms, and may optionally be fused to at least one further optionally substituted saturated or unsaturated or aromatic ring, optionally interrupted by at least one heteroatom and having a total of from 5 to 18 carbon atoms and/or heteroatoms;

A$^{1''}$ is CR$^{4''}$ or N, preferably CR$^{4''}$;
A$^{2''}$ is CR$^{5''}$ or N, preferably CR$^{5''}$;
A$^{3''}$ is CR$^{6''}$ or N, preferably CR$^{6''}$;
A$^{4''}$ is CR$^{7''}$ or N, preferably CR$^{7''}$;
A$^{1'''}$ is CR$^{4'''}$ or N, preferably CR$^{4'''}$;
A$^{2'''}$ is CR$^{5'''}$ or N, preferably CR$^{5'''}$;
A$^{3'''}$ is CR$^{6'}$ or N, preferably CR$^{6'''}$;
A$^{4'''}$ is CR$^{7'''}$ or N, preferably CR$^{7'''}$;
R$^{4''}$, R$^{5''}$, R$^{6''}$, R$^{7''}$, R$^{4'''}$, R$^{5'''}$, R$^{6'''}$ and R$^{7'''}$ are each independently hydrogen, deuterium, a linear or branched alkyl radical, optionally interrupted by at least one heteroatom, optionally bearing at least one functional group and having a total of from 1 to 20 carbon atoms and/or heteroatoms, a substituted or unsubstituted cycloalkyl radical, optionally bearing at least one functional group and having from 3 to 20 carbon atoms, a substituted or unsubstituted heterocyclo alkyl radical, interrupted by at least one heteroatom, optionally bearing at least one functional group and having a total of from 3 to 20 carbon atoms and/or heteroatoms, a substituted or unsubstituted aryl radical, optionally bearing at least one functional group and having from 6 to 30 carbon atoms, a substituted or unsubstituted heteroaryl radical, interrupted by at least one heteroatom, optionally bearing at least one functional group and having a total of from 5 to 18 carbon atoms and/or heteroatoms, a group with donor or acceptor action, preferably, R$^{4''}$, R$^{5''}$, R$^{6''}$, R$^{7''}$, R$^{4'''}$, R$^{5'''}$, R$^{6'''}$ and R$^{7'''}$ are each independently hydrogen, a linear or branched alkyl radical, optionally bearing at least one functional group, optionally interrupted by at least one heteroatom and having a total of from 1 to 20 carbon and/or heteroatoms, a substituted or unsubstituted aryl radical, having from 6 to 30 carbon atoms, a substituted or unsubstituted heteroaryl radical, having a total of from 5 to 18 carbon atoms and/or heteroatoms, a group with donor or acceptor action, selected from halogen radicals, preferably F or Cl, more preferably F; CF$_3$, CN, SiPh$_3$ and SiMe$_3$;

or

R$^{4''}$ and R$^{5''}$, R$^{5''}$ and R$^{6''}$ or R$^{6''}$ and R$^{7''}$ or R$^{4'''}$ and R$^{5'''}$, R$^{5'''}$ and R$^{6'''}$ or R$^{6'''}$ and R$^{7'''}$ form, independently of each other, together with the carbon atoms to which they are bonded, a saturated or unsaturated or aromatic, optionally substituted ring, which is optionally interrupted by at least one heteroatom, has a total of from 5 to 18 carbon atoms and/or heteroatoms, and may optionally be fused to at least one further optionally substituted saturated or unsaturated or aromatic ring, optionally interrupted by at least one heteroatom and having a total of from 5 to 18 carbon atoms and/or heteroatoms.

Preferred Ir metal-carbene complexes suitable as hole-transport materials and/or the electron/exciton blocker materials in the OLED of the present invention are described in detail in the EP application No. 13162776.2.

In the case that the OLED comprises a material different from the materials mentioned before in the hole-transport layer or in the electron/exciton blocking layer, suitable materials are mentioned below.

Hole-Transport Layer (d)

Further suitable hole-transport materials for layer (d) of the inventive OLED are disclosed, for example, in Kirk-Othmer Encyclopedia of Chemical Technology, 4th Edition, Vol. 18, pages 837 to 860, 1996. Either hole-transporting molecules or polymers may be used as the hole-transport material. Customarily used hole-transporting molecules are selected from the group consisting of

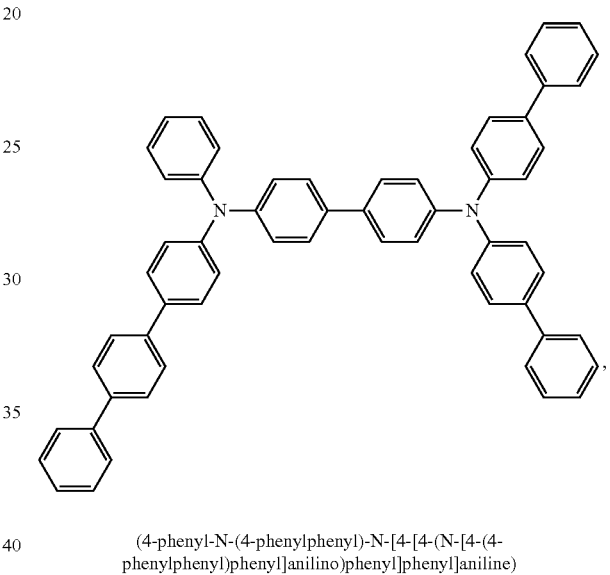

(4-phenyl-N-(4-phenylphenyl)-N-[4-[4-(N-[4-(4-phenylphenyl)phenyl]anilino)phenyl]phenyl]aniline)

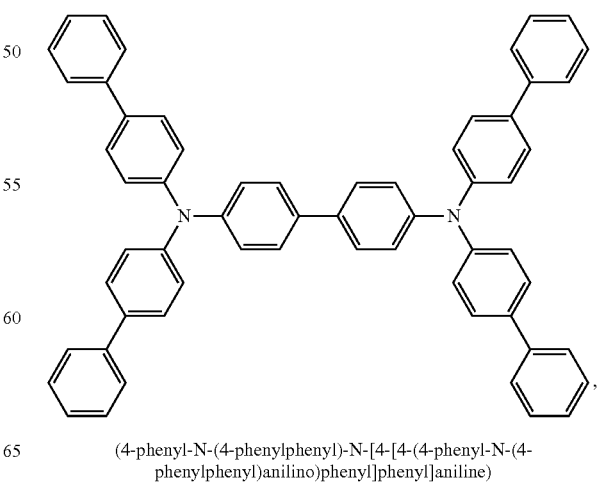

(4-phenyl-N-(4-phenylphenyl)-N-[4-[4-(4-phenyl-N-(4-phenylphenyl)anilino)phenyl]phenyl]aniline)

-continued

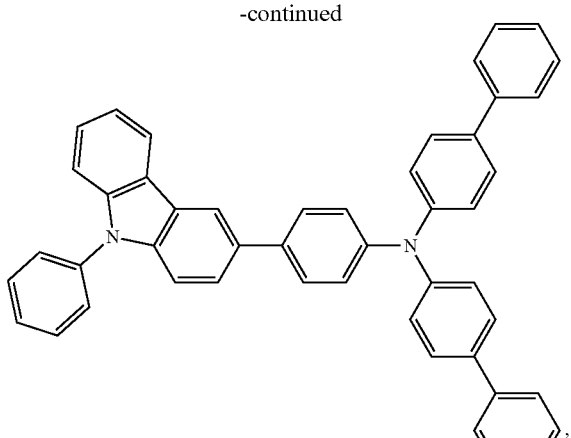

(4-phenyl-N-[4-(9-phenylcarbazol-3-yl)phenyl]-N-(4-phenylphenyl)aniline)

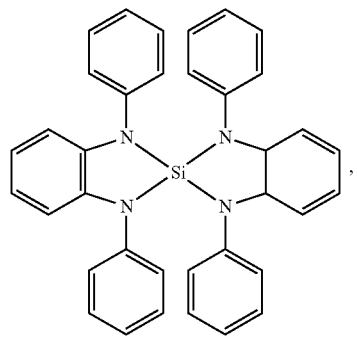

1,1′,3,3′-tetraphenylspiro[1,3,2-benzodiazasilole-2,2′-3a,7a-dihydro-1,3,2-benzodiazasilole]

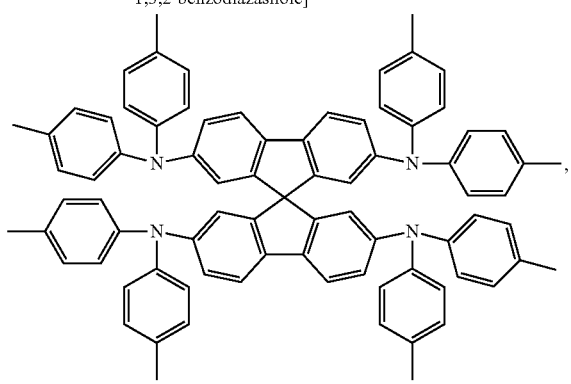

(N2,N2,N2′,N2′,N7,N7,N7′,N7′-octakis(p-tolyl)-9,9′-spirobi[fluorene]-2,2′,7,7′-tetramine)

4,4′-bis[N-(1-naphthyl)-N-phenylamino]biphenyl (α-NPD), N,N′-diphenyl-N,N′-bis(3-methylphenyl)-[1,1′-biphenyl]-4,4′-diamine (TPD), 1,1-bis[(di-4-tolylamino)phenyl]cyclohexane (TAPC), N,N′-bis(4-methylphenyl)-N,N′-bis(4-ethylphenyl)-[1,1′-(3,3′-dimethyl)biphenyl]-4,4′-diamine (ETPD), tetrakis(3-methylphenyl)-N,N,N′,N′-2,5-phenylenediamine (PDA), α-phenyl-4-N,N-diphenylaminostyrene (TPS), p-(diethylamino)benzaldehyde diphenylhydrazone (DEH), triphenylamine (TPA), bis[4-(N,N-diethylamino)2-methylphenyl](4-methylphenyl)methane (MPMP), 1-phenyl-3-[p-(diethylamino)styryl]5-[p-(diethylamino)phenyl]pyrazoline (PPR or DEASP), 1,2-trans-bis(9H-carbazol9-yl)-cyclobutane (DCZB), N,N,N′,N′-tetrakis(4-methylphenyl)-(1,1′-biphenyl)-4,4′-diamine (TTB), fluorine compounds such as 2,2′,7,7′-tetra(N,N-di-tolyl)amino9,9-spirobifluorene (spiro-TTB), N,N′-bis(naphthalen-1-yl)-N,N′-bis(phenyl)9,9-spirobifluorene (spiro-NPB) and 9,9-bis(4-(N,N-bis-biphenyl-4-yl-amino)phenyl-9Hfluorene, benzidine compounds such as N,N′-bis(naphthalen-1-yl)-N,N′-bis(phenyl)benzidine and porphyrin compounds such as copper phthalocyanines. In addition, polymeric hole-injection materials can be used such as poly(N-vinylcarbazole) (PVK), polythiophenes, polypyrrole, polyaniline, self-doping polymers, such as, for example, sulfonated poly(thiophene-3-[2[(2-methoxyethoxy)ethoxy]-2,5-diyl) (Plexcore® OC Conducting Inks commercially available from Plextronics), and copolymers such as poly(3,4-ethylenedioxythiophene)/poly(4-styrenesulfonate) also called PEDOT/PSS.

The hole-transport materials mentioned above are commercially available and/or prepared by processes known by a person skilled in the art.

In a preferred embodiment it is possible to use specific metal carbene complexes as hole-transport materials. Suitable carbene complexes are, for example, carbene complexes as described in WO2005/019373A2, WO2006/056418 A2, WO2005/113704, WO2007/115970, WO2007/115981 and WO2008/000727. One example of a suitable carbene complex is Ir(DPBIC)$_3$ with the formula:

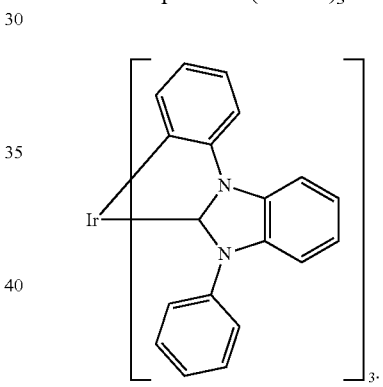

The preparation of Ir(DPBIC)$_3$ is for example mentioned in WO 2005/019373 A2. Another example of a suitable carbene complex is Ir(DPABIC)$_3$

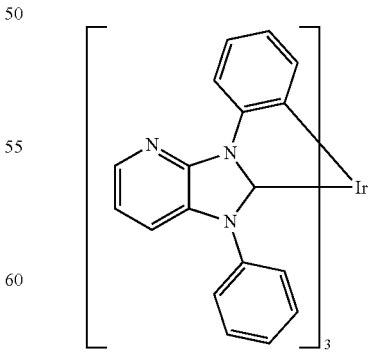

The preparation of Ir(DPABIC)$_3$ is for example mentioned in WO2012/172182 (as complex fac-Em; synthesis: example 1)).

The hole-transporting layer may also be electronically doped in order to improve the transport properties of the materials used, in order firstly to make the layer thicknesses more generous (avoidance of pinholes/short circuits) and in order secondly to minimize the operating voltage of the device. Electronic doping is known to those skilled in the art and is disclosed, for example, in W. Gao, A. Kahn, J. Appl. Phys., Vol. 94, No. 1, 1 Jul. 2003 (p-doped organic layers); A. G. Werner, F. Li, K. Harada, M. Pfeiffer, T. Fritz, K. Leo, Appl. Phys. Lett., Vol. 82, No. 25, 23 Jun. 2003 and Pfeiffer et al., Organic Electronics 2003, 4, 89-103 and K. Walzer, B. Maennig, M. Pfeiffer, K. Leo, Chem. Soc. Rev. 2007, 107, 1233. For example it is possible to use mixtures in the hole-transporting layer, in particular mixtures which lead to electrical p-doping of the hole-transporting layer. p-Doping is achieved by the addition of oxidizing materials. These mixtures may, for example, be the following mixtures: mixtures of the abovementioned hole transport materials with at least one metal oxide as doping material, for example $MoO_2$, $MoO_3$, $WO_x$, $ReO_3$ and/or $V_2O_5$, preferably $MoO_3$ and/or $ReO_3$, more preferably $MoO_3$ or mixtures comprising the aforementioned hole transport materials and one or more compounds selected from 7,7,8,8-tetracyanoquinodimethane (TCNQ), 2,3,5,6-tetrafluoro-7,7,8,8-tetracyanoquinodimethane ($F_4$-TCNQ), 2,5-bis(2-hydroxyethoxy)-7,7,8,8-tetracyanoquinodimethane, bis(tetra-nbutylammonium) tetracyanodiphenoquinodimethane, 2,5-dimethyl-7,7,8,8-tetracyanoquinodimethane, tetracyanoethylene, 11,11,12,12-tetracyanonaphtho-2,6-quinodimethane, 2-fluoro-7,7,8,8-tetracyanoquino-dimethane, 2,5-difluoro-7,7,8,8-tetracyanoquinodimethane, dicyanomethylene-1,3,4,5,7,8-hexafluoro-6H-naphthalen-2-ylidene)malononitrile ($F_6$-TNAP), $Mo(tfd)_3$ (from Kahn et al., J. Am. Chem. Soc. 2009, 131 (35), 12530-12531), compounds as described in EP1988587 and in EP2180029 and quinone compounds as mentioned in EP 09153776.1.

Preferably, the hole-transport layer comprises 50 to 90% by weight, of the hole-transport material and 10 to 50% by weight of the doping material, wherein the sum of the amount of the hole-transport material and the doping material is 100% by weight.

Electron/Exciton Blocking Layer (e)

Blocking layers may also be used to block excitons from diffusing out of the emissive layer.

Further suitable metal complexes for use as electron/exciton blocker material are, for example, carbene complexes as described in WO 2005/019373 A2, WO 2006/056418 A2, WO 2005/113704, WO 2007/115970, WO 2007/115981 and WO 2008/000727. Explicit reference is made here to the disclosure of the WO applications cited, and these disclosures shall be considered to be incorporated into the content of the present application. One example of a suitable carbene complex is Ir(DPBIC)$_3$ with the formula:

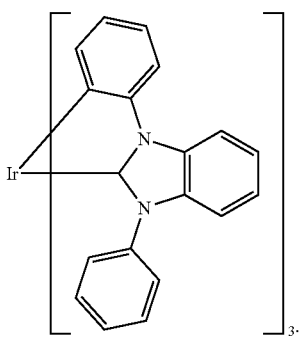

Another example of a suitable carbene complex is Ir(DPA-BIC)$_3$

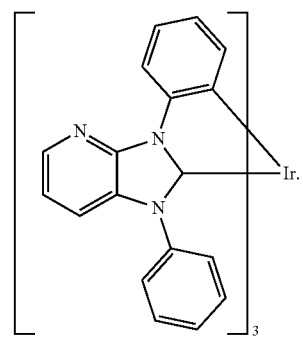

Anode (a)

The anode is an electrode which provides positive charge carriers. It may be composed, for example, of materials which comprise a metal, a mixture of different metals, a metal alloy, a metal oxide or a mixture of different metal oxides. Alternatively, the anode may be a conductive polymer. Suitable metals comprise the metals of groups 11, 4, 5 and 6 of the Periodic Table of the Elements, and also the transition metals of groups 8 to 10. When the anode is to be transparent, mixed metal oxides of groups 12, 13 and 14 of the Periodic Table of the Elements are generally used, for example indium tin oxide (ITO). It is likewise possible that the anode (a) comprises an organic material, for example polyaniline, as described, for example, in Nature, Vol. 357, pages 477 to 479 (Jun. 11, 1992). Preferred anode materials include conductive metal oxides, such as indium tin oxide (ITO) and indium zinc oxide (IZO), aluminum zinc oxide (AIZnO), and metals. Anode (and substrate) may be sufficiently transparent to create a bottom-emitting device. A preferred transparent substrate and anode combination is commercially available ITO (anode) deposited on glass or plastic (substrate). A reflective anode may be preferred for some top-emitting devices, to increase the amount of light emitted from the top of the device. At least either the anode or the cathode should be at least partly transparent in order to be able to emit the light formed. Other anode materials and structures may be used.

The anode materials mentioned above are commercially available and/or prepared by processes known by a person skilled in the art.

Cathode (b)

The cathode (b) is an electrode which serves to introduce electrons or negative charge carriers. The cathode may be any metal or nonmetal which has a lower work function than the anode. Suitable materials for the cathode are selected from the group consisting of alkali metals of group 1, for example Li, Cs, alkaline earth metals of group 2, metals of group 12 of the Periodic Table of the Elements, comprising the rare earth metals and the lanthanides and actinides. In addition, metals such as aluminum, indium, calcium, barium, samarium and magnesium, and combinations thereof, may be used.

The cathode materials mentioned above are commercially available and/or prepared by processes known by a person skilled in the art.

Further Layers in the Inventive OLED

Blocking Layer for Holes/Excitons (f)

Among the materials mentioned below as electron transport materials, some may fulfil several functions. For example, some of the electron transport materials are simultaneously hole-blocking materials when they have a low-lying HOMO or exciton-blocking materials when they have a sufficiently high triplet energy. These can be used, for example, in the blocking layer for holes/excitons (f). However, it is likewise possible that the function as a hole/exciton blocker is also adopted by the layer (g), such that the layer (f) can be dispensed with.

Electron Transport Layer (g)

Electron transport layer may include a material capable of transporting electrons. Electron transport layer may be intrinsic (undoped), or doped. Doping may be used to enhance conductivity. Suitable electron-transporting materials for layer (g) of the inventive OLEDs comprise metals chelated with oxinoid compounds, such as tris(8-hydroxyquinolato)aluminum (Alq$_3$), compounds based on phenanthroline such as 2,9-dimethyl-4,7-diphenyl-1,10-phenanthroline (DDPA=BCP), 4,7-diphenyl-1,10-phenanthroline (Bphen), 2,4,7,9-tetraphenyl-1,10-phenanthroline, 4,7-diphenyl-1,10-phenanthroline (DPA) or phenanthroline derivatives disclosed in EP1786050, in EP1970371, or in EP1097981, and azole compounds such as 2-(4-biphenylyl)-5-(4-t-butylphenyl)-1,3,4-oxadiazole (PBD) and 3-(4-biphenylyl)-4phenyl-5-(4-t-butylphenyl)-1,2,4-triazole (TAZ).

The electron-transport materials mentioned above are commercially available and/or prepared by processes known by a person skilled in the art.

It is likewise possible to use mixtures of at least two materials in the electron-transporting layer, in which case at least one material is electron-conducting. Preferably, in such mixed electron-transporting layers, at least one phenanthroline compound is used, preferably BCP, or at least one pyridine compound according to the formula (VIII) below, preferably a compound of the formula (VIIIa) below. More preferably, in mixed electron-transporting layers, in addition to at least one phenanthroline compound, alkaline earth metal or alkali metal hydroxyquinolate complexes, for example Liq (8-hydroxyquinolatolithium), are used. Suitable alkaline earth metal or alkali metal hydroxyquinolate complexes are specified below (formula VII). Reference is made to WO2011/157779.

The electron transport layer may also be electronically doped in order to improve the transport properties of the materials used, in order firstly to make the layer thicknesses more generous (avoidance of pinholes/short circuits) and in order secondly to minimize the operating voltage of the device. Electronic doping is known to those skilled in the art and is disclosed, for example, in W. Gao, A. Kahn, J. Appl. Phys., Vol. 94, No. 1, 1 Jul. 2003 (p-doped organic layers); A. G. Werner, F. Li, K. Harada, M. Pfeiffer, T. Fritz, K. Leo, Appl. Phys. Lett., Vol. 82, No. 25, 23 Jun. 2003 and Pfeiffer et al., Organic Electronics 2003, 4, 89-103 and K. Walzer, B. Maennig, M. Pfeiffer, K. Leo, Chem. Soc. Rev. 2007, 107, 1233. For example, it is possible to use mixtures which lead to electrical n-doping of the electron-transporting layer. n-Doping is achieved by the addition of reducing materials. These mixtures may, for example, be mixtures of the above-mentioned electron transport materials with alkali/alkaline earth metals or alkali/alkaline earth metal salts, for example Li, Cs, Ca, Sr, Cs$_2$CO$_3$, with alkali metal complexes, for example 8-hydroxyquinolatolithium (Liq), and with Y, Ce, Sm, Gd, Tb, Er, Tm, Yb, Li$_3$N, Rb$_2$CO$_3$, dipotassium phthalate, W(hpp)$_4$ from EP 1786050, or with compounds as described in EP1 837 926 B1.

In a preferred embodiment, the electron transport layer comprises at least one compound of the general formula (VII)

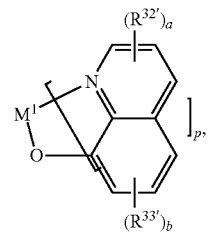

in which $R^{32'}$ and $R^{33'}$ are each independently F, $C_1$-$C_8$-alkyl, or $C_6$-$C_{14}$-aryl, which is optionally substituted by one or more $C_1$-$C_8$-alkyl groups, or two $R^{32'}$ and/or $R^{33'}$ substituents together form a fused benzene ring which is optionally substituted by one or more $C_1$-$C_8$-alkyl groups;

a and b are each independently 0, 1, 2 or 3, $M^1$ is an alkaline metal atom or alkaline earth metal atom, p is 1 when $M^1$ is an alkali metal atom, p is 2 when $M^1$ is an alkali metal atom.

A very particularly preferred compound of the formula (VII) is

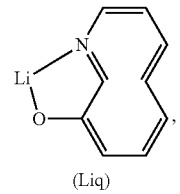

which may be present as a single species, or in other forms such as $Li_gQ_g$ in which g is an integer, for example $Li_6Q_6$. Q is an 8-hydroxyquinolate ligand or an 8-hydroxyquinolate derivative.

In a further preferred embodiment, the electron-transporting layer comprises at least one compound of the formula (VIII),

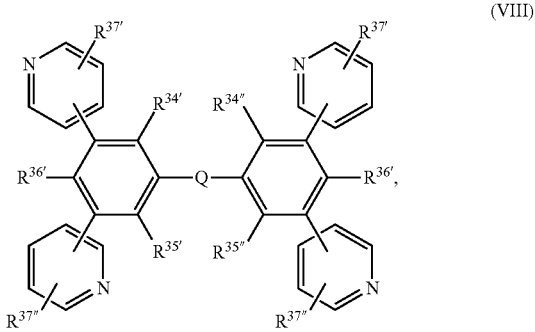

in which $R^{34'}$, $R^{35'}$, $R^{36'}$, $R^{37'}$, $R^{34''}$, $R^{35''}$, $R^{36''}$ and $R^{37''}$ are each independently hydrogen, $C_1$-$C_{18}$-alkyl, $C_1$-$C_{18}$-alkyl which is substituted by E and/or interrupted by D, $C_6$-$C_{24}$-aryl, $C_6$-$C_{24}$-aryl which is substituted by G, $C_2$-$C_{20}$-heteroaryl or $C_2$-$C_{20}$-heteroaryl which is substituted by G, Q is an arylene or heteroarylene group, each of which is optionally substituted by G; D is —CO—; —COO—; —S—; —SO—; —SO$_2$—; —O—; —NR$^{40'}$—; —SiR$^{45'}$R$^{46'}$—; —POR$^{47'}$—; —CR$^{38'}$=CR$^{39'}$—; or —C≡C—; E is —OR$^{44'}$; —SR$^{44'}$; —NR$^{40'}$R$^{41'}$; —COR$^{43'}$; —COOR$^{42'}$; —CONR$^{40'}$R$^{41'}$; —CN; or F;

G is E, C$_1$-C$_8$-alkyl, C$_1$-C$_{18}$-alkyl which is interrupted by D, C$_1$-C$_{18}$-perfluoroalkyl, C$_1$-C$_{18}$-alkoxy, or C$_1$-C$_{18}$-alkoxy which is substituted by E and/or interrupted by D, in which R$^{38'}$ and R$^{39'}$ are each independently H, C$_6$-C$_{18}$-aryl; C$_6$-C$_{18}$-aryl which is substituted by C$_1$-C$_{18}$-alkyl or C$_1$-C$_{18}$-alkoxy; C$_1$-C$_{18}$-alkyl; or C$_1$-C$_{18}$-alkyl which is interrupted by —O—;

R$^{40'}$ and R$^{41'}$ are each independently C$_6$-C$_{18}$-aryl; C$_6$-C$_{18}$-aryl which is substituted by C$_1$-C$_{18}$-alkyl or C$_1$-C$_8$-alkoxy; C$_1$-C$_{18}$-alkyl; or C$_1$-C$_{18}$-alkyl which is interrupted by —O—; or R$^{40'}$ and R$^{41'}$ together form a 6-membered ring;

R$^{42'}$ and R$^{43'}$ are each independently C$_6$-C$_{18}$-aryl; C$_6$-C$_{18}$-aryl which is substituted by C$_1$-C$_{18}$-alkyl or C$_1$-C$_{18}$-alkoxy; C$_1$-C$_{18}$-alkyl; or C$_1$-C$_{18}$-alkyl which is interrupted by —O—, R$^{44'}$ is C$_6$-C$_{18}$-aryl; C$_6$-C$_{18}$-aryl which is substituted by C$_1$-C$_{18}$-alkyl or C$_1$-C$_{18}$-alkoxy; C$_1$-C$_{18}$-alkyl; or C$_1$-C$_{18}$-alkyl which is interrupted by —O—, R$^{45'}$ and R$^{46'}$ are each independently C$_1$-C$_{18}$-alkyl, C$_6$-C$_{18}$-aryl or C$_6$-C$_{18}$-aryl which is substituted by C$_1$-C$_{18}$-alkyl, R$^{47'}$ is C$_1$-C$_{18}$-alkyl, C$_6$-C$_{18}$-aryl or C$_6$-C$_{18}$-aryl which is substituted by C$_1$-C$_{18}$-alkyl.

Preferred compounds of the formula (VIII) are compounds of the formula (VIIIa)

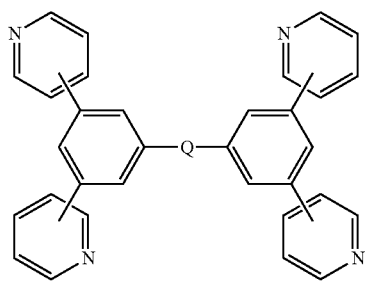

(VIIIa)

in which Q is:

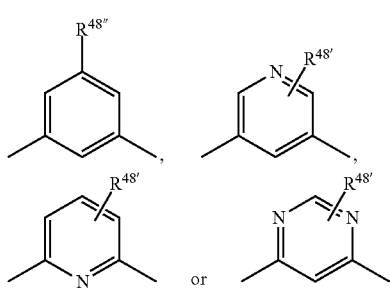

R$^{48'}$ is H or C$_1$-C$_{18}$-alkyl and

R$^{48''}$ is H, C$_1$-C$_{18}$-alkyl or

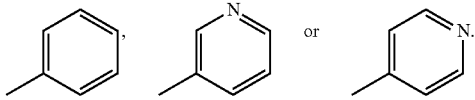

Particular preference is given to a compound of the formula

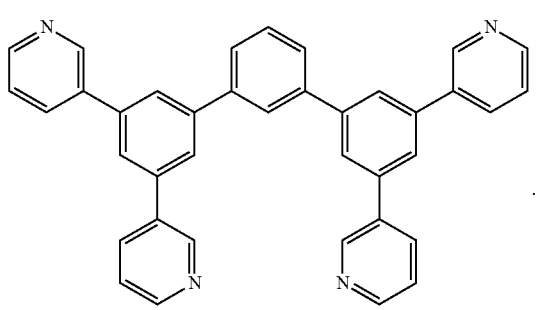

(ETM-1)

In a further, very particularly preferred embodiment, the electron transport layer comprises a compound of the formula

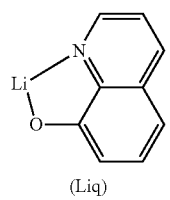

(Liq)

and a compound ETM-1.

In a preferred embodiment, the electron transport layer comprises the compound of the formula (VII) in an amount of 99 to 1% by weight, preferably 75 to 25% by weight, more preferably about 50% by weight, where the amount of the compounds of the formulae (VII) and the amount of the compounds of the formulae (VIII) adds up to a total of 100% by weight.

The preparation of the compounds of the formula (VIII) is described in J. Kido et al., Chem. Commun. (2008) 5821-5823, J. Kido et al., Chem. Mater. 20 (2008) 5951-5953 and JP2008-127326, or the compounds can be prepared analogously to the processes disclosed in the aforementioned documents.

It is likewise possible to use mixtures of alkali metal hydroxyquinolate complexes, preferably Liq, and dibenzofuran compounds in the electron transport layer. Reference is made to WO2011/157790. Dibenzofuran compounds A-1 to A-36 and B-1 to B-22 described in WO 2011/157790 are preferred, wherein dibenzofuran compound

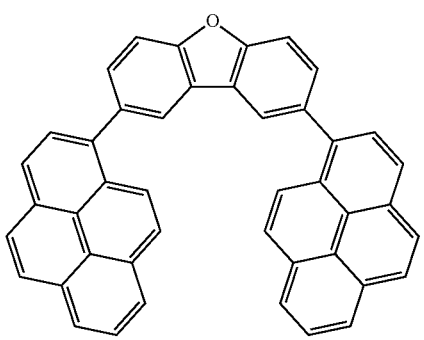 [SMILES: c1cc2ccc3ccc(-c4ccc5oc6ccc(-c7ccc8ccc9cccc%10ccc7c8c9%10)cc6c5c4)c4ccc(c1)c2c34]

(A10; =ETM-2 is most preferred.

In a preferred embodiment, the electron transport layer comprises Liq in an amount of 99 to 1% by weight, preferably 75 to 25% by weight, more preferably about 50% by weight, where the amount of Liq and the amount of the dibenzofuran compound(s), especially ETM-2, adds up to a total of 100% by weight.

In a preferred embodiment, the electron transport layer comprises at least one phenanthroline derivative and/or pyridine derivative.

In a further preferred embodiment, the electron transport layer comprises at least one phenanthroline derivative and/or pyridine derivative and at least one alkali metal hydroxyquinolate complex.

In a further preferred embodiment, the electron transport layer comprises at least one of the dibenzofuran compounds A-1 to A-36 and B-1 to B-22 described in WO2011/157790, especially ETM-2.

In a further preferred embodiment, the electron transport layer comprises a compound described in WO 2012/111462, WO 2012/147397 and US 2012/0261654, such as, for example, a compound of formula

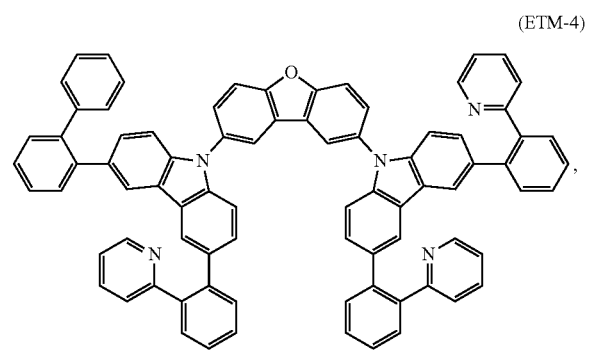 [SMILES: c1ccc(-c2ccccc2-c2ccc3c(c2)c2cc(-c4ccccc4-c4ccccn4)ccc2n3-c2ccc3oc4ccc(-n5c6ccc(-c7ccccc7-c7ccccn7)cc6c6cc(-c7ccccc7-c7ccccn7)ccc65)cc4c3c2)cc1]

(ETM-4)

WO 2012/115034, such as for example, such as, for example, a compound of formula

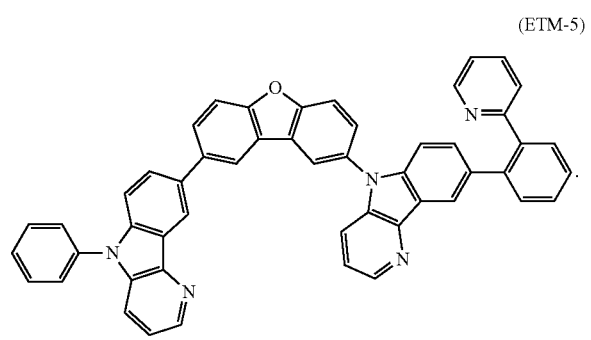 [SMILES: c1ccc(-n2c3ccc(-c4ccc5oc6ccc(-n7c8ccc(-c9ccccc9-c9ccccn9)cc8c8ncccc87)cc6c5c4)cc3c3ncccc32)cc1]

(ETM-5)

Hole Injection Layer (h)

Generally, injection layers are comprised of a material that may improve the injection of charge carriers from one layer, such as an electrode or a charge generating layer, into an adjacent organic layer. Injection layers may also perform a charge transport function. The hole injection layer may be any layer that improves the injection of holes from anode into an adjacent organic layer. A hole injection layer may comprise a solution deposited material, such as a spin-coated polymer, or it may be a vapor deposited small molecule material, such as, for example, CuPc or MTDATA. Polymeric hole-injection materials can be used such as poly(N-vinylcarbazole) (PVK), polythiophenes, polypyrrole, polyaniline, self-doping polymers, such as, for example, sulfonated poly(thiophene-3-[2[(2-methoxyethoxy)ethoxy]-2,5-diyl) (Plexcore® OC Conducting Inks commercially available from Plextronics, e.g. Plxecore AJ20-1000), and copolymers such as poly(3,4-ethylenedioxythiophene)/poly(4-styrenesulfonate) also called PEDOT/PSS.

The hole injection materials mentioned above are commercially available and/or prepared by processes known by a person skilled in the art.

Electron Injection Layer (i)

The electron injection layer may be any layer that improves the injection of electrons into an adjacent organic layer. Lithium-comprising organometallic compounds such as 8-hydroxyquinolatolithium (Liq), CsF, NaF, KF, $Cs_2CO_3$ or LiF may be applied between the electron transport layer (g) and the cathode (b) as an electron injection layer (i) in order to reduce the operating voltage.

The electron injection materials mentioned above are commercially available and/or prepared by processes known by a person skilled in the art.

In general, the different layers in the inventive OLED, if present, have the following thicknesses:
anode (a): 50 to 500 nm, preferably 100 to 200 nm;
a hole injection layer (h): 5 to 100 nm, preferably 20 to 80 nm,
hole-transport layer (d): 5 to 100 nm, preferably 10 to 80 nm,
electron/exciton blocking layer (e): 1 to 50 nm, preferably 5 to 10 nm,
light-emitting layer (c): 1 to 100 nm, preferably 5 to 60 nm,
a hole/exciton blocking layer (f): 1 to 50 nm, preferably 5 to 10 nm,
electron-transport layer (g): 5 to 100 nm, preferably 20 to 80 nm,
electron injection layer (i): 1 to 50 nm, preferably 2 to 10 nm,
cathode (b): 20 to 1000 nm, preferably 30 to 500 nm.

The person skilled in the art is aware (for example on the basis of electrochemical studies) of how suitable materials have to be selected. Suitable materials for the individual layers are known to those skilled in the art and are disclosed, for example, in WO 00/70655.

In addition, it is possible that some of the layers used in the inventive OLED have been surface-treated in order to increase the efficiency of charge carrier transport. The selection of the materials for each of the layers mentioned is preferably determined by obtaining an OLED with a high efficiency and lifetime.

The inventive organic electronic device, preferably OLED, can be produced by methods known to those skilled in the art. In general, the inventive OLED is produced by successive vapor deposition of the individual layers onto a suitable substrate. Suitable substrates are, for example, glass, inorganic semiconductors or polymer films. For vapor deposition, it is possible to use customary techniques, such as thermal evaporation, chemical vapor deposition (CVD), physical vapor deposition (PVD) and others. In an alternative process, the organic layers of the organic electronic device, preferably OLED, can be applied from solutions or dispersions in suitable solvents, employing coating techniques known to those skilled in the art.

The relative position of the recombination zone of holes and electrons in the inventive OLED in relation to the cathode and hence the emission spectrum of the OLED can be influenced, among other factors, by the relative thickness of each layer. This means that the thickness of the electron transport layer should preferably be selected such that the position of the recombination zone is matched to the optical resonator property of the diode and hence to the emission wavelength of the emitter. The ratio of the layer thicknesses of the individual layers in the OLED depends on the materials used. The layer thicknesses of any additional layers used are known to those skilled in the art. It is possible that the electron-conducting layer and/or the hole-conducting layer has/have greater thicknesses than the layer thicknesses specified when they are electrically doped.

In a further embodiment the present invention relates to the use of a metal-carbene complex comprising one, two or three bidentate ligands of formula (I) and/or (I') in an OLED, preferably as emitter material. Suitable and preferred metal-carbene complexes comprising one, two or three bidentate ligands of formula (I) and/or (I') and suitable and preferred OLEDs are mentioned above. The emitter material is present in the light-emitting layer of the OLED.

Use of at least one metal-carbene complex comprising one, two or three, preferably three, bidentate ligands of formula (I) and/or (I') in an OLED, preferably as emitter material makes it possible to obtain OLEDs with high color purity and high efficiency and/or high luminous efficacy and/or with high stability and long lifetimes.

The organic electronic devices, preferably OLEDs, can be used in all apparatus in which electroluminescence is useful. Suitable devices are preferably selected from the group consisting of stationary visual display units, such as visual display units of computers, televisions, visual display units in printers, kitchen appliances, advertising panels, information panels and illuminations; mobile visual display units such as visual display units in smartphones, cellphones, tablet computers, laptops, digital cameras, MP3-players, vehicles, keyboards and destination displays on buses and trains; illumination units; units in items of clothing; units in handbags, units in accessories, units in furniture and units in wallpaper.

The present invention therefore further relates to apparatus selected from the group consisting of stationary visual display units, such as visual display units of computers, televisions, visual display units in printers, kitchen appliances, advertising panels, information panels and illuminations; mobile visual display units such as visual display units in smartphones, cellphones, tablet computers, laptops, digital cameras, MP3-players, vehicles, keyboards and destination displays on buses and trains; illumination units; units in items of clothing; units in handbags, units in accessories, units in furniture and units in wallpaper, comprising at least one organic electronic device, preferably at least one OLED, according to the present invention or comprising at least one hole transport layer or at least one electron/exciton blocking layer according to the present invention.

In a further embodiment, the metal-carbene complexes comprising one, two or three, preferably three, bidentate ligands of formula (I) and/or (I') can be used in white OLEDs.

The OLEDs may further comprise at least one second light-emitting layer. The overall emission of the OLEDs may be composed of the emission of the at least two light-emitting layers and may also comprise white light, as described for example in EP13160198.1.

In addition, the metal-carbene complexes comprising one, two or three, preferably three, bidentate ligands of formula (I) and/or (I') can be used in OLEDs with inverse structure. The structure of inverse OLEDs and the materials typically used therein are known to those skilled in the art.

It is also possible to stack two OLEDs or to stack three or more OLEDs ("stacked device concept"). These devices usually use a transparent charge generating interlayer such as indium tin oxide (ITO), $V_2O_5$, or an organic p-n junction.

The stacked OLED (SOLED) usually includes at least two individual sub-elements.

Each sub-element comprises at least three layers: an electron transport layer, an emitter layer and a hole-transport layer. Additional layers may be added to a sub-element. Each SOLED sub-element may include for example a hole injection layer, a hole transport layer, an electron/exciton blocking layer, an emitter layer, a hole/exciton blocking layer, an electron transport layer, an electron injection layer. Each SOLED sub-element may have the same layer structure or different layer structure from the other sub-elements.

Suitable SOLED structures are known by a person skilled in the art.

Not only the organic electronic devices as mentioned above are a subject of the present invention but also all metal-carbene complex, wherein the metal is Ir or Pt, comprising one, two or three bidentate ligands of formula (I) and/or (I') as described in the present application.

The inventive complexes can be used in the organic electronic devices, preferably in the OLEDs, of the present invention in a pure isomeric form or as mixture of cyclometalation isomers without significant impact on the device performance.

In a further embodiment, the present invention relates to a metal-carbene complex, wherein the metal is Ir or Pt, comprising one, two or three bidentate ligands of formula (I) and/or (I') as described in the present application, and to a process for preparing the inventive metal-carbene complex, by contacting suitable compounds comprising Ir or Pt with appropriate ligands or ligand precursors. A suitable process is described above.

The present invention further relates to the use of the inventive metal-carbene complex, wherein the metal is Ir or Pt, comprising one, two or three bidentate ligands of formula (I) and/or (I') as described in the present application in organic electronic devices, preferably in OLEDs, more preferably as emitter materials in OLEDs. Suitable organic electronic devices and suitable OLEDs are described above.

The following examples are included for illustrative purposes only and do not limit the scope of the claims.

EXAMPLES

The examples which follow, more particularly the methods, materials, conditions, process parameters, apparatus and the like detailed in the examples, are intended to support the present invention, but not to restrict the scope of the present invention.

All experiments are carried out in protective gas atmosphere.

The percentages and ratios mentioned in the examples below—unless stated otherwise—are % by weight and weight ratios.

I Device Examples

Production of an OLED (General Procedure)

The ITO substrate used as the anode is cleaned first with commercial detergents for LCD production (Deconex® 20NS, and 25ORGAN-ACID® neutralizing agent) and then in an acetone/isopropanol mixture in an ultrasound bath. To eliminate possible organic residues, the substrate is exposed to a continuous ozone flow in an ozone oven for a further 25 minutes. This treatment also improves the hole injection properties of the ITO. Next, the hole injection layer (40 nm) AJ20-1000 from Plexcore is spun on from solution. Respectively, in device example 12, the hole injection layer HATCN (10 nm) is applied by vapor deposition. HATCN: Dipyrazino[2,3-f:2',3'-h]quinoxaline 2,3,6,7,10,11-hexacarbonitrile)

Thereafter, the organic materials specified below are applied by vapor deposition to the cleaned substrate at about $10^{-7}$-$10^{-9}$ mbar at a rate of approx. 0.5-5 nm/min. The hole conductor and exciton blocker applied to the substrate is Ir(DPBIC)$_3$ (devices 1 to 6, 9, 10, 11 and 12) respectively Ir(DPABIC)$_3$ (devices 7 or 8 or 9) with a thickness of 20 nm (80 nm in device example 12), of which the first 10 nm (70 nm in device example 12) are doped with MoO$_3$ (50 wt.-%:50 wt.-%) (90 wt.-% Ir(DPBIC)$_3$: 10 wt.-% MoO$_3$ in device example 12) to improve the conductivity.

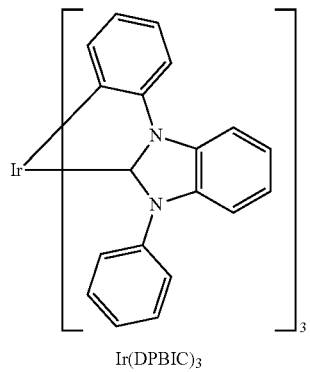

Ir(DPBIC)$_3$ (for preparation of Ir(DPBIC)$_3$ see Ir complex (7) in the application WO2005/019373).

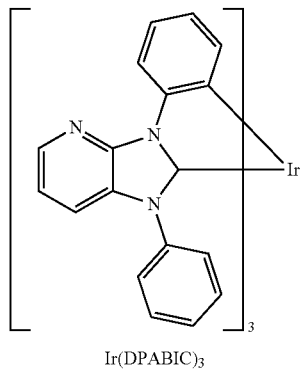

Ir(DPABIC)$_3$ (described as complex fac-Em1 in WO2012/172182 (synthesis: example 1)).

Subsequently, a mixture of emitter (BE-X), Ir(DPBIC)$_3$ respectively Ir(DPABIC)$_3$, and a host material (the emitter (BE-1, BE-2, BE-3, BE-4, BE-5, BE-6 or BE-7 or BE-9 or BE-10 or BE-11), the host material (SH-1, SH-2, SH-3, SH-4, SH-5 or SH-6) and the relative amounts in % by weight are given in the specific device examples) is applied by vapor deposition with a thickness of 40 nm (devices 1 to 3 and 5 to 12) respectively 60 nm (device 4). Subsequently, the host material is applied by vapor deposition with a thickness of 5 nm as an exciton and hole blocker.

Emitter:

BE-X (X=1, 2, 3, 4, 5, 6, or 7 or 9 or 10):

BE-1:

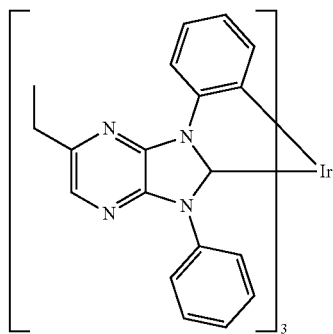

(isomeric mixture of cyclometallation isomers, shown is only one cyclometallation isomer)

BE-2:

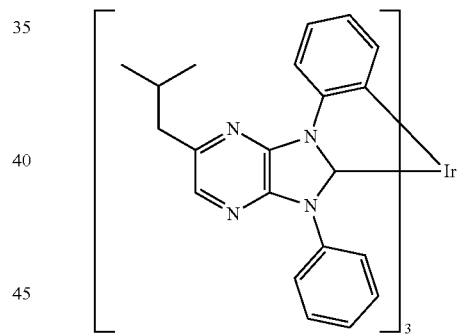

(isomeric mixture of cyclometallation isomers, shown is only one cyclometallation isomer)

BE-3:

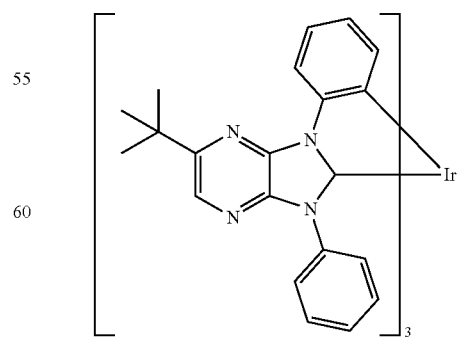

(one homoleptic cyclometallation isomer as shown)

BE-4:

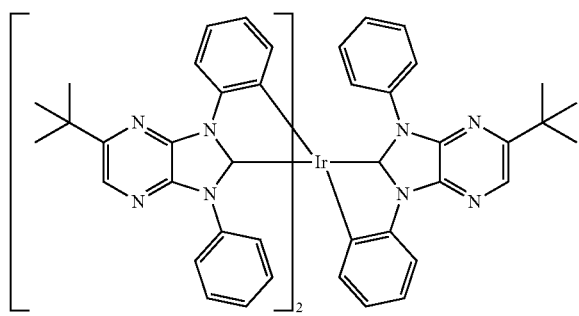

(one heteroleptic cyclometallation isomer as shown; isomer A)

BE-5:

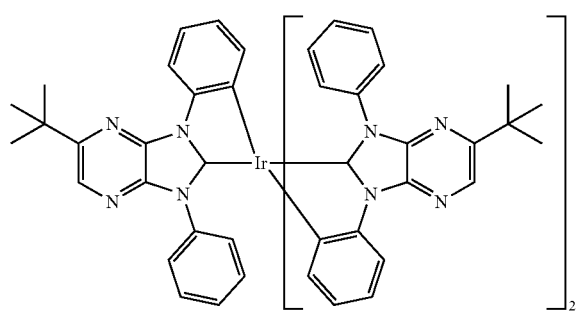

(one heteroleptic cyclometallation isomer as shown; isomer B)

BE-6:

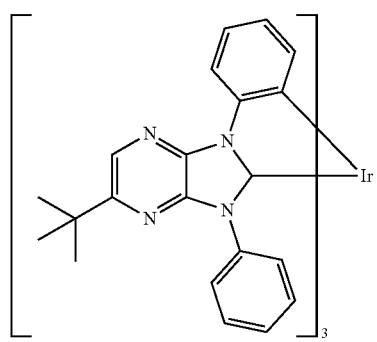

(one homoleptic cyclometallation isomer as shown)

BE-7:

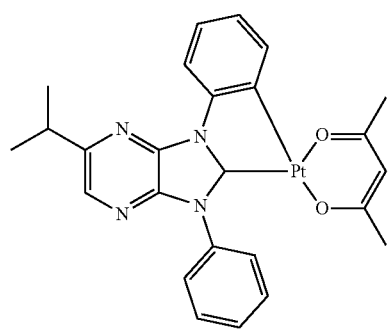

(and second cyclometallation isomer, shown is only one cyclometallation isomer)

BE-9:

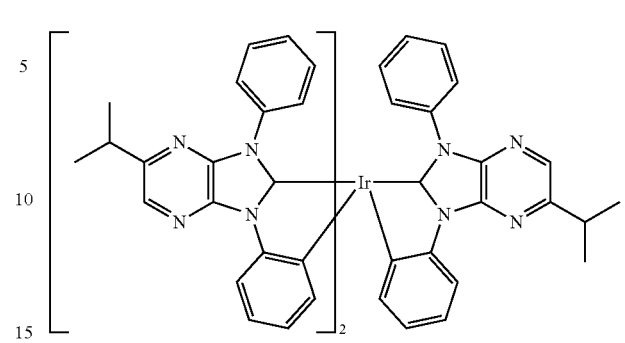

(one heteroleptic cyclometallation isomer as shown)

BE-10:

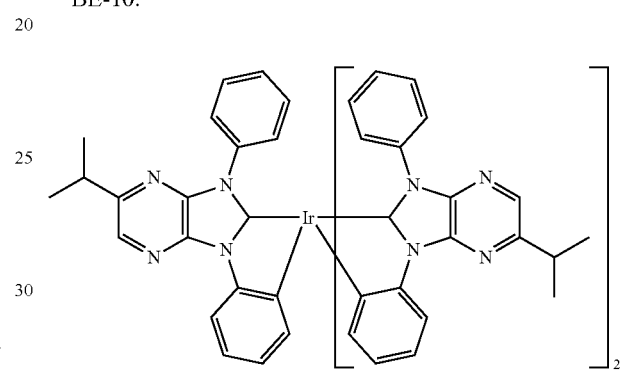

(one heteroleptic cyclometallation isomer as shown)

BE-11:

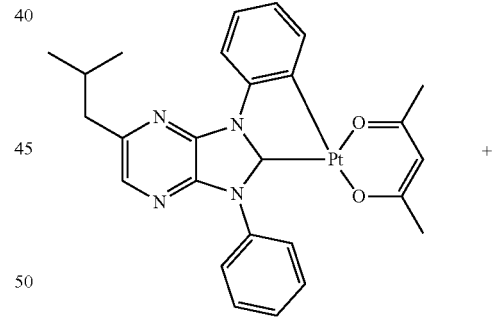

+

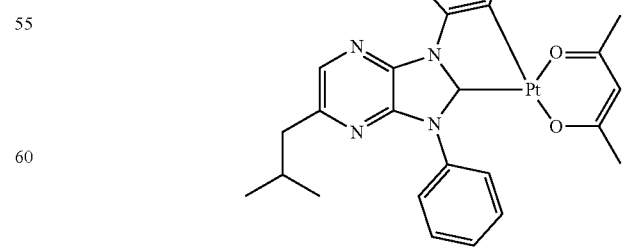

(isomeric mixture of cyclometallation isomers, shown are both cyclometallation isomers)

BE-V: Comparative Emitter:

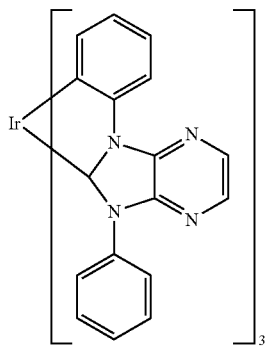

fac-Em1 in WO2011/073149

The synthesis of complexes BE-1 to BE-7 and BE-9 and BE-11 is described below.

Host Material:
SH-1:

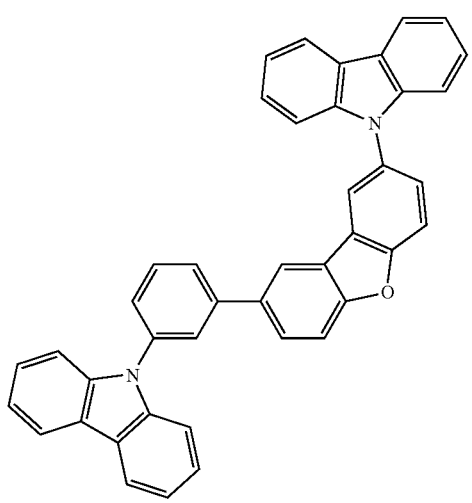 [SMILES: c1cc(-c2ccc3oc4ccc(-n5c6ccccc6c6ccccc65)cc4c3c2)cc(-n2c3ccccc3c3ccccc32)c1]

(described in WO2009/008100, example 4)
SH-2:

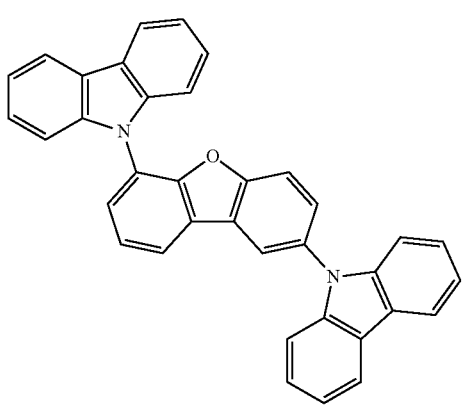 [SMILES: c1cc(-n2c3ccccc3c3ccccc32)c2oc3ccc(-n4c5ccccc5c5ccccc54)cc3c2c1]

(described as compound "I-1" in WO2011/004639, synthesis described in [0161] to [0163] in WO2011/004639)

SH-3:

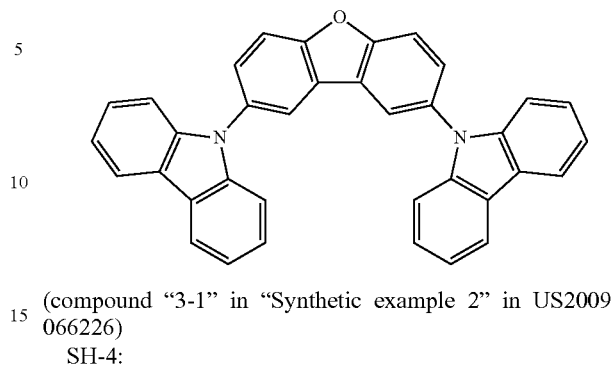

(compound "3-1" in "Synthetic example 2" in US2009/066226)
SH-4:

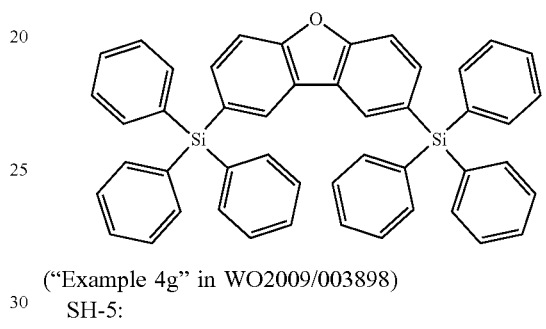

("Example 4g" in WO2009/003898)
SH-5:

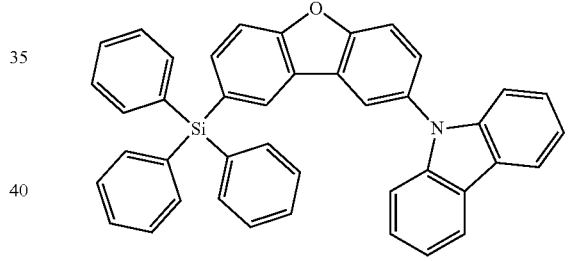

(Compound no. 14 in WO 2010/079051)
SH-6:

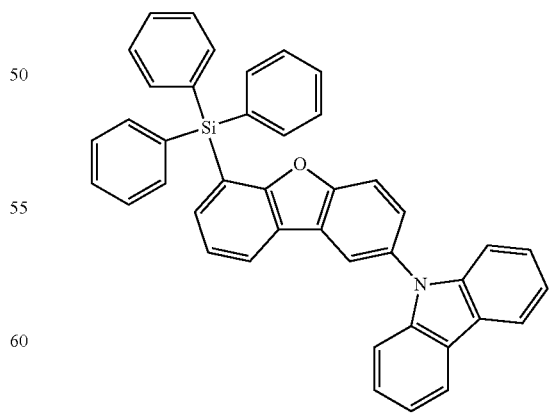

described in WO2010/079051, structure on page 22 (X=O); synthesis as in example 17 in EP1 885 818 on page 104 in US2013/0119360)

Next, as an electron transporter, a mixture of Liq and ETM (ETM-1 or ETM-2 as specified in the specific device examples) (50 wt.-%:50 wt.-%) is applied by vapor deposition in a thickness of 25 nm; then a 4 nm KF layer is applied; and finally a 100 nm-thick Al electrode is applied. All components are adhesive-bonded to a glass lid in an inert nitrogen atmosphere.

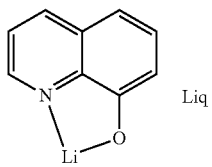 Liq

Electron Transport Material:
ETM-1:

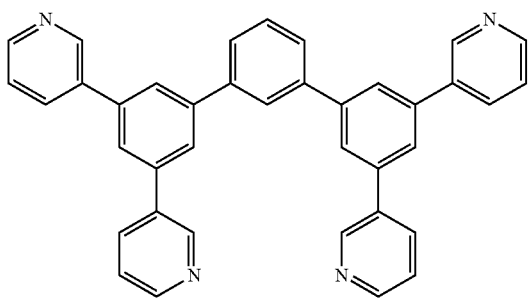 [SMILES: c1cncc(-c2cc(-c3cccnc3)cc(-c3cccc(-c4cc(-c5cccnc5)cc(-c5cccnc5)c4)c3)c2)c1]

(compound A-1 in WO 2011/157779)
ETM-2:

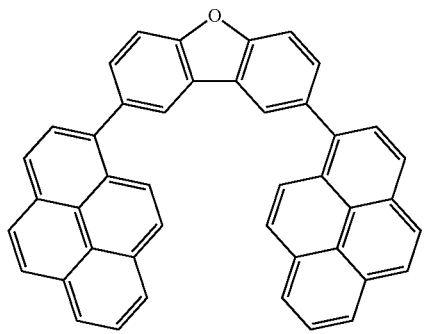 [SMILES: c1cc2ccc3ccc(-c4ccc5oc6ccc(-c7ccc8ccc9cccc%10ccc7c8c9%10)cc6c5c4)c4ccc(c1)c2c34]

(compound A1 in WO 2011/157779; compound A-10 in WO2006/128800)

To characterize the OLED, electroluminescence spectra are recorded at different currents and voltages. In addition, the current-voltage characteristic is measured in combination with the light output emitted. The light output can be converted to photometric parameters by calibration with a photometer. The lifetime $t_{1/2}$ of the diode is defined by the time taken for the luminance to fall to 50% of its initial value. The lifetime measurement is carried out at a constant current. The $CIE_{x,y}$ coordinates are extracted from the spectra according to CIE 1931 as known in the art.

For the different emitters, different host materials and different electron transport materials in the above-described OLED structure, the following electrooptical data are obtained:

All data are obtained at 300 nits.

Device 1:

Compound BE-1 and BE-2 with SH-1

40 nm HIL Plexcore AJ20-1000-10 nm Ir(DPBIC)$_3$:MoO$_3$ (50:50)—10 nm Ir(DPBIC)$_3$—40 nm BE-X/Ir(DPBIC)$_3$/SH-1 (10:15:75)—5 nm SH-1-25 nm ETM-X:Liq (50:50)—4 nm KF—100 nm Al

| Example | BE-X | ETM-X | Voltage [V] | LumEff [lm/W] | EQE [%] | CIE x, y |
|---|---|---|---|---|---|---|
| Device 1.1 (comparative) | BE-V | ETM-1 | 5.6 | 15.4 | 15.5 | 0.16; 0.29 |
| Device 1.2[1] | BE-1 | ETM-1 | 4.0 | 21.2 | 17.7 | 0.15; 0.25 |
| Device 1.3 | BE-2 | ETM-2 | 4.1 | 18.1 | 16.1 | 0.15; 0.23 |

[1] 40 nm BE-1/Ir(DPBIC)$_3$/SH-1 (30:5:65)

Result: Inventive devices 1.2 and 1.3 show better color (CIE$_y$), luminous efficacy, lower voltage and better EQE compared with comparative device 1.1 (BE-V).

Device 2:

Compound BE-1 and BE-2 with SH-2

40 nm HIL Plexcore AJ20-1000-10 nm Ir(DPBIC)$_3$:MoO$_3$ (50:50)—10 nm Ir(DPBIC)$_3$—40 nm BE-X/Ir(DPBIC)$_3$/SH-2 (10:10:80)—5 nm SH-2-25 nm ETM-X:Liq (50:50)—4 nm KF—100 nm Al

| Example | BE-X | ETM-X | Voltage [V] | LumEff [lm/W] | EQE [%] | CIE x, y |
|---|---|---|---|---|---|---|
| Device 2.1 (comparative) | BE-V | ETM-1 | 3.9 | 21.2 | 15.0 | 0.16; 0.29 |
| Device 2.2 | BE-1 | ETM-1 | 3.9 | 23.3 | 18.4 | 0.15; 0.25 |

Result: Inventive device 2.2 shows better color (CIE$_y$) and better EQE and better luminous efficacy compared with comparative device 2.1 (BE-V).

Device 3

Compound BE-2, Compound BE-4 and Compound BE-5 with SH-3

40 nm HIL Plexcore AJ20-1000-10 nm Ir(DPBIC)$_3$:MoO$_3$ (50:50)—10 nm Ir(DPBIC)$_3$—40 nm BE-X/Ir(DPBIC)$_3$/SH-3 (10:15:75)—5 nm SH-3-25 nm ETM-2:Liq (50:50)—4 nm KF—100 nm Al

| Example | BE-X | Voltage [V] | LumEff [lm/W] | EQE [%] | CIE x, y | relative LT |
|---|---|---|---|---|---|---|
| Device 3.1 (comparative) | BE-V | 4.1 | 15.8 | 11.7 | 0.15; 0.26 | 100 |
| Device 3.2 | BE-2 | 3.8 | 21.0 | 17.5 | 0.14; 0.23 | 164 |
| Device 3.3[1] | BE-4 | 4.0 | 16.5 | 13.4 | 0.15; 0.21 | 136 |
| Device 3.4[2] | BE-5 | 3.9 | 16.4 | 12.5 | 0.15; 0.22 | 212 |

[1] EML: 40 nm BE-4/Ir(DPBIC)$_3$/SH-3 (20:10:70), EB
[2] EML: 40 nm BE-5/Ir(DPBIC)$_3$/SH-3 (20:10:70)

Result: Inventive devices 3.2, 3.3 and 3.4 show better color (CIE$_y$), luminous efficacy, better EQE and better lifetime compared with comparative device 3.1 (BE-V).

Device 4

Compound BE-1 with SH-4

40 nm HIL Plexcore AJ20-1000-10 nm Ir(DPBIC)$_3$:MoO$_3$ (50:50)—10 nm Ir(DPBIC)$_3$—60 nm BE-X/Ir(DPBIC)$_3$/SH-4 (10:5:85)—5 nm SH-4-25 nm ETM-1:Liq (50:50)—4 nm KF—100 nm Al

| Example | BE-X | Voltage [V] | LumEff [lm/W] | CIE x, y |
|---|---|---|---|---|
| Device 4.1 (comparative) | BE-V | 7.5 | 10.4 | 0.16; 0.26 |
| Device 4.2 | BE-1 | 5.0 | 15.0 | 0.16; 0.26 |

Result: Inventive device 4.2 shows better voltage and better luminous efficacy by constant color (CIE) compared with comparative device 4.1 (BE-V).

Device 5

Compound BE-2, compound BE-4 and compound BE-5 with SH-5

40 nm HIL Plexcore AJ20-1000-10 nm Ir(DPBIC)$_3$:MoO$_3$ (50:50)—10 nm Ir(DPBIC)$_3$—40 nm BE-X/Ir(DPBIC)$_3$/SH-5 (10:5:85)—5 nm SH-5-25 nm ETM-2:Liq (50:50)—4 nm KF—100 nm Al

| Example | BE-X | Voltage [V] | Lum Eff [lm/W] | EQE [%] | CIE x, y |
|---|---|---|---|---|---|
| Device 5.1 (comparative) | BE-V | 5.5 | 14.6 | 15.5 | 0.16; 0.27 |
| Device 5.2 | BE-2 | 4.3 | 17.9 | 18.7 | 0.14; 0.20 |
| Device 5.3[1] | BE-4 | 3.9 | 18.7 | 18.4 | 0.14; 0.16 |
| Device 5.4[2] | BE-5 | 3.8 | 15.7 | 15.8 | 0.14; 0.15 |

[1]EML: 40 nm BE-4/Ir(DPBIC)$_3$/SH-5 (5:15:80);
[2]EML: 20 nm BE-5/Ir(DPBIC)$_3$/SH-5 (5:10:85)

Result: Inventive devices 5.2, 5.3 and 5.4 show better color (CIE$_y$), luminous efficacy and better EQE compared with comparative device 5.1 (BE-V).

Device 6

Compound BE-2 and compound BE-4 with SH-6

40 nm HIL Plexcore AJ20-1000-10 nm Ir(DPBIC)$_3$:MoO$_3$ (50:50)—10 nm Ir(DPBIC)$_3$—40 nm BE-X/Ir(DPBIC)$_3$/SH-6 (10:15:75)—5 nm SH-6-25 nm ETM-2:Liq (50:50)—4 nm KF—100 nm Al

| Example | BE-X | Voltage [V] | LumEff [lm/W] | EQE [%] | CIEx, y |
|---|---|---|---|---|---|
| Device 6.1 (comparative) | BE-V | 4.1 | 17.3 | 14.4 | 0.15; 0.25 |
| Device 6.2 | BE-2 | 3.6 | 22.8 | 18.8 | 0.14; 0.21 |
| Device 6.3[1] | BE-4 | 3.8 | 18.7 | 17.2 | 0.14; 0.17 |

[1]EML: 40 nm BE-4/Ir(DPBIC)$_3$/SH-6 (5:5:90)

Result: Inventive devices 6.2 and 6.3 show better color (CIEw) and better EQE compared with comparative device 6.1 (BE-V).

Device 7

Compound BE-5 with SH-5 and with Ir(DPABIC)$_3$ 40 nm H IL Plexcore AJ20-1000 10 nm Ir(DPABIC)$_3$:MoO$_3$ (50:50)—10 nm Ir(DPABIC)$_3$—40 nm BE-X/Ir(DPBIC)$_3$/SH-5 (10:5:85)—5 nm SH-5-25 nm ETM-2:Liq (50:50)—4 nm KF—100 nm Al

| Example | BE-X | Voltage M | Lum Eff [lm/W] | CIEx, y |
|---|---|---|---|---|
| Device 7.1 (comparative) | BE-V | 5.0 | 17.0 | 0.15; 0.26 |
| Device 7.2[1] | BE-5 | 3.5 | 20.5 | 0.15; 0.20 |

[1]40 nm BE-5/Ir(DPBIC)$_3$/SH-5 (15:35:50)

Result: Inventive device 7.2 shows better color (CIE$_y$) and better luminous efficacy compared with comparative example device 7.1 (BE-V).

Further Device (Device 8) Comprising Compound BE-4 with SH-5 and with Ir(DPABIC)$_3$ Same device setup as device 7, only BE-X=BE-4 and using 60 nm BE-4/Ir(DPBIC)$_3$/SH-5 (5:10:85) shows even better CIE coordinates: (0.14; 0.15).

Further Device (Device 9) Comprising Compound BE-7

By replacement of the emitter materials mentioned in devices 1 to 7 by the emitter material BE-7 luminescent organic light-emitting devices emitting blue light having a high color purity are obtained.

Device 10:

Compound BE-9 and BE-10 with SH-3

40 nm HIL Plexcore AJ20-1000-10 nm Ir(DPBIC)$_3$:MoO$_3$ (50:50)—10 nm Ir(DPBIC)$_3$—40 nm BE-X/Ir(DPBIC)$_3$/SH-3 (10:15:75)—5 nm SH-3-25 nm ETM-2:Liq (50:50)—4 nm KF—100 nm Al

| Example | BE-X | Voltage [V] | LumEff [lm/W] | EQE [%] | CIE x, y | relative LT |
|---|---|---|---|---|---|---|
| Device 9.1[1] (comparative) | BE-V | 4.1 | 15.8 | 11.7 | 0.15; 0.26 | 100 |
| Device 9.2 | BE-9 | 4.4 | 17.1 | 15.1 | 0.15; 0.21 | 170 |
| Device 9.3 | BE-10 | 4.3 | 18.4 | 15.6 | 0.15; 0.22 | 180 |

[1]EML: 40 nm BE-V/Ir(DPBIC)$_3$/SH-3 (10:15:75)

Result: Inventive devices 9.2 and 9.3 show better color (CIEw), luminous efficacy, better EQE and better lifetime compared with comparative device 9.1 (BE-V).

Further Device (Device 11) comprising Compound BE-11

By replacement of the emitter materials mentioned in device 10 by the emitter material BE-11 luminescent organic light-emitting devices emitting blue light having a high color purity are obtained.

Device 12:

Mixture of compounds BE-3 to BE-6 with SH-3

10 nm HIL HATCN—70 nm Ir(DPBIC)$_3$:MoO$_3$ (90:10)—10 nm Ir(DPBIC)$_3$—40 nm BE-X/Ir(DPBIC)$_3$/SH-3 (10:20:70)—5 nm SH-3-25 nm ETM-2:Liq (50:50)—4 nm KF—100 nm Al

| Example | BE-X | Voltage [V] | LumEff [lm/W] | EQE [%] | CIEx, y |
|---|---|---|---|---|---|
| Device 12 | BE-3 to BE-6 | 3.8 | 17.4 | 13.5 | 0.15; 0.21 |

Result: Replacing the solution processed HIL (Plexcore AJ20-1000) and optimizing the HTL thickness gives similar color (CIE$_y$), voltage and EQE as device 3.4, having now all steps processed in vacuum.

The inventive compounds can be used in a pure isomeric form or as mixture of cyclometalation isomers without significant impact on the device performance.

II Synthesis of Complexes BE-1 to BE-11

General Aspects

Determination of the photoluminescence Spectra

The photoluminescence (PL) spectra of the complexes are measured on thin polymer films doped with the respective complexes. The thin films are prepared by the following procedure: a 10%-w/w polymer solution is made by dissolving 1 g of the polymer "PMMA 6N" (Evonik) in 9 g of dichloromethane, followed by stirring for one hour. 2 mg of the respective complexes are added to 0.098 g of the PMMA solution, and stirring continued for one minute. The solutions are casted by doctor-blading with a film applicator (Model 360 2082, Erichsen) with a 60 μm gap onto quartz substrates providing thin doped polymer films (thickness ca. 6 μm). The PL spectra and quantum-yields (Q.Y.) of these films are measured with the integrating-sphere method using the Absolute PL Quantum Yield Measurement System (Hamamatsu, Model C9920-02) (excitation wavelength: 400 nm).

Determination Oft the Lifetime $\tau_v$

The lifetime ($\tau_v$) of the luminescence of the complexes in the prepared films are measured by the following procedure: For excitation of the emission a sequence of short laser pulses (THG Nd-YAG, 355 nm, 1 nsec pulse length, 1 kHz repetition rate) is used. The emissions are detected by the time-resolved photon-counting technique in the multi-channel scaling modus using a combination of photomultiplier, discriminator and a multiscaler card (FAST ComTec GmbH, Model P7888). The $\lambda_{max}$, CIE x,y, Q.Y., and iv values of the photoluminescence measurements, and the full width of half maxima (FWHM) of the emission spectra values are included in the following experimental part.

i) Synthesis of Complexes BE-1 and BE-2

Synthesis of BE-1 a) Synthesis of 5-bromopyrazin-2-amine

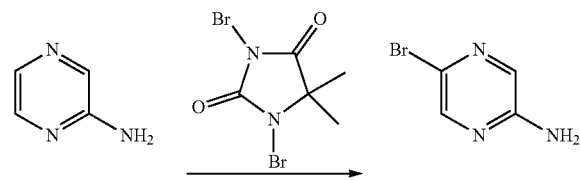

A light yellow solution of 19.0 g (0.20 mol) of 2-aminopyrazine in 40 ml of DMF and 120 ml of acetonitrile, and a light yellow solution of 30.0 g (0.10 mol) of 1,3-dibromo-5,5-dimethylhydantoin (DBH) in 20 ml of DMF and 180 ml of acetonitrile are simultaneously added during 30 minutes under argon from two dropping funnels at −5° C. to pre-cooled 20 ml of acetonitrile. After addition the resulting brown solution is treated with 40 ml of a 10%-solution of sodium thiosulfate at −5° C. providing a brown suspension and stirring continued until room temperature is reached. The reaction mixture is concentrated under vacuum and 180 ml of aqueous 2%-solution of sodium carbonate added, followed by the addition of 10 g of Hyflo® filter aid. The mixture is stirred for 30 minutes, filtered, and four times extracted with a 3:2-mixture of ethyl acetate and hexane. The combined organic phases are dried over sodium sulfate and concentrated under vacuum, providing a dark oil which is further suspended in hexane and filtered giving a tacky solid. After drying under vacuum at 60° C. a viscous oil is obtained which is dissolved in 100 ml of ethyl acetate and the resulting suspension filtered through a 5 cm layer of silica gel followed by rinsing the silica gel with 200 ml of ethyl acetate. The reddish brown solution is treated with activated charcoal DARCO® KB-G and stirred at room temperature during 24 hours followed by filtration and concentration under vacuum, giving the title product as light yellow viscous oil (yield: 25.0 g (72%)). $^1$H-NMR (400 MHz, d$_6$-DMSO): δ=6.64 (s, 1H), 7.68 (s, 1H), 8.03 (s, 1H).

b) Synthesis of 5-ethylpyrazin-2-amine

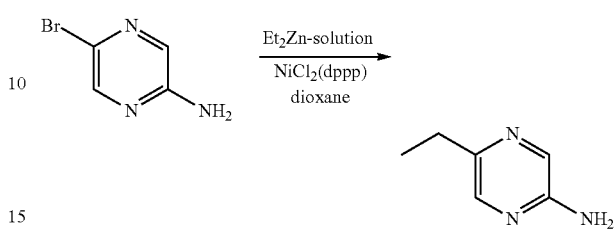

28.7 g (165 mmol) of 5-bromopyrazin-2-amine and 1.78 g (3.28 mmol) of [1,3-bis(diphenylphosphino)propane]dichloronickel(II) are suspended in 400 ml of dioxane at room temperature under argon. 300 g of a 15 wt %-solution (1.1 M) of diethylzinc in toluene are slowly added at 12° C. during 90 minutes giving a turbid brown solution. The reaction temperature is raised to 21° C. during one hour and the reaction completed by stirring at 21° C. for an 90 minutes. 30 ml of methanol are slowly added by controlling the temperature to 21° C. by cooling. The resulting solution is concentrated under vacuum and further suspended in 600 ml of toluene followed by the addition of 50 g of Hyflo® filter aid. The mixture is stirred during 30 minutes and filtered over a layer of Hyflo® filter aid. The solid filter residue is washed first with 1000 ml of toluene and 1000 ml of ethyl acetate and the combined filtrates concentrated under vacuum. An additional amount of crude product is obtained by washing the solid filter residue with 1500 ml of a 90:10-mixture of dichloromethane/methanol and concentrating the filtrate under vacuum. The concentrated fractions are each suspended in dichloromethane followed by filtration and concentration of the filtrates under vacuum giving the title product as light beige viscous oil (yield: 20.1 g (99%)). $^1$H-NMR (400 MHz, CDCl$_3$): δ=1.26 (t, 3H), 2.70 (q, 2H), 4.36 (br. s, 2H), 7.88 (s, 1H), 7.99 (s, 1H).

c) Synthesis of 3-bromo-5-ethyl-pyrazin-2-amine

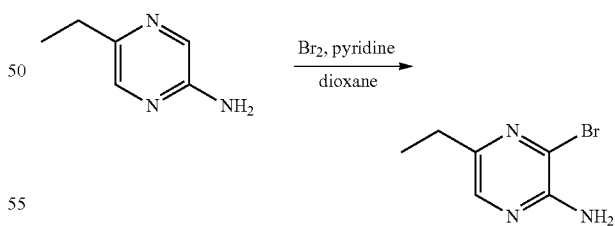

21.0 g (0.171 mol) of 5-ethylpyrazin-2-amine and 14.3 g (0.181 mol) of pyridine are dissolved in 600 ml of dioxane. 27.35 g (0.171 mol) of bromine are slowly added at room temperature during 30 minutes during which the temperature rises to 39° C. The brown reaction mixture is further stirred during 20 minutes and quenched with 20 ml of water and cooled down under stirring to 28° C. during 15 minutes. The organic phase is separated and filtered through silica gel (4 cm layer). The organic phase is separated and filtered through a 4 cm layer of silica gel followed by rinsing with 50 ml of dioxane. The filtrate is concentrated under vacuum giving the title product as colorless oil (yield: 18.3 g (53%)).
$^1$H-NMR (400 MHz, $d_6$-DMSO): δ=1.23 (t, 3H), 2.65 (q, 2H), 5.16 (br. s, 2H), 7.78 (s, 1H).

d) Synthesis of 5-ethyl-N2,N3-diphenyl-pyrazine-2,3-diamine

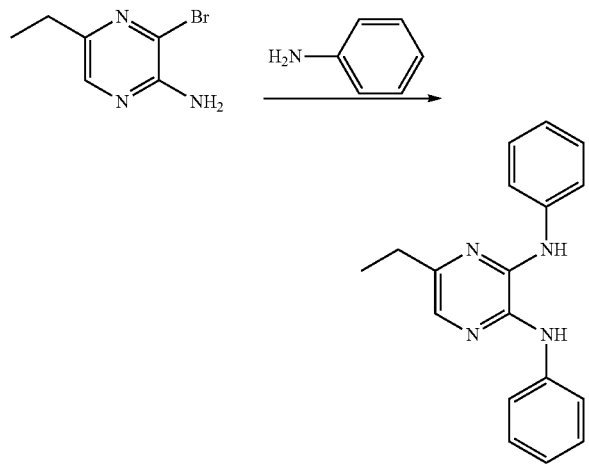

10.1 g (50.0 mmol) of 3-bromo-5-ethyl-pyrazin-2-amine and 465 g of aniline are heated under argon at 146° C. during 28 hours. The brown suspension is concentrated under vacuum and the residue treated with water followed by acidification with aqueous HCl giving a dark suspension which is vigorously stirred during 15 minutes. The mixture is treated with 200 ml of hexane and stirring vigorously continued during one hour. The liquid phase is separated and the tacky residue taken up in dichloromethane and extracted two times with 100 ml of water. The organic layer is concentrated under vacuum and the residue dissolved in toluene followed by filtration through a 4 cm layer of silica gel and additional rinsing of the silica gel layer with plenty of toluene. The combined organic phases are concentrated under vacuum and further purified by chromatography (silica gel, toluene/hexane). The title product is obtained as light brown clear viscous oil (yield: 6.1 g (42%)).
$^1$H-NMR (400 MHz, ds-DMSO): δ=1.22 (t, 3H), 2.57 (q, 2H), 6.92-7.02 (m, 2H), 7.26-7.37 (m, 4H), 7.48 (s, 1H), 7.61 (dd, 2H), 7.74 (dd, 2H), 8.42 (s, 1H), 8.51 (s, 1H).

e) Synthesis of 5-ethyl-1,3-diphenyl-imidazo[4,5-b]pyrazin-3-ium tetrafluoroborate

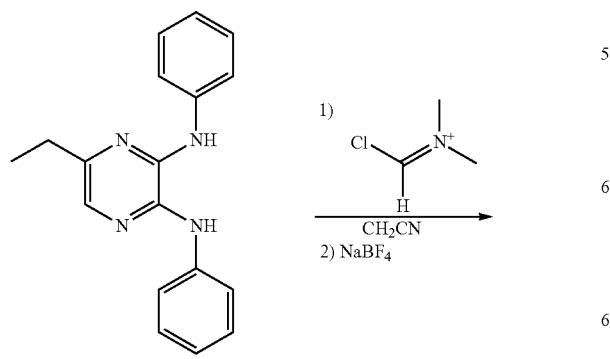

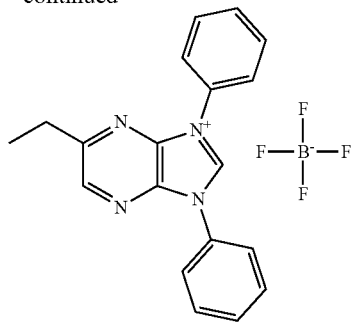

6.8 g (23.4 mmol) of 5-ethyl-N2,N3-diphenyl-pyrazine-2,3-diamine are suspended under argon in 80 ml of acetonitrile and cooled down to ice-bath temperature. 7.5 g (58.5 mmol) of (chloromethylene)dimethylammonium chloride (Vilsmeier reagent) are added in small portions during under cooling at 0° C. and stirring continued for two hours. Stirring is continued over an ice-bath for a further 20 hours during which the temperature slowly reached 21° C. The brown solution is treated with 10.3 g (93.8 mmol) of sodium tetrafluoroborate and stirring continued at 21° C. during 20 hours providing a light brown suspension. The suspension is filtered and the solid washed with 20 ml of acetonitrile. The filtrate is concentrated under vacuum giving 16.3 g of a brown viscous oil which is heated up with 30 ml of ethanol. The brown solution is cooled down and the resulting suspension further stirred at 0° C. during 30 minutes followed by filtration and washing with 20 ml of cold ethanol. The solid is dried under vacuum giving the title product as beige solid (yield: 4.8 g (72%)). $^1$H-NMR (400 MHz, $d_6$-DMSO): δ=1.36 (t, 3H), 3.12 (q, 2H), 7.73-7.87 (m, 6H), 8.00-8.08 (m, 4H), 9.01 (s, 1H), 11.07 (s, 1H).

f) Synthesis of 2-ethoxy-5-ethyl-1,3-diphenyl-2H-imidazo[4,5-b]pyrazine

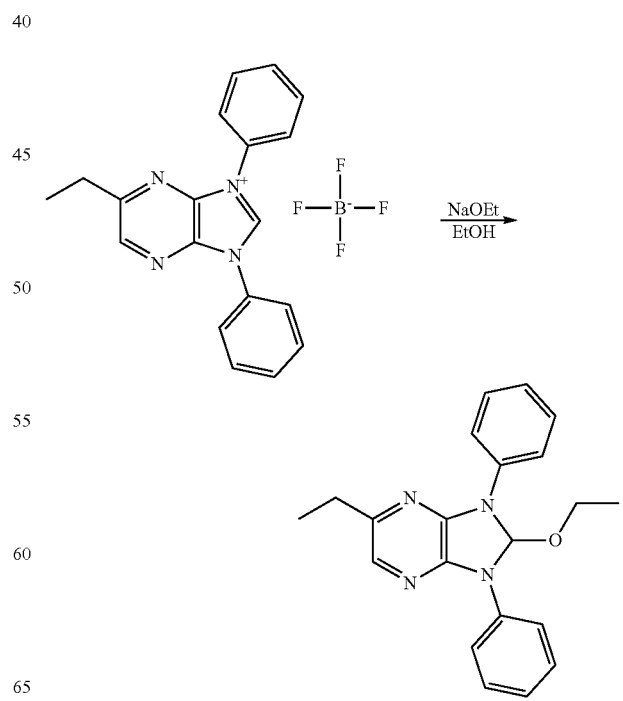

4.7 g (12.1 mmol) of 5-ethyl-1,3-diphenyl-imidazo[4,5-b]pyrazin-3-ium tetrafluoroborate are suspended under argon in 40 ml of ethanol and cooled down to ice-bath temperature. 3.93 g (12.1 mmol) of a 21 wt % solution of sodium ethoxide in ethanol are slowly added under cooling during 15 minutes. The ice-bath is removed and stirring continued during 30 minutes giving a light beige suspension. The suspension is filtered and the solid washed with a small amount of ethanol. The filtrate is concentrated under vacuum giving the title product as beige viscous oil (yield: 4.2 g (quantitative). $^1$H-NMR (400 MHz, d$_6$-DMSO): δ=0.90 (t, 3H), 1.25 (t, 3H), 2.61 (q, 2H), 3.17 (q, 2H), 7.17 (q, 2H), 7.41 (s, 1H), 7.47 (q, 4H), 7.73 (s, 1H), 8.05 (d, 2H), 8.10 (d, 2H).

g) Synthesis of Complex BE-1

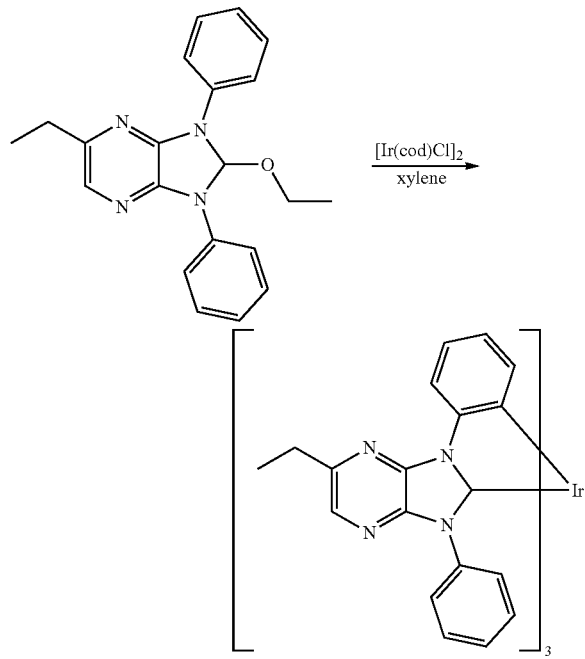

4.0 g (11.6 mmol) of 2-ethoxy-5-ethyl-1,3-diphenyl-2H-imidazo[4,5-b]pyrazine and 0.97 g (1.4 mmol) of chloro(1,5-cyclooctadiene)iridium(I) dimer are suspended under argon in 30 ml of o-xylene. The suspension is four times evacuated and backfilled with argon, followed by heating at 134° C. during 140 minutes. The dark brown clear solution is cooled down to room temperature and diluted with 40 ml of hexane followed by filtration and washing with 100 ml of hexane. The solid is three times suspended with 20 ml of ethanol followed by filtration and washing with 20 ml of ethanol. The solid is further suspended in hexane followed by filtration and washing four times with 20 ml of methanol and drying under vacuum. The resulting grey powder is dissolved in 10 ml of dichloromethane and filtered through a 4 cm layer of silica gel followed by rinsing with 80 ml of dichloromethane under the exclusion of light. The combined filtrate is diluted with 30 ml of ethanol and concentrated under vacuum to one fifth of the volume giving a light yellow suspension which is filtered, and the resulting solid further washed with ethanol. The solid is heated up in a mixture of 30 ml of 2-butanone and 5 ml of toluene and stirring continued for 30 minutes. The yellow suspension is cooled down to room temperature, filtered, and the resulting solid further dried under vacuum giving the title product as a light yellow powder (yield: 1.33 g (42%)). $^1$H-NMR (400 MHz, CDCl$_3$): 3=1.20-1.34 (m, 6H), 1.44-1.62 (m, 6H), 2.70-2.84 (m, 3H), 2.96-3.11 (m, 3H), 6.21-7.27 (2 m and br. s, 24H), 7.90-8.00 and 8.15-8.25 (2 m, 3H), 8.71-8.80 and 8.81-8.90 (2 m, 3H). APCI-LC-MS (positive, m/z): exact mass of $C_{57}H_{45}IrN_{12}$=1090.35; found 1091.2 [M+1]$^+$.

Photoluminescence data (2% film in PMMA): $λ_{max}$=471 nm, CIE x,y=(0.15, 0.22), Q.Y.=96%, $τ_v$=3.3 µs.

Synthesis of BE-2 a) Synthesis of 5-isobutylpyrazin-2-amine

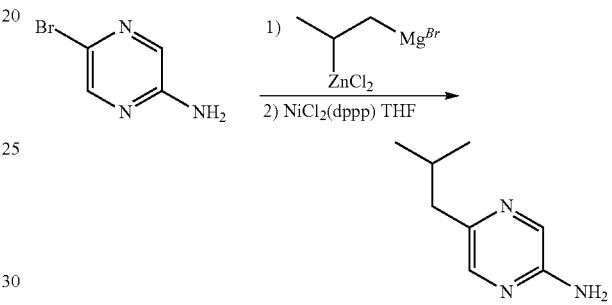

14.59 g (0.60 mol) of magnesium shavings are suspended under argon in 50 ml of tetrahydrofuran. 91.35 g (0.66 mol) of 1-bromo-2-methylpropane in 200 ml of tetrahydrofuran are slowly added during 45 minutes by carefully regulating the exothermy of the Grignard reaction by cooling with an ice-bath keeping the reaction temperature at a maximum of 54° C. The grey suspension is further stirred during 30 minutes and allowed to cool down to room temperature. A colorless solution of 40.89 g (0.30 mol) of anhydrous zinc chloride in 200 ml of tetrahydrofuran is added during 10 minutes and the released exothermy carefully regulated with an ice-bath keeping the temperature at a maximum of 48° C. The resulting grey thick suspension is further stirred during 75 minutes until the temperature reaches 25° C. A solution of 17.4 g (0.10 mol) of 2-bromo-5-aminopyrazine in 200 of tetrahydrofuran and 1.08 g (2.0 mmol) of [1,3-bis(diphenylphosphino)propane]dichloronickel(II) are sequentially added and the temperature increased up to 48° C. during 45 minutes giving a light brown solution. Stirring is continued for 15 minutes at the same temperature and the solution cooled down to room temperature. The solution is slowly treated with 25 ml of water and 40 ml of concentrated HCl followed by stirring and dilution of the mixture with 300 ml of water. Aqueous ammonia solution is added until basic pH is reached and the resulting suspension further stirred together with 400 ml of toluene and 40 g of Hyflo® filter aid followed by filtration. The organic phase is separated and three times extracted with 250 ml of water, followed by drying over sodium sulfate and concentration under vacuum giving the title product as a light yellow oil (yield: 12.4 g (82%)). $^1$H-NMR (400 MHz, CDCl$_3$): δ=0.89 (d, 6H), 1.92-2.04 (d, 1H), 2.49 (d, 2H), 4.59 (br. s, 2H), 7.79 (s, 1H), 7.94 (s, 1H).

b) Synthesis of 3-bromo-5-isobutyl-pyrazin-2-amine

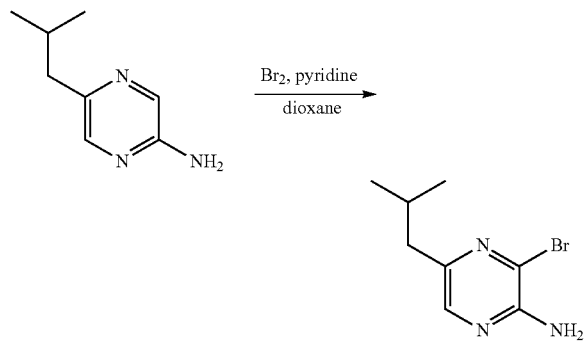

12.38 g (81.9 mmol) of 5-isobutylpyrazin-2-amine and 6.86 g (86.7 mmol) of pyridine are dissolved under argon in 100 ml of dioxane. 13.08 g (81.8 mmol) of bromine are slowly added at a temperature of 21° C. during 45 minutes, controlling the temperature by the use of an ice-bath. The brown biphasic solution is vigorously stirred during 50 minutes and treated with 75 ml of water. The resulting brown suspension is extracted with 200 ml of ethyl acetate and the organic phase washed three times with 100 ml of water, followed by drying over sodium sulfate, filtration and concentration under vacuum. The resulting dark oil is further purified by chromatography (silica gel, heptane/ethyl acetate) giving the title product as a light yellow solid (yield: 14.5 g (77%)). $^1$H-NMR (400 MHz, $d_6$-DMSO): δ=0.86 (d, 6H), 1.81-1.97 (m, 1H), 2.40 (d, 2H), 6.44 (s, 2H), 7.82 (s, 1H).

c) Synthesis of 5-isobuty-N2,N3-diphenyl-pyrazine-2,3-diamine

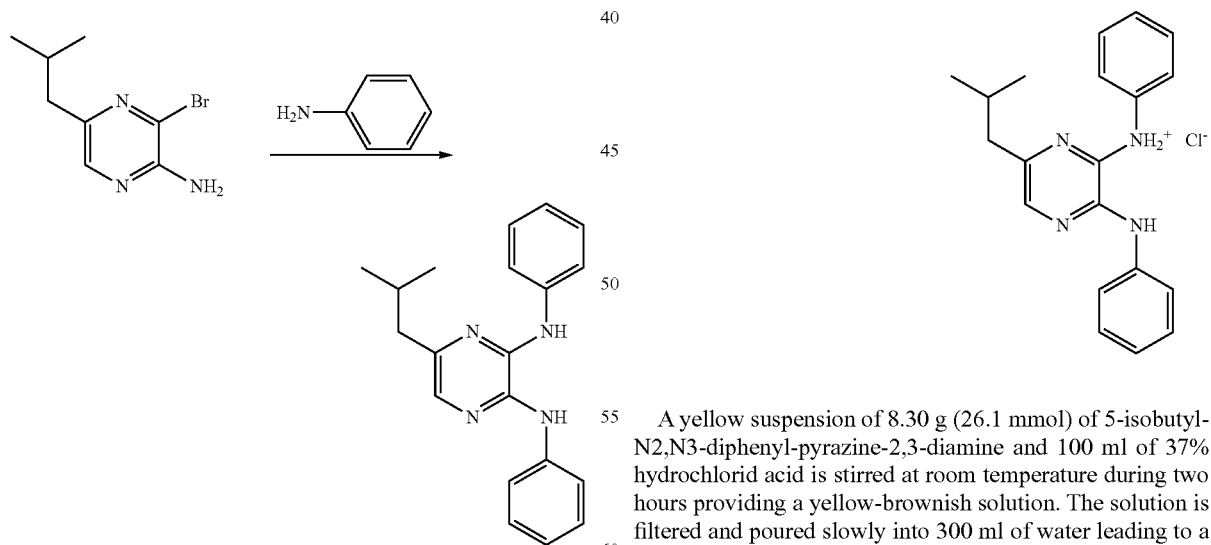

12.4 g (53.9 mmol) of 3-bromo-5-isobutyl-pyrazin-2-amine and 250 g of aniline are heated under argon at 152° C. during 28 hours. The brown suspension is diluted with 200 ml of toluene and extracted three times with 200 ml of water, and the organic phase concentrated under vacuum. The residue is stirred with aqueous 5% solution of HCl giving a precipitate which is filtered and washed with water and diluted aqueous ammonia solution. The sticky solid is dissolved in 300 ml of toluene and extracted with diluted ammonia solution and three times with 200 ml of water. The organic phased is dried over sodium sulfate and concentrated under vacuum. The dark viscous oil is purified by chromatography (silica gel, hexane/ethyl acetate) giving the title product as light yellow solid (yield: 8.9 g (52%)). $^1$H-NMR (400 MHz, $d_6$-DMSO): δ=0.92 (d, 6H), 1.95-2.11 (m, 1H), 2.41 (d, 2H), 6.92-7.02 (m, 2H), 7.26-7.36 (m, 4H), 7.44 (s, 1H), 7.62 (dd, 2H), 7.71 (dd, 2H), 8.39 (s, 1H), 8.47 (s, 1H).

d) Synthesis of (3-anilino-6-isobutyl-pyrazin-2-yl)-phenyl-ammonium chloride

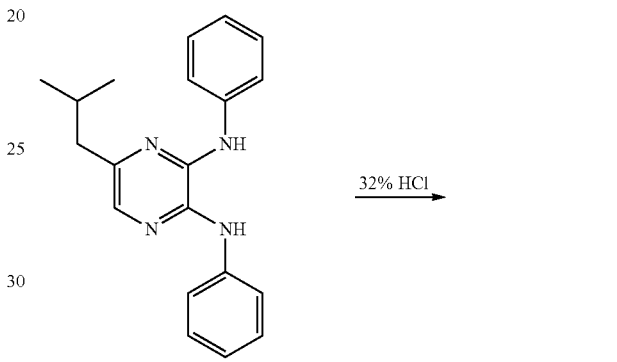

A yellow suspension of 8.30 g (26.1 mmol) of 5-isobutyl-N2,N3-diphenyl-pyrazine-2,3-diamine and 100 ml of 37% hydrochlorid acid is stirred at room temperature during two hours providing a yellow-brownish solution. The solution is filtered and poured slowly into 300 ml of water leading to a yellow precipitate which is filtered off and washed with plenty of water. The solid residue is dried under vacuum giving the title product as a yellow powder (yield: 9.1 g (99%)).

$^1$H-NMR (400 MHz, $d_6$-DMSO): δ=0.92 (d, 6H), 1.96 (m, 1H), 2.41 (d, 2H), 6.94-7.07 (m, 2H), 7.27-7.42 (m, 5H), 7.65 (d, 2H), 7.78 (d, 2H), 8.96 (br. s, 1H), 9.06 (br. s, 1H).

125 e) Synthesis of 2-ethoxy-5-isobutyl-1,3-diphenyl-2H-imidazo[4,5-b]pyrazine

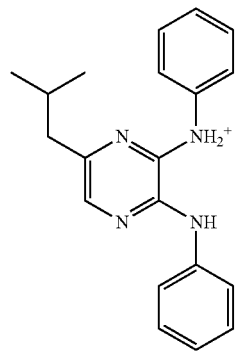

4.50 g (12.7 mmol) of (3-anilino-6-isobutyl-pyrazin-2-yl)-phenyl-ammonium chloride and 56.5 g (0.38 mol) of triethyl orthoformate are heated up under argon at 120° C. for one hour. The light brown solution is concentrated under vacuum giving the title product as brown viscous oil (yield: 4.75 g (quantitative)). $^1$H-NMR (400 MHz, d$_6$-DMSO): δ=0.85-0.99 (m, 9H), 1.99-2.14 (m, 1H), 2.37-2.50 (m, 2H), 3.17 (q, 2H), 7.13-7.22 (m, 2H), 7.43-7.52 (m, 5H), 7.73 (s, 1H), 8.03-8.12 (m, 4H).

f) Synthesis of Complex BE-2

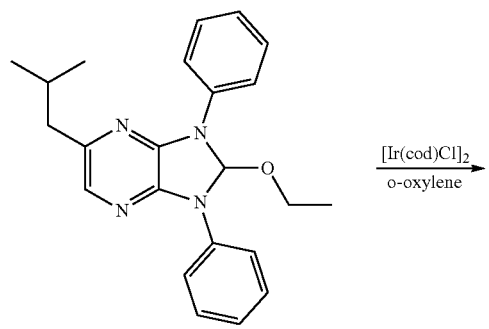

126

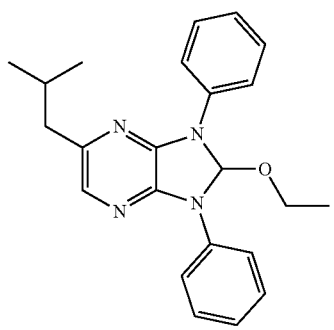

4.50 g (12.0 mmol) of 2-ethoxy-5-isobutyl-1,3-diphenyl-2H-imidazo[4,5-b]pyrazine and 1.01 g (1.5 mmol) of chloro(1,5-cyclooctadiene)iridium(I) dimer are suspended under argon in 60 ml of o-xylene. The suspension is four times evacuated and backfilled with argon, followed by heating at 122° C. during 23 hours. The brown solution is cooled down to 40° C., filtered, and diluted with 100 ml of heptane, filtered, and the solution concentrated under vacuum giving a brown viscous oil. Purification by chromatography (silica gel, heptane/dichloromethane) delivers a yellow powder which is further dissolved in 10 ml of dichloromethane and 50 ml of ethanol. Dichloromethane is stripped off under vacuum and the resulting yellow suspension filtered. The solid is dissolved in 10 ml of dichloromethane and 50 ml of acetonitrile. Dichloromethane is stripped off under vacuum and the light turbid solution further cooled down over an ice-bath. The thick suspension is filtered and the solid washed with a small amount of acetonitrile first, followed by washing with 30 ml of ethanol and 30 ml of hexane. The same dissolution and precipitation procedure is repeated once and the resulting solid dried under vacuum giving the title product as a light yellow solid (yield: 1.56 g, 44%). $^1$H-NMR (400 MHz, CDCl$_3$): δ=0.88-0.99 (m, 12H), 1.05-1.15 (m, 6H), 1.90-2.03 and 2.28-2.41 (2 m, 3H), 2.54-2.65 and 2.81-2.90 (2 m, 6H), 6.22-7.27 (br. s+2 m, 24H), 7.85-7.91 and 8.11-8.20 (2 m, 3H), 8.73-8.80 and 8.80-8.88 (2 m, 3H). APCI-LC-MS (positive, m/z): exact mass of C$_{63}$H$_{57}$IrN$_{12}$=1174.45; found 1175.3 [M+1]$^+$.

Photoluminescence data (2% film in PMMA): λ$_{max}$=470 nm, CIE x,y=(0.15, 0.21), Q.Y.=99%, τ$_v$=3.4 μs).

ii) Synthesis of Complexes BE-3, BE-4, BE-5 and BE-6

Synthesis of Intermediate A

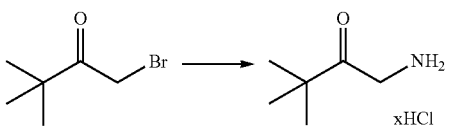

A mixture of 32.2 g (0.18 mol) 1-bromopinacolon and 20.5 g (0.22 mol) in acetonitrile (225 ml) is stirred at 55° C. for 20 h. The reaction mixture is allowed to cool to room temperature and the solid is filtered off, washed and discarded. The solvent of the filtrate is removed and the resulting solid is taken up in a mixture of 5% HCl in 2-propanol (450 ml). The reaction mixture is stirred for 48 h, then the solid is removed. Diethyl ether is added and the resulting solid is isolated by filtration and dried under vacuum to give the title product (yield: 26.2 g (96%)). ¹H-NMR (400 MHz, CDCl₃): δ=1.21 (s, 9H), 4.32 (q, 2H), 8.4 (br. s, 3H).

Synthesis of Intermediate B

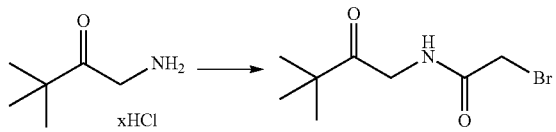

A mixture of 24.0 g (0.16 mol) intermediate A in water (115 ml) is added in small portions to a suspension of 91 g (0.91 mol) calcium carbonate in chloroform (300 ml). The reaction mixture is cooled to 5° C., and then a solution of 32.3 ml (0.36 mol) 2-bromoacetylbromide in chloroform (225 ml) is quickly added. The resulting mixture is stirred for 1.5 h, the solid is filtered off, washed with chloroform and discarded. The filtrate is sequentially washed with a 2N aqueous HCl solution, a sodium carbonate solution and water. The solvent of the separated organic phase is removed and the resulting solid is dried under vacuum to give the title product (yield: 34.5 g (93%)). ¹H-NMR (500 MHz, CD₂Cl₂): δ=1.21 (s, 9H), 3.91 (s, 2H), 4.30 (d, 2H), 7.3 (br. s, 1H).

Synthesis of Intermediate C

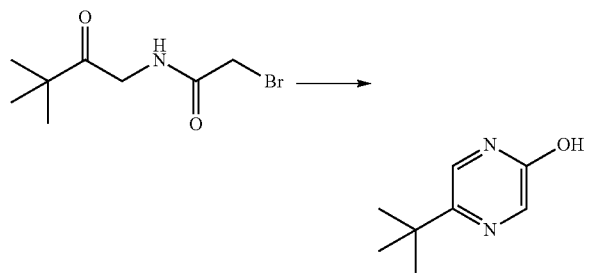

A mixture of 34.1 g (0.15 mol) intermediate B and 4.26 g (28 mmol) sodium iodide in a solution of 2M ammonia in ethanol (500 ml) is stirred at 40° C. for 48 h. The solvent of the reaction mixture is removed and ethyl acetate is added to the residue. The organic phase is washed with water and then dried over sodium sulfate. The solvent of the separated organic phase is removed and the resulting residue is dried under vacuum to give the title product (yield: 18.6 g (84%)). ¹H-NMR (400 MHz, CD₂Cl₂): δ=1.26 (s, 9H), 7.12 (s, 1H), 8.16 (s, 1H), 12.5 (br. s, 1H).

Synthesis of Intermediate D

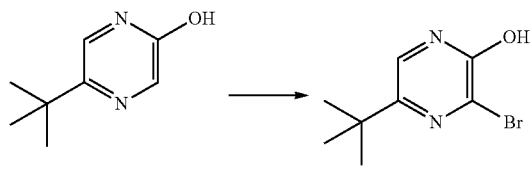

A solution of 12.5 g (78 mmol) bromine in chloroform (60 ml) is slowly added at 0° C. to a mixture of 12.5 g (82 mmol) intermediate C and 6.8 g (86 mmol) pyridine in chloroform (350 ml). The resulting mixture is stirred for a further 60 min at 0° C. Methylene chloride (400 ml) is added and then a 10% aqueous sodium thiosulfate solution. The organic layer is separated, extracted with a 1 M aqueous sodium hydroxide solution and discarded. The aqueous solution is neutralized with 2 M hydrochloric acid and extracted with methylene chloride. The organic phase is dried over sodium sulfate. The solvent of the organic phase is removed and the resulting residue is dried under vacuum to give the title product (yield: 8.7 g (46%)). ¹H-NMR (400 MHz, CD₂Cl₂): δ=1.27 (s, 9H), 7.22 (s, 1H), 12.7 (br. s, 1H).

Synthesis of Intermediate E

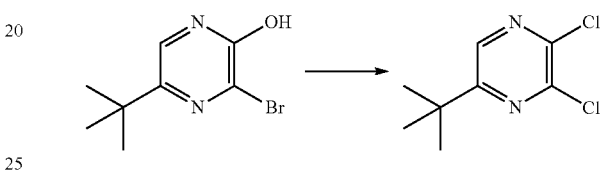

A mixture of 8.7 g (38 mmol) intermediate D, 18.0 g (0.19 mol) trimethylammonium chloride and 57 g (0.37 mol) POCl₃ are stirred at 110° C. for 20 h. After cooling to room temperature the remaining liquid is removed and the residue is taken up in methylene chloride. The mixture is poured in ice water and the phases are separated. Water is added to the organic phase and the liquid is brought to pH 11 by adding 25% aqueous sodium hydroxide. The organic layer is separated and dried over sodium sulfate. The solvent of the organic phase is removed and the resulting residue is dried under vacuum to give the title product (yield: 5.5 g (71%)). ¹H-NMR (500 MHz, CD₂Cl₂): δ=1.37 (s, 9H), 8.33 (s, 1H).

Synthesis of Intermediate F

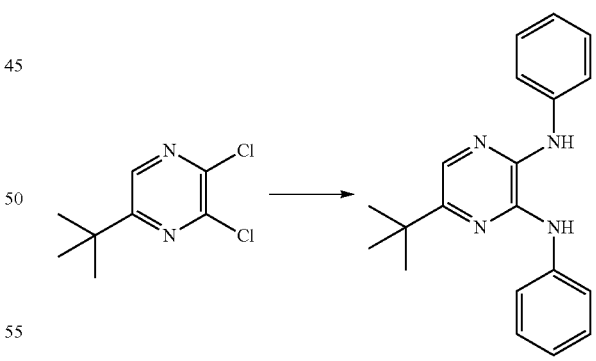

A solution of 9.2 g (45 mmol) intermediate E and 63 g (68 mmol) aniline in o-xylene (25 ml) is stirred at 160° C. for 20 h. After cooling to room temperature the remaining liquid is removed and the residue is taken up in methylene chloride. The organic phase is sequentially washed with 20% hydrochloric acid, 25% aqueous sodium hydroxide and water. The organic phase is dried over sodium sulfate. The solvent of the organic phase is removed and the resulting residue is purified by column chromatography (silica, eluent: cyclohexane/ethyl acetate) to give the title product (yield: 11.3 g (79%)). ¹H-NMR (400 MHz, CD₂Cl₂): δ=1.36 (s, 9H), 6.06 (s, 1H), 6.47 (s, 1H), 6.99 (m, 2H), 7.16 (d, 2H), 7.29 (m, 4H), 7.49 (d, 2H), 7.78 (s, 1H).

Synthesis of Intermediate G

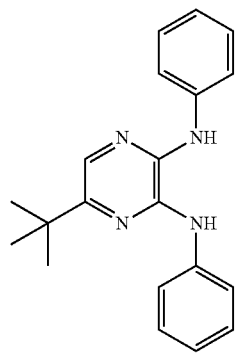 

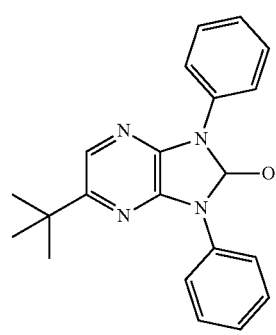

A solution of 11.2 g (35 mmol) intermediate F in a 1M solution of HCl in methanol (250 ml) is stirred at room temperature for 20 h. The solvent is removed and the resulting residue is dried under vacuum. Triethylorthoformiate (250 ml) is added and the mixture is stirred at 100° C. for 1 h. The solvent is removed and the resulting residue is dried to give the title product (yield: 12.5 g (98%)). ¹H-NMR (400 MHz, CD₂Cl₂): δ=1.04 (t, 3H), 1.38 (s, 9H), 3.30 (q, 2H), 7.12-7.19 (m, 2H), 7.26 (s, 1H), 7.41-7.48 (m, 4H), 7.55 (s, 1H), 8.07 (d, 2H), 8.17 (d, 2H).

Synthesis of BE-3, BE-4, BE-5 and BE-6

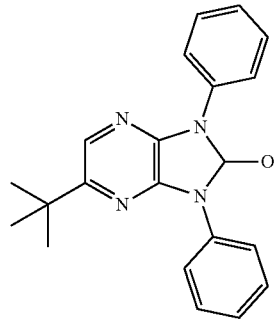 

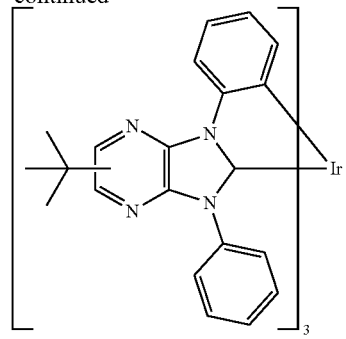

A mixture of 5.0 g (13 mmol) intermediate G and 0.9 g (1.3 mmol) [Ir(cod)Cl]₂ in o-xylene (300 ml) is stirred at reflux for 5 h. The solvent is removed, the residue is taken up in a 1:1 mixture of acetonitrile and acetone (100 ml) and stirred for 16 h. The solid (containing BE-3-BE-5) is isolated by filtration and and the isomers are separated and purified by column chromatography on silica. The solvent of the acetonitrile/acetone filtrate is removed and the residue (containing BE-5-BE-6) is purified by column chromatography on silica.

BE-3

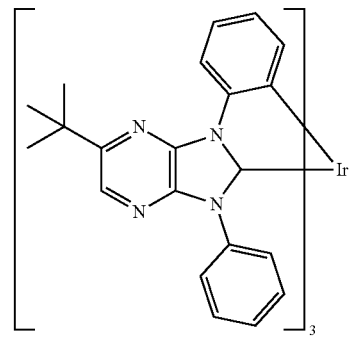

Yield: 155 mg (5%). ¹H-NMR (400 MHz, CD₂Cl₂): δ=1.30 (s, 27H), 6.2-7.1 (br. m, 12H), 6.65 (d, 3H), 6.72-6.82 (m, 6H), 7.13 (t, 3H), 8.39 (s, 3H), 8.74 (d, 3H). PL (2% in PMMA): $\lambda_{max}$=468 nm, CIE x,y=(0.14, 0.20), Q.Y.=89%, $\tau_v$=2.9 μs.

BE-4

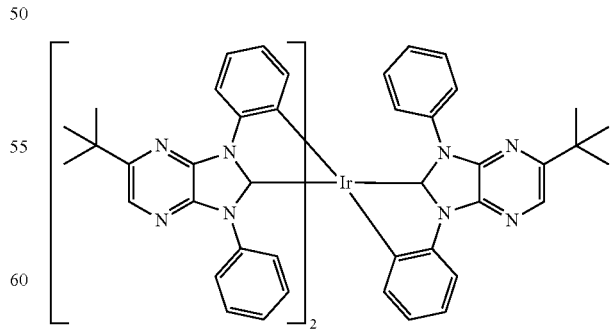

Yield: 730 mg (23%). ¹H-NMR (400 MHz, CD₂Cl₂): δ=1.29 (s, 9H), 1.30 (s, 9H), 1.55 (s, 9H), 6.2-7.2 (m, 24H), 8.09 (s, 1H), 8.38 (s, 1H), 8.40 (s, 1H), 8.71 (d, 1H), 8.74 (d, 1H), 8.82 (d, 1H).

PL (2% in PMMA): $\lambda_{max}$=467 nm, CIE x,y=(0.14, 0.19), Q.Y.=99% $\tau_v$=2.9 µs.

BE-5

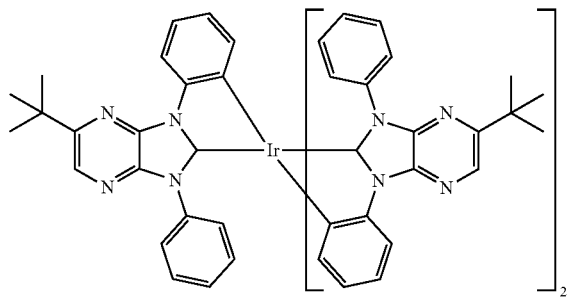

Yield: 750 mg (24%). $^1$H-NMR (400 MHz, CD$_2$Cl$_2$): δ=1.30 (s, 9H), 1.55 (s, 9H), 1.56 (s, 9H), 6.2-7.3 (m, 24H), 8.09 (s, 1H), 8.10 (s, 1H), 8.39 (s, 1H), 8.72 (d, 1H), 8.79 (d, 1H), 8.83 (d, 1H).

PL (2% in PMMA): $\lambda_{max}$=466 nm, CIE x,y=(0.14, 0.18), Q.Y.=99% $\tau_v$, =2.8 µs.

BE-6

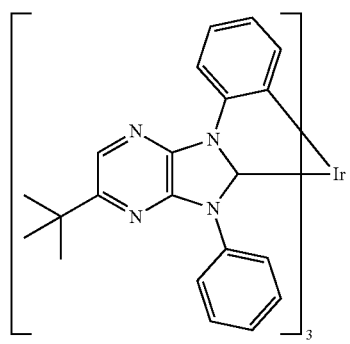

Yield: 180 mg (6%). $^1$H-NMR (400 MHz, CD$_2$Cl$_2$): d=1.55 (s, 27H), 6.1-7.3 (m, 24H), 8.10 (s, 3H), 8.82 (d, 3H).

PL (2% in PMMA): $\lambda_{max}$=466 nm, CIE x,y=(0.15, 0.18), Q.Y.=96% $\tau_v$=2.8 µs.

iii) Synthesis of BE-8, BE-9 and BE-10 a) Synthesis of Intermediate B

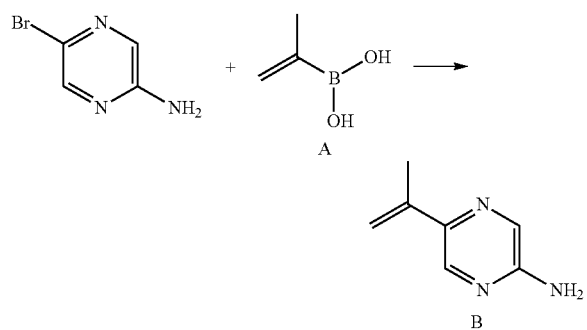

Reagent A: A solution of Isopropenylmagnesiumbromide (0.5 M in THF, 32.1 mL) is slowly added to a mixture of 3.4 g (32 mmol) Trimethylborate in dry THF (20 mL) at −78° C. The reaction is stirred overnight to room temperature. The resulting suspension is poured into 50 mL saturated ammonium chloride solution between −10 and 0° C. The clear aqueous solution is extracted three times with diethyl ether (65 mL). The organic layer is then washed once with saturated sodium chloride solution (25 mL) and then this organic layer is dried over magnesium sulfate. The solvent is removed under vacuum and the white solid is stored under argon. $^1$H-NMR (400 MHz, DMSO): δ=1.72 (s, 3H), 5.45 (s, 1H), 5.60 (s, 1H), 7.58 (s, 2H).

Intermediate B: Then a mixture of 1.44 g (8.02 mmol) 2-Amino-5-brompyrazine 97%, the in advance prepared reagent A (raw product) and 6.81 g (32.1 mmol) potassium phosphate in 100 mL dry toluene is purged with argon for 10 minutes. Then, 147 mg (0.160 mmol) Tris(dibenzylidenacetone)dipalladium(0) and 180 mg (0.642 mmol) Tricyclohexylphosphine are added. The reaction is stirred under reflux overnight. After cooling to room temperature, the suspension is filtered. The solvent of the filtrate is removed and the resulting residue is purified by column chromatography (silica, eluent: toluene/ethyl acetate) to give the intermediate B (yield: 1.01 g (94%)).

$^1$H-NMR (400 MHz, CD$_2$Cl$_2$): δ=2.13 (s, 3H), 4.62 (s, 2H), 5.11 (s, 1H), 5.72 (s, 1H), 7.94 (s, 1H), 8.16 (s, 1H).

b) Synthesis of Intermediate C

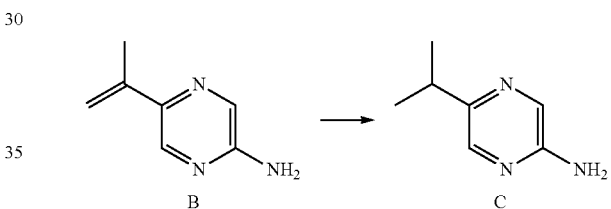

1.01 g (7.47 mmol) of compound B are dissolved in ethyl acetate (50 ml). The reaction is purged with nitrogen, and then Pd/C 10% (84 mg) is added to the clear, yellow solution. The suspension is stirred at room temperature overnight at a constant hydrogen atmosphere. After 12 h hydrogenation there is still starting material detectable in the reaction mixture, so after filtration of the reaction mixture over a filter, the filtrate is treated a second time with Pd/C, 10% (84 mg) and hydrogen at room temperature overnight. Then the suspension is filtered and the filtrate is concentrated. The title product C is obtained in quantitative yield.

$^1$H-NMR (400 MHz, CD$_2$Cl$_2$): δ=1.23 (d, 3H), 1.24 (d, 3H), 2.93 (sept, 1H), 4.45 (s, 2H), 7.84 (d, 1H), 7.91 (d, 1H).

c) Synthesis of Intermediate D

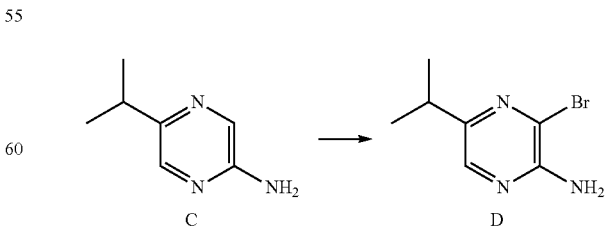

3.59 g (26.17 mmol) of intermediate C and 2.17 g (27.48 mmol) of pyridine are dissolved in 180 mL of chloroform. The solution is cooled to 0° C. Then, a solution of 3.97 g (24.86 mmol) of bromine in 35 mL chloroform is slowly added over 1.5 h. The mixture is stirred for 1.5 h at 0° C. The reaction was then allowed to warm to room temperature and to stir overnight.

The brown reaction mixture is slowly quenched with 150 mL of saturated sodium thiosulfate solution. This mixture is then stirred for 30 minutes. Then the mixture is separated in a separation funnel. The organic layer is washed with water and dried over sodium sulfate. The filtrate is concentrated and the residue is filtered over silica with toluene/ethyl acetate. The fractions with product are collected and concentrated to give the title product D as brown oil in 79.3% yield (4.26 g).

$^1$H-NMR (400 MHz, CD$_2$Cl$_2$): δ=1.23 and 1.24 (2d, 6H), 2.86-2.98 (m, 1H), 4.89 (s, 2H), 7.82 (s, 1H).

d) Synthesis of Intermediate E (and F1)

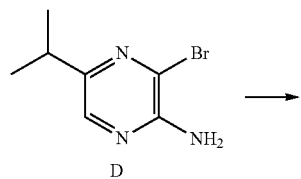

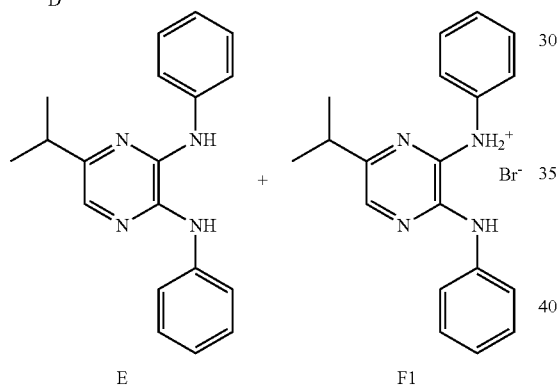

4.26 g (19.7 mmol) of intermediate D are stirred in 210 ml of aniline under argon atmosphere. The reaction is heated to reflux and stirred overnight. After cooling to room temperature, the reaction mixture is filtered under vacuum. The filtrate is concentrated. After removal of aniline (50° C., 3*10$^{-2}$ mbar), the brown residue is suspended in a mixture of dichloromethane (100 ml) and cyclohexane (300 ml). The suspension is filtered and the solid is washed with cyclohexane (2×100 ml). The solid was washed with water (50 ml, 12 h stirring) and dried to give the title product F1 (yield: 2.4 g (31%)).

The dichloromethane/cyclohexane filtrate is concentrated and the residue is purified via column chromatography (silica, CH/EE) to obtain intermediate E (1.5 g, 25%).

Intermediate E: $^1$H-NMR (400 MHz, CD$_2$Cl$_2$): δ=1.29 and 1.30 (2d, 6H), 2.92-3.02 (sept, 1H), 6.06 (s, 1H), 6.46 (s, 1H), 7.00 (q, 2H), 7.16 (d, 2H), 7.29 (q, 4H), 7.65 (s, 1H), intermediate F1: $^1$H-NMR (400 MHz, CD$_2$Cl$_2$): δ=1.21 and 1.22 (2d, 6H), 2.81-2.97 (sept, 1H), 5.04 (s, 1H), 6.94-7.09 (m, 2H), 7.34 (t, 4H), 7.41 (s, 1H), 7.60 (d, 2H), 7.78 (d, 2H), 8.18 (s, 1H), 8.70 (s, 1H).

e) Synthesis of Intermediate F2

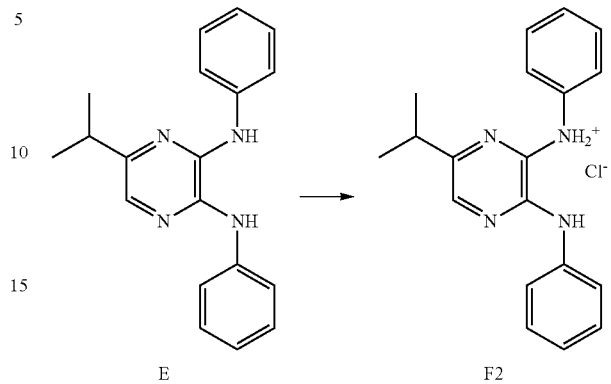

0.65 g (2.1 mmol) of intermediate E are suspended in 17 ml of hydrochloric acid (32%) at room temperature. The mixture is stirred overnight under nitrogen atmosphere. The brown lump is treated in an ultrasonic bath until a green precipitate is formed. This is filtered and washed with water. The solid is dried at 40° C. overnight. The desired product F$_2$ is obtained as light yellow solid (0.73 g, 78%).

$^1$H-NMR (400 MHz, CD$_2$Cl$_2$): δ=1.21 and 1.22 (2d, 6H), 2.81-2.95 (m, 1H), 3.95 (s, 1H), 6.93-7.07 (m, 2H), 7.33 (t, 4H), 7.39 (s, 1H), 7.63 (d, 2H), 7.84 (d, 2H), 9.02 (s, 1H), 9.16 (s, 1H).

f) Synthesis of Intermediate G

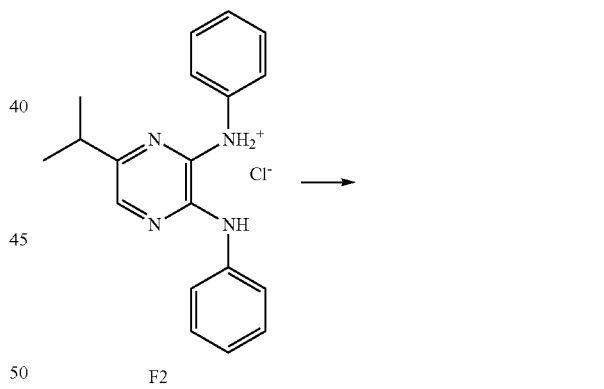

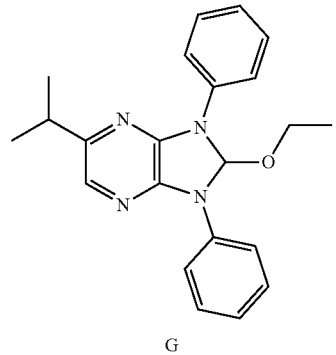

589 mg (1.73 mmol) of intermediate F2 are suspended in 24 ml of triethyl orthoformate. The suspension is stirred at room temperature overnight. Then the reaction is heated to 70° C. for 2 h. The brown suspension is filtered under vacuum and the residue is washed with ethanol. The filtrate is concentrated under vacuum to give the title product G in 91% yield (0.57 g).

$^1$H-NMR (400 MHz, CD$_2$Cl$_2$): δ=1.04 (t, 3H), 1.31 and 1.32 (2d, 6H), 2.88 (sept, 1H), 3.29 (q, 2H), 7.10-7.20 (m, 2H), 7.24 (s, 1H), 7.37-7.49 (m, 5H), 8.06 (d, 2H), 8.13 (d, 2H).

g) Synthesis of BE-8, BE-9 and BE-10

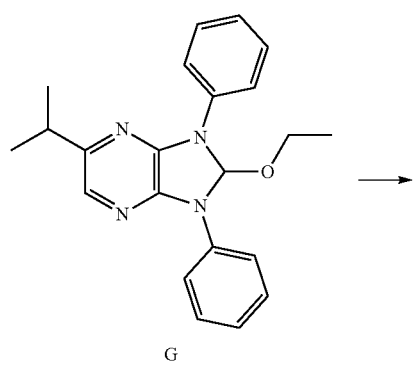

G

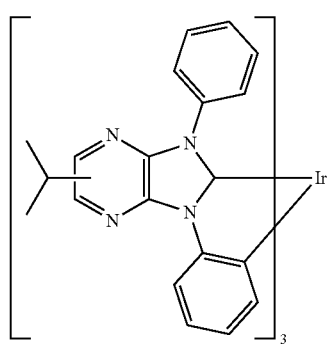

BE-8 - BE-10

500 mg (1.39 mmol) of intermediate G are suspended in 10 ml of anhydrous o-xylene under argon atmosphere. The mixture is purged 10 minutes with argon. Then 93 mg (0.14 mmol) [Ir(cod)Cl]$_2$ are added. The reaction is heated to reflux and stirred overnight. After cooling to room temperature, the mixture is concentrated under vacuum. The brown residue is suspended in ethanol and then filtered under vacuum. The solid is washed a few times with ethanol. After drying at 40° C. overnight, the solid is purified via column chromatography (silica, eluent: cyclohexane/ethyl acetate) to yield BE-8, BE-9 and BE-10.

BE-8

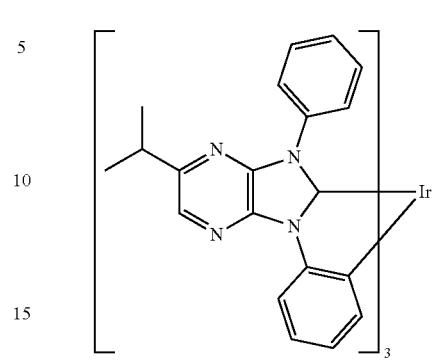

BE-8

30 mg (10%) BE-8
$^1$H-NMR (400 MHz, CD$_2$Cl$_2$): δ=1.20 (d, 6H), 1.23-1.30 (m, 12H), 3.04 (sept, 3H), 6.48 (m, 7H), 6.63 (d, 4H), 6.73-6.82 (q, 7H), 7.13 (t, 3H), 7.13-7.52 (m, 3H), 8.23 (s, 3H), 8.74 (d, 3H).
PL (2% PMMA): λ$_{max}$=469 nm, CIE(x;y)=0.15; 0.21, QY=88%, τ$_v$=3.3 μs

BE-9

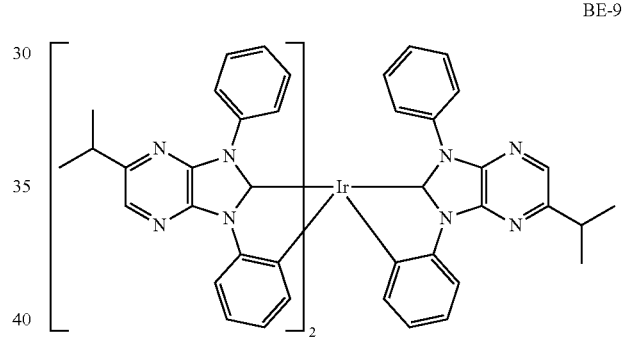

BE-9

89 mg (28%) BE-9
$^1$H-NMR (400 MHz, CD$_2$Cl$_2$): δ=1.20 (m, 6H), 1.25-1.50 (m, 12H), 2.97-3.10 (m, 2H), 3.22-3.34 (septet, 1H), 6.25-7.32 (m, 10H), 6.65 (d, 4H), 6.72-6.84 (m, 7H), 7.09-7.19 (m, 4H), 7.92 (s, 1H), 8.22 and 8.23 (2s, 2H), 8.73 (t, 2H), 8.83 (d, 1H).
PL (2% PMMA): λ$_{max}$=468 nm, CIE(x;y)=0.15; 0.21, QY=86%, τ$_v$=3.2 μs

BE-10

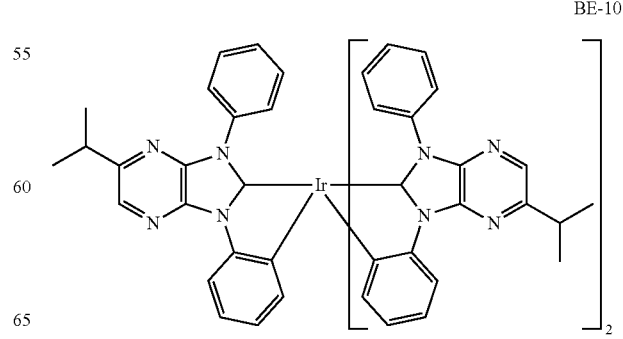

BE-10

78 mg (25%) BE-10

¹H-NMR (400 MHz, CD$_2$Cl$_2$): δ=1.25-1.50 (m, 18H), 2.97-3.10 (septet, 1H), 3.22-3.34 (m, 2H), 6.25-7.42 (m, 10H), 6.65 (d, 4H), 6.72-6.84 (m, 6H), 7.09-7.19 (m, 4H), 7.92 (d, 2H), 8.23 (s, 1H), 8.73 (d, 1H), 8.83 (t, 2H).

PL (2% PMMA): λ$_{max}$=467 nm; CIE(x;y)=0.15; 0.19; QY=89%; τ$_v$=3.1 μs.

iv) Synthesis of BE-11 and BE-7 a) Synthesis of BE-11

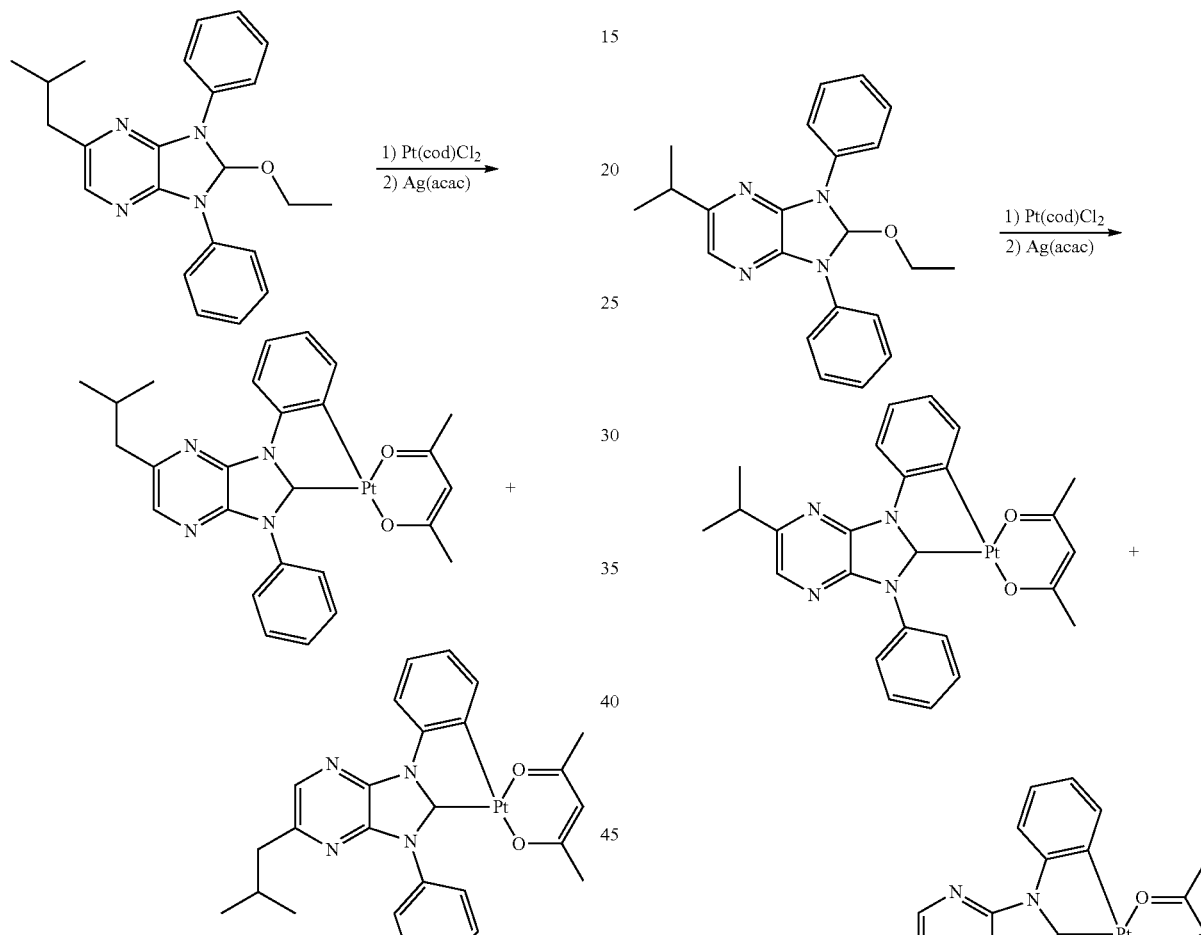

A mixture of 0.55 g (1.47 mmol) 2-ethoxy-5-isobutyl-1,3-diphenyl-2H-imidazo[4,5-b]pyrazine and 0.55 g (1.47 mmol) Pt(cod)C$_2$ in 20 ml o-xylene is heated to 110° C. for 2 hours. 0.30 g (1.47 mmol) silver acetylacetonate is added and the resulting reaction mixture is heated to 110° C. for a further 16 hours. After cooling to RT, the solvent is removed under vacuum. The residue is taken up in dichloromethane, and silica is added. The mixture is stirred for 30 min, then the solid is filtered off. The solvent of the filtrate is removed, and the residue is purified by chromatography (silica gel, toluene), yielding both isomers as yellow solids.

Isomer 1 (yield: 67 mg, 7%).

¹H-NMR (CD$_2$Cl$_2$): δ=0.93 (d, 6H), 1.36 (s, 3H), 2.02 (s, 3H), 2.06 (sept, 1H), 2.69 (d, 2H), 5.37 (s, 1H), 7.09 (dt, 1H), 7.19 (dt, 1H), 7.56-7.67 (m, 5H), 7.75-7.90 (m, 1H), 8.18-8.25 (m, 1H), 8.29 (s, 1H).

PL (2% in PMMA): λ$_{max}$=487 nm, CIE x,y=(0.22, 0.36), Q.Y.=67% τ$_v$=3.5 μs.

Isomer 2 (yield: 53 mg, 6%).

¹H-NMR (CD$_2$Cl$_2$): δ=1.01 (d, 6H), 1.36 (s, 3H), 2.02 (s, 3H), 2.28 (sept, 1H), 2.84 (d, 2H), 5.37 (s, 1H), 7.09 (dt, 1H), 7.20 (dt, 1H), 7.56-7.71 (m, 5H), 7.73-7.90 (m, 1H), 8.16 (s, 1H), 8.26-8.34 (m, 1H).

PL (2% in PMMA): λ$_{max}$=482 nm, CIE x,y=(0.21, 0.33), Q.Y.=52% τ$_v$=3.1 μs.

b) Synthesis of BE-7

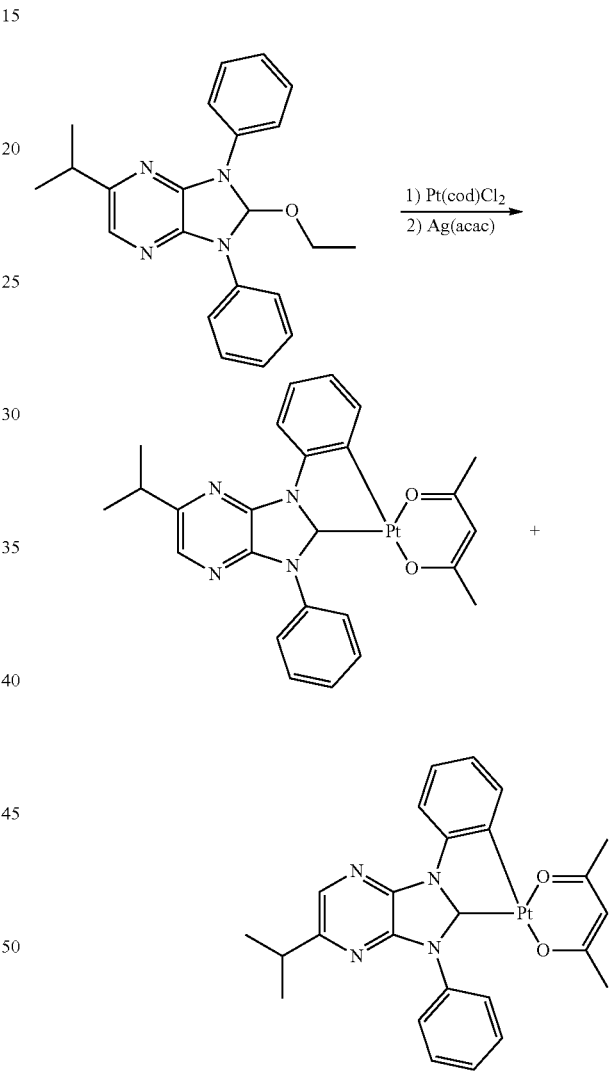

BE-7 is prepared in the same manner as BE-11 with the only difference that 2-ethoxy-5-isoproyl-1,3-diphenyl-2H-imidazo[4,5-b]pyrazine is employed instead of 2-ethoxy-5-isobutyl-1,3-diphenyl-2H-imidazo[4,5-b]pyrazine.

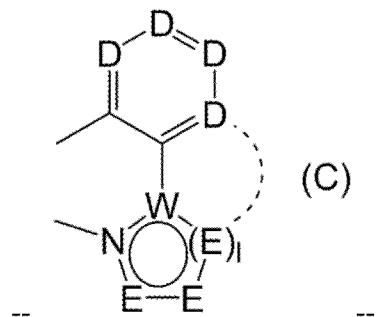

The invention claimed is:

1. An organic electronic device comprising at least one metal-carbene complex, wherein the metal is Ir or Pt, comprising one, two or three bidentate ligands of formula (I) and/or (I')

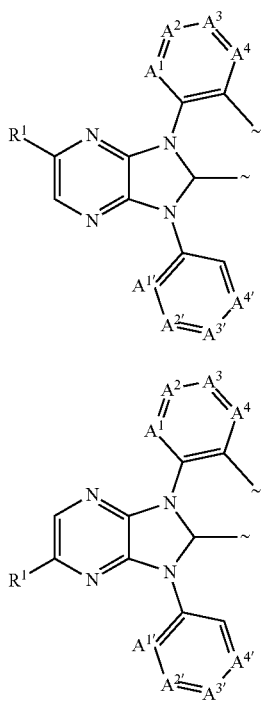

(I)

(I')

wherein
R¹ has the following meaning:

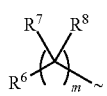

wherein:
m is 1;
~ is the bonding site to the ligand of formula (I) or (I'); and
the group R¹ has one of the following definitions:

| | R⁶ | R⁷ | R⁸ |
|---|---|---|---|
| 13 | iso-butyl | methyl | hydrogen |
| 14 | tert-butyl | methyl | hydrogen |
| 18 | iso-butyl | ethyl | hydrogen |
| 19 | tert-butyl | ethyl | hydrogen |
| 20 | iso-propyl | n-propyl | hydrogen |
| 22 | iso-butyl | n-propyl | hydrogen |
| 23 | tert-butyl | n-propyl | hydrogen |
| 27 | iso-propyl | methyl | methyl |
| 29 | iso-butyl | methyl | methyl |
| 30 | tert-butyl | methyl | methyl |
| 33 | iso-propyl | ethyl | ethyl |
| 35 | iso-butyl | ethyl | ethyl |
| 36 | tert-butyl | ethyl | ethyl |
| 39 | iso-propyl | ethyl | propyl |
| 41 | iso-butyl | ethyl | propyl |
| 42 | tert-butyl | ethyl | propyl |
| 52 | Tolyl | hydrogen | hydrogen |
| 53 | Xylyl | hydrogen | hydrogen |
| 54 | pyridyl | hydrogen | hydrogen |
| 55 | methylpyridyl | hydrogen | hydrogen |
| 56 | pyrimidyl | hydrogen | hydrogen |
| 57 | pyrazinyl | hydrogen | hydrogen |
| 58 | carbazolyl | hydrogen | hydrogen |
| 59 | dibenzofuranyl | hydrogen | hydrogen |
| 60 | dimethylfluorenyl | hydrogen | hydrogen |

-continued

| | R⁶ | R⁷ | R⁸ |
|---|---|---|---|
| 61 | methylindonyl | hydrogen | hydrogen |
| 62 | —CH₂-tolyl | hydrogen | hydrogen |
| 63 | —CH₂-xylyl | hydrogen | hydrogen |
| 64 | —CH₂-pyridyl | hydrogen | hydrogen |
| 65 | —CH₂-pyrazinyl | hydrogen | hydrogen |
| 66 | —CH₂-methylpyridinyl | hydrogen | hydrogen |
| 67 | —CH₂-dibenzofuranyl | hydrogen | hydrogen |
| 71 | —CMe₂-iso-butyl | hydrogen | hydrogen |
| 72 | cyclopentyl | hydrogen | hydrogen |
| 73 | cyclohexyl | hydrogen | hydrogen |
| 74 | adamantyl | hydrogen | hydrogen |
| 75 | —CH₂-adamantyl | hydrogen | hydrogen |
| 78 | SiMe₃ | hydrogen | hydrogen |
| 79 | SiPh₃ | hydrogen | hydrogen |
| 80 | phenyl | methyl | methyl |
| 81 | tolyl | methyl | methyl |
| 82 | xylyl | methyl | methyl |
| 83 | pyridyl | methyl | methyl |
| 84 | methylpyridyl | methyl | methyl |
| 85 | pyrimidyl | methyl | methyl |
| 86 | pyrazinyl | methyl | methyl |
| 87 | carbazolyl | methyl | methyl |
| 88 | dibenzofuranyl | methyl | methyl |
| 89 | dimethylfluorenyl | methyl | methyl |
| 90 | methylindonyl | methyl | methyl |
| 91 | —CH₂-tolyl | methyl | methyl |
| 92 | —CH₂-xylyl | methyl | methyl |
| 93 | —CH₂-pyridyl | methyl | methyl |
| 94 | —CH₂-pyrazinyl | methyl | methyl |
| 95 | —CH₂-methylpyridinyl | methyl | methyl |
| 96 | —CH₂-dibenzofuranyl | methyl | methyl |
| 100 | —CMe₂-iso-butyl | methyl | methyl |
| 101 | cyclopentyl | methyl | methyl |
| 102 | cyclohexyl | methyl | methyl |
| 103 | CF₃ | methyl | methyl |
| 104 | CF₂CF₃ | methyl | methyl |
| 105 | SiMe₃ | methyl | methyl |
| 106 | SiPh₃ | methyl | methyl |

$A^1$ is $CR^2$ or N;
$A^2$ is $CR^3$ or N;
$A^3$ is $CR^4$ or N;
$A^4$ is $CR^5$ or N;
$A^{1'}$ is $CR^{2'}$ or N;
$A^{2'}$ is $CR^{3'}$ or N;
$A^{3'}$ is $CR^{4'}$ or N;
$A^{4'}$ is $CR^{5'}$ or N;
$R^2$, $R^3$, $R^4$, $R^5$, $R^{2'}$, $R^{3'}$, $R^{4'}$ and $R^{5'}$
are each independently hydrogen; deuterium; a linear or branched, substituted or unsubstituted alkyl radical having 1 to 20 carbon atoms, optionally interrupted by at least one heteroatom, selected from O, S and N; a substituted or unsubstituted cycloalkyl radical having a total of from 3 to 30 carbon atom; a substituted or unsubstituted heterocyclo alkyl radical, interrupted by at least one heteroatom selected from O, S and N and having a total of from 3 to 30 carbon atoms and/or heteroatoms; a substituted or unsubstituted aryl radical, having a total of from 6 to 30 carbon atoms; a substituted or unsubstituted heteroaryl radical, having a total of from 5 to 30 carbon atoms and/or heteroatoms, selected from O, S and N; or a group with donor or acceptor action;
or
$R^2$ and $R^3$, $R^3$ and $R^4$ or $R^4$ and $R^5$ or $R^{2'}$ and $R^{3'}$, $R^{3'}$ and $R^{4'}$ or $R^{4'}$ and $R^{5'}$ may form, independently of each other, together with the carbon atoms to which they are bonded, a saturated or unsaturated or aromatic, optionally substituted ring, which is optionally interrupted by at least one heteroatom, selected from O, S and N, has a total of from 5 to 18 carbon atoms and/or heteroatoms, and may optionally be fused to at least one further optionally substituted saturated or unsaturated or aromatic ring, optionally interrupted by at least one heteroatom, selected from O, S and N, and having a total of from 5 to 18 carbon atoms and/or heteroatoms; and ~ in Formula (I) and Formula (I') is the bonding site to the metal.

2. The organic electronic device according to claim 1, wherein the organic electronic device is selected from organic light-emitting diodes (OLED), light-emitting electrochemical cells (LEEC), organic photovoltaic cells (OPV) and organic field-effect transistors (OFET).

3. The organic electronic device according to claim 1, wherein the metal-carbene complex comprising one, two or three bidentate ligands of formula (I) and/or (I') is employed as emitter material in OLEDs or a LEECs or absorption dye in OPVs.

4. The organic electronic device according to claim 3, wherein the OLED comprises
   (a) an anode,
   (b) a cathode,
   (c) a light-emitting layer between the anode and the cathode,
   wherein the metal-carbene complex comprising one, two or three bidentate ligands of formula (I) and/or (I') is present in the light-emitting layer of the OLED.

5. The organic electronic device according to claim 1, wherein the groups $A^1$, $A^2$, $A^3$, $A^4$, $A^{1'}$, $A^{2'}$, $A^{3'}$, and $A^{4'}$, in the ligands of formulae (I) and (I') have the following meanings:

$A^1$ is $CR^2$ or N;
$A^2$ is $CR^3$ or N;
$A^3$ is $CR^4$ or N;
$A^4$ is $CR^5$ or N;
$A^{1'}$ is $CR^{2'}$ or N;
$A^{2'}$ is $CR^{3'}$ or N;
$A^{3'}$ is $CR^{4'}$ or N;
$A^{4'}$ is $CR^{5'}$ or N;
$R^2$, $R^3$, $R^4$, $R^5$, $R^{2'}$, $R^{3'}$, $R^{4'}$ and $R^{5'}$ are each independently hydrogen; deuterium; a linear or branched, substituted or unsubstituted alkyl radical having 1 to 20 carbon atoms, optionally interrupted by at least one heteroatom[, selected from O, S and N; a substituted or unsubstituted cycloalkyl radical, having a total of from 3 to 10 carbon atoms; a substituted or unsubstituted heterocyclo alkyl radical, interrupted by at least one heteroatom, selected from O, S and N, and having a total of from 3 to 10 carbon atoms and/or heteroatoms; a group with donor or acceptor action, selected from halogen radicals, $CF_3$, CN, $SiPh_3$ and $SiMe_3$; a substituted or unsubstituted aryl radical, having from 6 to 30 carbon atoms.

6. The organic electronic device according to claim 1, wherein the metal-carbene complex has one of the following formulae (II), (II') or (II'')

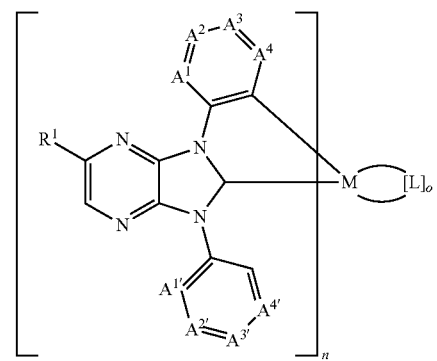

(II)

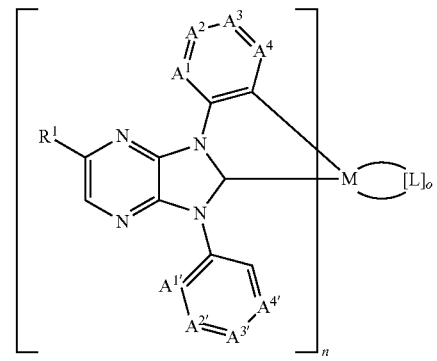

(II')

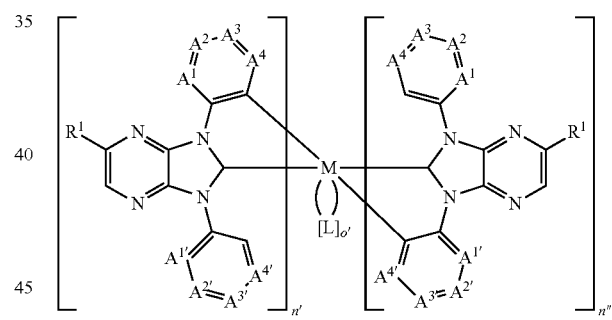

(II'')

wherein
M is Ir;
n is 1, 2 or 3;
L is a monoanionic bidentate ligand,
is 0, 1 or 2, where, when o=2, the L ligands may be the same or different;
n' is 1 or 2;
n'' is 1 or 2; wherein the sum of n'+n'' is 2 or 3;
o' is 0 or 1;
wherein the sum of n+o in formulae (II) and (II') and the sum of n'+n''+o' in formula (II'') is 3, with the proviso that n in formula (II) and (II') is at least 1 and n', as well as n'' formula (II'') are at least 1.

7. The organic electronic device according to claim 1, wherein the metal-carbene complex has one of the following formulae (II), (II') or (II'')

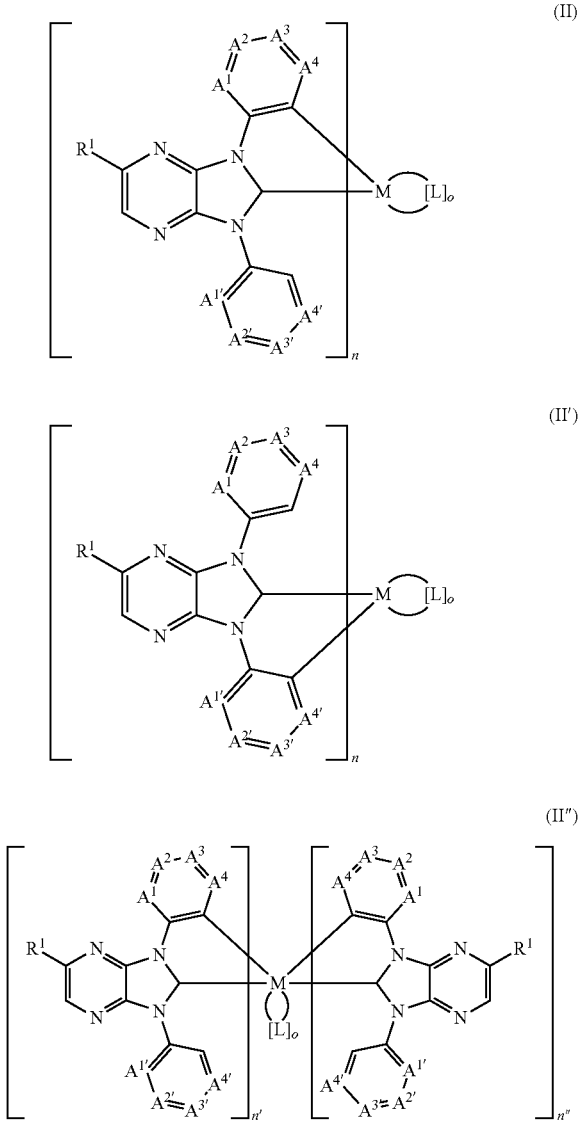

wherein
M is Pt;
n is 1 or 2;
L is a monoanionic bidentate ligand,
o is 0 or 1;
n' is 1;
n" is 1;
wherein the sum of n'+n" is 2;
o' is 0;
wherein the sum of n+o in formulae (II) and (II") and the sum of n'+n"+o' in formula (II") is 2, with the proviso that n in formula (II) and (II") is at least 1 and n', as well as n" in formula (II") are both 1.

8. The organic electronic device according to claim 6, wherein
n is 3;
n' is 1 or 2,
n" is 1 or 2,
wherein the sum of n'+n" is 3.

9. The organic electronic device according to claim 6, wherein the monoanionic bidentate ligand L in the metal-carbene complex has following meaning:
a ligand of formula (A)

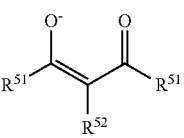

in which
$R^{51}$ is in each case independently a linear or branched alkyl radical having 1 to 6 carbons atoms; a substituted or unsubstituted aryl radical having 6 to 18 carbon atoms; a substituted or unsubstituted heteroaryl radical having a total of 5 to 18 carbon atoms and/or heteroatoms,
$R^{52}$ is hydrogen; a linear or branched alkyl radical having 1 to 6 carbon atoms; a substituted or unsubstituted aryl radical having 6 to 18 carbon atoms;
or
L is a carbene ligand of the general formula (B)

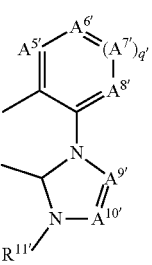

where
$A^{9'}$ is $CR^{12'}$ or N;
$A^{10'}$ is $CR^{13'}$ or N;
$R^{11'}$ is a linear or branched, substituted or unsubstituted alkyl radical having 1 to 20 carbon atoms, optionally interrupted by at least one heteroatom, selected from O, S and N; a substituted or unsubstituted cycloalkyl radical having 3 to 18 carbon atoms; a substituted or unsubstituted heterocycloalkyl radical interrupted by at least one heteroatom, selected from O, S and N, and having 3 to 18 carbon atoms and/or heteroatoms; a substituted or unsubstituted aryl radical having 6 to 30 carbon atoms, a substituted or unsubstituted heteroaryl radical interrupted by at least one heteroatom, selected from O, S and N and having a total of 5 to 30 carbon atoms and/or heteroatoms;
$R^{12'}$, $R^{13'}$ are each independently hydrogen; deuterium; a linear or branched, substituted or unsubstituted alkyl radical having 1 to 20 carbon atoms, optionally interrupted by at least one heteroatom, selected from O, S and N; a substituted or unsubstituted cycloalkyl radical having 3 to 18 carbon atoms; a substituted or unsubstituted heterocycloalkyl radical interrupted by at least one heteroatom, selected from O, S and N, and having 3 to 18 carbon atoms and/or heteroatoms; a substituted or unsubstituted aryl radical having 6 to 30 carbon atoms; a substituted or unsubstituted heteroaryl radical interrupted by at least one heteroatom, selected from O, S and N and having a total of 5 to 30 carbon atoms and/or heteroatoms; or a group with donor or acceptor action;

if $A^{9'}$ is $CR^{12'}$ and $A^{10'}$ is $CR^{13'}$, $CR^{12'}$ and $CR^{12'}$ together may form, a saturated or unsaturated or aromatic, optionally substituted ring, which is optionally interrupted by at least one heteroatom, selected from O, S and N, has a total of from 5 to 18 carbon atoms and/or heteroatoms, and may optionally be fused to at least one further optionally substituted saturated or unsaturated or aromatic ring, optionally interrupted by at least one heteroatom, selected from O, S and N, and having a total of from 5 to 18 carbon atoms and/or heteroatoms;

$A^{5'}$ is $CR^{14'}$ or N;

$A^{6'}$ is $CR^{15'}$ or N;

$A^{7'}$ is $CR^{16'}$ or N;

$A^{8'}$ is $CR^{17'}$ or N;

$R^{14'}$, $R^{15'}$, $R^{16'}$, $R^{17'}$ are each independently hydrogen; deuterium; a linear or branched, substituted or unsubstituted alkyl radical having 1 to 20 carbon atoms, optionally interrupted by at least one heteroatom, selected from O, S and N; a substituted or unsubstituted cycloalkyl radical having 3 to 18 carbon atoms; a substituted or unsubstituted heterocycloalkyl radical interrupted by at least one heteroatom, selected from O, S and N, and having 3 to 18 carbon atoms and/or heteroatoms; a substituted or unsubstituted aryl radical having 6 to 30 carbon atoms; a substituted or unsubstituted heteroaryl radical interrupted by at least one heteroatom, selected from O, S and N and having a total of 5 to 30 carbon atoms and/or heteroatoms; or a group with donor or acceptor action;

or $R^{14'}$, and $R^{15'}$, $R^{15'}$, and $R^{16'}$ or $R^{16'}$ and $R^{17'}$ may form, together with the carbon atoms to which they are bonded, a saturated or unsaturated or aromatic, optionally substituted ring, which is optionally interrupted by at least one heteroatom, selected from O, S and N, has a total of from 5 to 18 carbon atoms and/or heteroatoms, and may optionally be fused to at least one further optionally substituted saturated or unsaturated or aromatic ring, optionally interrupted by at least one heteroatom, selected from O, S and N, and having a total of from 5 to 18 carbon atoms and/or heteroatoms;

or if $A^{9'}$ is $CR^{12'}$, $R^{12'}$ and $R^{17'}$ together may form a saturated or unsaturated, linear or branched bridge optionally comprising heteroatoms, selected from O, S and N, to which is optionally fused a substituted or unsubstituted, five- to eight-membered ring comprising carbon atoms and/or heteroatoms, and which are optionally substituted with aromatic units, heteroaromatic units or groups with donor or acceptor action;

q' is 0 or 1;

or

L is a ligand of the general formula (C)

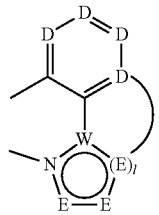

(C)

in which the symbols are each defined as follows:

D are each independently $CR^{34'''}$ or N;

W is C or N;

E are each independently $CR^{35'''}$, N, $NR^{36'''}$ or O;

I is 1 or 2;

$R^{34'''}$, $R^{35'''}$, $R^{36'''}$ are each independently hydrogen; substituted or unsubstituted or branched alkyl; substituted or unsubstituted aryl or substituted or unsubstituted heteroaryl;

or in each case two $R^{34'''}$, $R^{35'''}$ or $R^{35'''}$ radicals together form a fused ring which may optionally comprise at least one heteroatom;

or $R^{34'''}$, $R^{35'''}$, $R^{36'''}$ or $R^{37'''}$ is a radical having donor or acceptor action;

where the dotted line means an optional bridge between one of the D groups and one of the E groups; where the bridge may be defined as follows:

alkylene, arylene, heteroarylene, alkynylene, alkenylene, $NR^{38'''}$, O, S, $SiR^{41'''}R^{42'''}$, and $(CR^{43'''}R^{44'''})_v$, where one or more nonadjacent $(CR^{43'''}R^{44'''})$ groups may be replaced by $NR^{38'''}$, O, S, $SiR^{41'''}R^{42'''}$, where v is from 2 to 10;

and $R^{38'''}$, $R^{41'''}$, $R^{42'''}$, $R^{43'''}$, $R^{44'''}$ are each H, alkyl, aryl or heteroaryl.

10. The organic electronic device according to claim 1, wherein the metal-carbene complex is employed in combination with at least one host material.

11. A light-emitting layer comprising at least one metal-carbene complex as defined in claim 1 as emitter material.

12. An OLED comprising the metal-carbene complex as defined in claim 1.

13. An apparatus selected from the group consisting of stationary visual display units, such as visual display units of computers, televisions, visual display units in printers, kitchen appliances, advertising panels, information panels and illuminations; mobile visual display units such as visual display units in smartphones, cellphones, tablet computers, laptops, digital cameras, MP3-players, vehicles, keyboards and destination displays on buses and trains; illumination units; units in items of clothing; units in handbags, units in accessories, units in furniture and units in wallpaper, comprising the organic electronic device of claim 1.

14. A metal-carbene complex, wherein the metal is Ir or Pt, comprising one, two or three bidentate ligands of formula (I) and/or (I')

(I)

(I')

wherein R¹ has the following meaning:

$$R^6 \underset{R^7}{\overset{R^8}{\underset{|}{\diagdown}}} \hspace{-2pt}\underset{m}{\diagup} \sim ;$$

wherein:
m is 1;
~ is the bonding site to the ligand of formula (I) or (I'); and
the group R¹ has one of the following definitions:

| | R⁶ | R⁷ | R⁸ |
|---|---|---|---|
| 13 | iso-butyl | methyl | hydrogen |
| 14 | tert-butyl | methyl | hydrogen |
| 18 | iso-butyl | ethyl | hydrogen |
| 19 | tert-butyl | ethyl | hydrogen |
| 20 | iso-propyl | n-propyl | hydrogen |
| 22 | iso-butyl | n-propyl | hydrogen |
| 23 | tert-butyl | n-propyl | hydrogen |
| 27 | iso-propyl | methyl | methyl |
| 29 | iso-butyl | methyl | methyl |
| 30 | tert-butyl | methyl | methyl |
| 33 | iso-propyl | ethyl | ethyl |
| 35 | iso-butyl | ethyl | ethyl |
| 36 | tert-butyl | ethyl | ethyl |
| 39 | iso-propyl | ethyl | propyl |
| 41 | iso-butyl | ethyl | propyl |
| 42 | tert-butyl | ethyl | propyl |
| 52 | Tolyl | hydrogen | hydrogen |
| 53 | Xylyl | hydrogen | hydrogen |
| 54 | pyridyl | hydrogen | hydrogen |
| 55 | methylpyridyl | hydrogen | hydrogen |
| 56 | pyrimidyl | hydrogen | hydrogen |
| 57 | pyrazinyl | hydrogen | hydrogen |
| 58 | carbazolyl | hydrogen | hydrogen |
| 59 | dibenzofuranyl | hydrogen | hydrogen |
| 60 | dimethylfluorenyl | hydrogen | hydrogen |
| 61 | methylindonyl | hydrogen | hydrogen |

-continued

| | R⁶ | R⁷ | R⁸ |
|---|---|---|---|
| 62 | —CH₂-tolyl | hydrogen | hydrogen |
| 63 | —CH₂-xylyl | hydrogen | hydrogen |
| 64 | —CH₂-pyridyl | hydrogen | hydrogen |
| 65 | —CH₂-pyrazinyl | hydrogen | hydrogen |
| 66 | —CH₂-methylpyridinyl | hydrogen | hydrogen |
| 67 | —CH₂-dibenzofuranyl | hydrogen | hydrogen |
| 71 | —CMe₂-iso-butyl | hydrogen | hydrogen |
| 72 | cyclopentyl | hydrogen | hydrogen |
| 73 | cyclohexyl | hydrogen | hydrogen |
| 74 | adamantyl | hydrogen | hydrogen |
| 75 | —CH₂-adamantyl | hydrogen | hydrogen |
| 78 | SiMe₃ | hydrogen | hydrogen |
| 79 | SiPh₃ | hydrogen | hydrogen |
| 80 | phenyl | methyl | methyl |
| 81 | tolyl | methyl | methyl |
| 82 | xylyl | methyl | methyl |
| 83 | pyridyl | methyl | methyl |
| 84 | methylpyridyl | methyl | methyl |
| 85 | pyrimidyl | methyl | methyl |
| 86 | pyrazinyl | methyl | methyl |
| 87 | carbazolyl | methyl | methyl |
| 88 | dibenzofuranyl | methyl | methyl |
| 89 | dimethylfluorenyl | methyl | methyl |
| 90 | methylindonyl | methyl | methyl |
| 91 | —CH₂-tolyl | methyl | methyl |
| 92 | —CH₂-xylyl | methyl | methyl |
| 93 | —CH₂-pyridyl | methyl | methyl |
| 94 | —CH₂-pyrazinyl | methyl | methyl |
| 95 | —CH₂-methylpyridinyl | methyl | methyl |
| 96 | —CH₂-dibenzofuranyl | methyl | methyl |
| 100 | —CMe₂-iso-butyl | methyl | methyl |
| 101 | cyclopentyl | methyl | methyl |
| 102 | cyclohexyl | methyl | methyl |
| 103 | CF₃ | methyl | methyl |
| 104 | CF₂CF₃ | methyl | methyl |
| 105 | SiMe₃ | methyl | methyl |
| 106 | SiPh₃ | methyl | methyl |

$A^1$ is $CR^2$ or N;
$A^2$ is $CR^3$ or N;
$A^3$ is $CR^4$ or N;
$A^4$ is $CR^5$ or N;
$A^{1'}$ is $CR^{2'}$ or N;
$A^{2'}$ is $CR^{3'}$ or N;
$A^{3'}$ is $CR^{4'}$ or N;
$A^{4'}$ is $CR^{5'}$ or N;
$R^2$, $R^3$, $R^4$, $R^5$, $R^{2'}$, $R^{3'}$, $R^{4'}$ and $R^{5'}$
are each independently hydrogen; deuterium; a linear or branched, substituted or unsubstituted alkyl radical having 1 to 20 carbon atoms, optionally interrupted by at least one heteroatom, selected from O, S and N; a substituted or unsubstituted cycloalkyl radical having a total of from 3 to 30 carbon atom; a substituted or unsubstituted heterocyclo alkyl radical, interrupted by at least one heteroatom selected from O, S and N and having a total of from 3 to 30 carbon atoms and/or heteroatoms; a substituted or unsubstituted aryl radical, having a total of from 6 to 30 carbon atoms; a substituted or unsubstituted heteroaryl radical, having a total of from 5 to 30 carbon atoms and/or heteroatoms, selected from O, S and N; or a group with donor or acceptor action;
or
$R^2$ and $R^3$, $R^3$ and $R^4$ or $R^4$ and $R^5$ or $R^{2'}$ and $R^{3'}$, $R^{3'}$ and $R^{4'}$ or $R^{4'}$ and $R^{5'}$ may form, independently of each other, together with the carbon atoms to which they are bonded, a saturated or unsaturated or aromatic, optionally substituted ring, which is optionally interrupted by at least one heteroatom, selected from O, S and N, has a total of from 5 to 18 carbon atoms and/or heteroatoms, and may optionally be fused to at least one further optionally substituted saturated or unsaturated or aromatic ring, optionally interrupted by at least one heteroatom, selected from O, S and N, and having a total of from 5 to 18 carbon atoms and/or heteroatoms; and ~ is the bonding site to the metal.

15. A process for preparing a metal carbene complex according to claim 14, by contacting suitable compounds comprising Ir or Pt with appropriate ligands or ligand precursors, wherein the ligand precursors are reacted with the suitable Ir or Pt comprising compounds and the carbene can be released from precursors of the carbene ligands by removing lower alcohols, wherein the ligand precursor used is a compound of the general formula (IV)

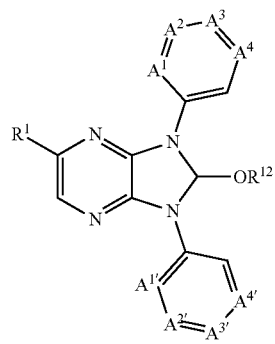

(IV)

wherein $R^1$, $A^1$, $A^2$, $A^3$, $A^4$, $A^{1'}$, $A^{2'}$, $A^{3'}$ and $A^{4'}$ are each as defined in claim 14, and $R^{12}$ is independently $SiR^{13}R^{14}R^{15}$, aryl, heteroaryl, alkyl, cycloalkyl or heterocycloalkyl, $R^3$, $R^4$, $R^{15}$ are each independently aryl, heteroaryl, alkyl, cycloalkyl or heterocycloalkyl.

16. The metal carbene complex according to claim 14, wherein the group $R^1$ has one of the following definitions:

|  | $R^6$ | $R^7$ | $R^8$ |
|---|---|---|---|
| 52 | Tolyl | hydrogen | hydrogen |
| 53 | Xylyl | hydrogen | hydrogen |
| 54 | pyridyl | hydrogen | hydrogen |
| 55 | methylpyridyl | hydrogen | hydrogen |
| 56 | pyrimidyl | hydrogen | hydrogen |
| 57 | pyrazinyl | hydrogen | hydrogen |
| 58 | carbazolyl | hydrogen | hydrogen |
| 59 | dibenzofuranyl | hydrogen | hydrogen |
| 60 | dimethylfluorenyl | hydrogen | hydrogen |
| 61 | methylindonyl | hydrogen | hydrogen |
| 62 | —CH$_2$-tolyl | hydrogen | hydrogen |
| 63 | —CH$_2$-xylyl | hydrogen | hydrogen |
| 64 | —CH$_2$-pyridyl | hydrogen | hydrogen |
| 65 | —CH$_2$-pyrazinyl | hydrogen | hydrogen |
| 66 | —CH$_2$-methylpyridinyl | hydrogen | hydrogen |
| 67 | —CH$_2$-dibenzofuranyl | hydrogen | hydrogen |
| 71 | —CMe$_2$-iso-butyl | hydrogen | hydrogen |
| 72 | cyclopentyl | hydrogen | hydrogen |
| 73 | cyclohexyl | hydrogen | hydrogen |
| 74 | adamantyl | hydrogen | hydrogen |
| 75 | —CH$_2$-adamantyl | hydrogen | hydrogen |
| 78 | SiMe$_3$ | hydrogen | hydrogen |
| 79 | SiPh$_3$ | hydrogen | hydrogen |
| 80 | phenyl | methyl | methyl |
| 81 | tolyl | methyl | methyl |
| 82 | xylyl | methyl | methyl |
| 83 | pyridyl | methyl | methyl |
| 84 | methylpyridyl | methyl | methyl |
| 85 | pyrimidyl | methyl | methyl |
| 86 | pyrazinyl | methyl | methyl |
| 87 | carbazolyl | methyl | methyl |
| 88 | dibenzofuranyl | methyl | methyl |
| 89 | dimethylfluorenyl | methyl | methyl |
| 90 | methylindonyl | methyl | methyl |
| 91 | —CH$_2$-tolyl | methyl | methyl |
| 92 | —CH$_2$-xylyl | methyl | methyl |
| 93 | —CH$_2$-pyridyl | methyl | methyl |
| 94 | —CH$_2$-pyrazinyl | methyl | methyl |
| 95 | —CH$_2$-methylpyridinyl | methyl | methyl |
| 96 | —CH$_2$-dibenzofuranyl | methyl | methyl |
| 97 | —CMe$_2$-methyl | methyl | methyl |
| 98 | —CMe$_2$-ethyl | methyl | methyl |
| 99 | —CMe$_2$-propyl | methyl | methyl |
| 100 | —CMe$_2$-iso-butyl | methyl | methyl |
| 101 | cyclopentyl | methyl | methyl |
| 102 | cyclohexyl | methyl | methyl. |

* * * * *

UNITED STATES PATENT AND TRADEMARK OFFICE
CERTIFICATE OF CORRECTION

PATENT NO. : 11,605,790 B2  
APPLICATION NO. : 16/853032  
DATED : March 14, 2023  
INVENTOR(S) : Peter Murer et al.

Page 1 of 2

It is certified that error appears in the above-identified patent and that said Letters Patent is hereby corrected as shown below:

In the Claims

The structure in Claim 6 at Column 142, Line 18-32, should read as follows:

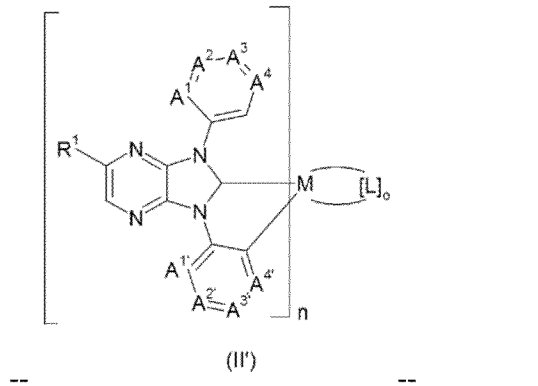

The structure in Claim 7 at Column 143, Line 32-44, should read as follows:

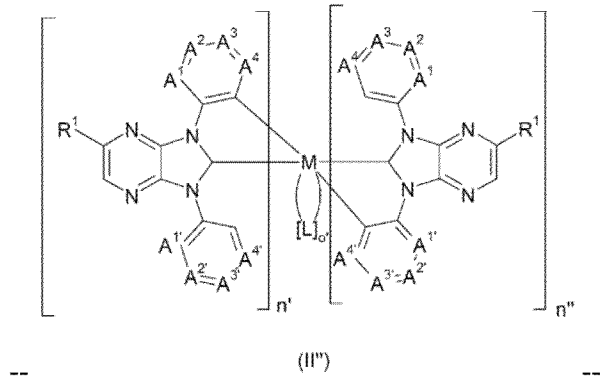

Signed and Sealed this  
Fifteenth Day of October, 2024

*Katherine Kelly Vidal*

Katherine Kelly Vidal  
*Director of the United States Patent and Trademark Office*

CERTIFICATE OF CORRECTION (continued)
U.S. Pat. No. 11,605,790 B2

The structure in Claim 9 at Column 146, Line 5-14, should read as follows: